(12) United States Patent
Hosoya

(10) Patent No.: US 8,976,308 B2
(45) Date of Patent: Mar. 10, 2015

(54) SEMICONDUCTOR DEVICE AND METHOD FOR MANUFACTURING THE SAME

(75) Inventor: Kunio Hosoya, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 2 days.

(21) Appl. No.: 13/539,901

(22) Filed: Jul. 2, 2012

(65) Prior Publication Data

US 2012/0270348 A1 Oct. 25, 2012

Related U.S. Application Data

(62) Division of application No. 11/640,048, filed on Dec. 14, 2006, now Pat. No. 8,212,953.

(30) Foreign Application Priority Data

Dec. 26, 2005 (JP) ................................ 2005-372586

(51) Int. Cl.
  *G02F 1/136* (2006.01)
  *G02F 1/1362* (2006.01)
  *G02F 1/1368* (2006.01)

(52) U.S. Cl.
  CPC ............ *G02F 1/1368* (2013.01); *G02F 1/1362* (2013.01); *G02F 1/136227* (2013.01); *G02F 2201/50* (2013.01)
  USPC .......................................................... 349/43

(58) Field of Classification Search
  USPC .......................................................... 349/43
  See application file for complete search history.

(56) References Cited

U.S. PATENT DOCUMENTS

| 5,247,289 A | 9/1993 | Matsueda |
| 5,337,173 A | 8/1994 | Atsumi et al. |
| 5,815,226 A | 9/1998 | Yamazaki et al. |
| 6,043,511 A | 3/2000 | Kim |

(Continued)

FOREIGN PATENT DOCUMENTS

| CN | 1570741 A | 1/2005 |
| CN | 001797149 A | 7/2006 |

(Continued)

OTHER PUBLICATIONS

Office Action re Taiwan application No. TW 95147928, dated Mar. 20, 2013 (with English translation).

(Continued)

*Primary Examiner* — Timothy L Rude
(74) *Attorney, Agent, or Firm* — Husch Blackwell LLP

(57) ABSTRACT

It is an object to obtain a liquid crystal display device in which a contact defect is reduced, increase in contact resistance is suppressed, and an opening ratio is high. The present invention relates to a liquid crystal display device having a substrate; a thin film transistor provided over the substrate, which includes a gate wiring, a gate insulating film, an island-shaped semiconductor film, a source region, and a drain region; a source wiring which is provided over the substrate and is connected to the source region; a drain electrode which is provided over the substrate and is connected to the drain region; an auxiliary capacitor provided over the substrate; a pixel electrode connected to the drain electrode; and a protective film formed so as to cover the thin film transistor and the source wiring, where the protective film has an opening, and the auxiliary capacitor is formed in the area where the opening is formed.

8 Claims, 50 Drawing Sheets

(56) References Cited

U.S. PATENT DOCUMENTS

| | | |
|---|---|---|
| 6,133,967 A | 10/2000 | Moon |
| 6,330,043 B1 | 12/2001 | Kikkawa et al. |
| 6,468,822 B2 | 10/2002 | Maeda et al. |
| 6,545,730 B1 | 4/2003 | Hwang |
| 6,583,828 B1 | 6/2003 | Wada et al. |
| 6,682,961 B1 | 1/2004 | Kim |
| 6,714,266 B1 | 3/2004 | Ueda et al. |
| 6,822,264 B2 | 11/2004 | Yamazaki et al. |
| 6,903,377 B2 | 6/2005 | Yamazaki et al. |
| 6,960,786 B2 | 11/2005 | Yamazaki et al. |
| 6,969,643 B2 | 11/2005 | Kim |
| 7,042,024 B2 | 5/2006 | Yamazaki et al. |
| 7,115,906 B2 | 10/2006 | Lai |
| 7,129,523 B2 | 10/2006 | Yamazaki et al. |
| 7,229,900 B2 | 6/2007 | Takayama et al. |
| 7,256,421 B2 | 8/2007 | Yamazaki et al. |
| 7,274,038 B2 | 9/2007 | Maekawa et al. |
| 7,326,602 B2 | 2/2008 | Lai |
| 7,348,198 B2 | 3/2008 | Ahn |
| 7,400,365 B2 | 7/2008 | Gotoh et al. |
| 7,432,529 B2 | 10/2008 | Yamazaki et al. |
| 7,442,963 B2 | 10/2008 | Yamazaki et al. |
| 7,499,117 B2 | 3/2009 | Maekawa et al. |
| 7,554,116 B2 | 6/2009 | Yamazaki et al. |
| 7,580,106 B2 | 8/2009 | Ahn et al. |
| 7,595,256 B2 | 9/2009 | Takayama et al. |
| 7,612,838 B2 | 11/2009 | Lim et al. |
| 7,623,193 B2 | 11/2009 | Kim |
| 7,629,617 B2 | 12/2009 | Yamazaki et al. |
| 7,671,367 B2 | 3/2010 | Ahn |
| 7,709,846 B2 | 5/2010 | Yamazaki et al. |
| 7,749,824 B2 | 7/2010 | Kim |
| 7,859,605 B2 | 12/2010 | Ahn et al. |
| 8,023,057 B2 | 9/2011 | Kim |
| 8,089,072 B2 | 1/2012 | Kim |
| 2003/0152660 A1 | 8/2003 | Schutt |
| 2005/0270453 A1* | 12/2005 | Jung et al. .................... 349/114 |
| 2006/0091394 A1 | 5/2006 | Honda |
| 2006/0139539 A1 | 6/2006 | Chen et al. |
| 2006/0146216 A1 | 7/2006 | Ahn et al. |
| 2006/0152660 A1 | 7/2006 | Tanaka et al. |
| 2007/0040971 A1 | 2/2007 | Maekawa et al. |
| 2007/0253881 A1 | 11/2007 | Maekawa et al. |
| 2007/0278489 A1 | 12/2007 | Yamazaki et al. |
| 2009/0315032 A1 | 12/2009 | Yamazaki et al. |
| 2010/0015737 A1 | 1/2010 | Takayama et al. |

FOREIGN PATENT DOCUMENTS

| | | |
|---|---|---|
| EP | 0 435 101 A1 | 7/1991 |
| EP | 0 514 029 A2 | 11/1992 |
| JP | 62-115125 | 5/1987 |
| JP | 03-185428 A | 8/1991 |
| JP | 04-090513 A | 3/1992 |
| JP | 04-347821 A | 12/1992 |
| JP | 05-216068 A | 8/1993 |
| JP | 6-250210 | 9/1994 |
| JP | 07-072506 A | 3/1995 |
| JP | 9-160075 | 6/1997 |
| JP | 9-236827 | 9/1997 |
| JP | 11-15024 | 1/1999 |
| JP | 2000-235371 | 8/2000 |
| JP | 2000-305106 | 11/2000 |
| JP | 2001-42361 | 2/2001 |
| JP | 2001-51298 | 2/2001 |
| JP | 2001-281698 A | 10/2001 |
| JP | 2002-116712 | 4/2002 |
| JP | 2005-062802 A | 3/2005 |
| JP | 2005-115348 | 4/2005 |
| JP | 2006-49889 | 2/2006 |
| JP | 2006-163407 | 6/2006 |
| KR | 10-2004-0044584 | 5/2004 |
| KR | 10-2004-0050237 | 6/2004 |
| TW | 200535776 | 11/2005 |
| WO | WO 96/30801 A1 | 10/1996 |
| WO | WO 2005/047966 A1 | 5/2005 |

OTHER PUBLICATIONS

Office Action re Chinese application No. CN 200610172474.X, dated Oct. 23, 2009 (with English translation).

Chinese Office Action re Application No. CN 201210127293.0, dated May 6, 2014.

* cited by examiner

PRIOR ART

FIG. 4A
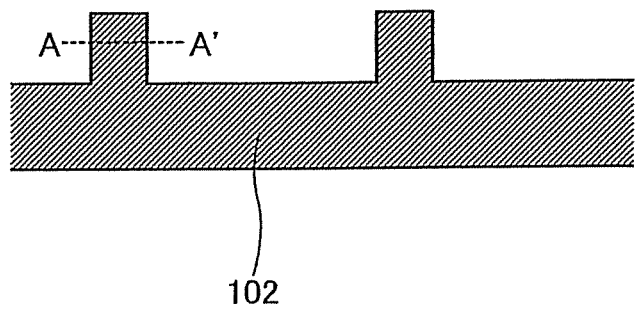
102
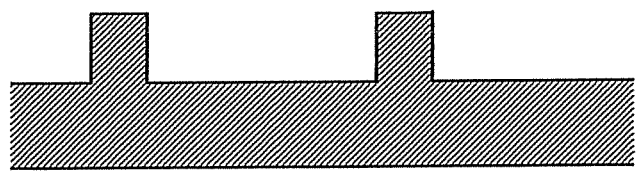
FIG. 4B
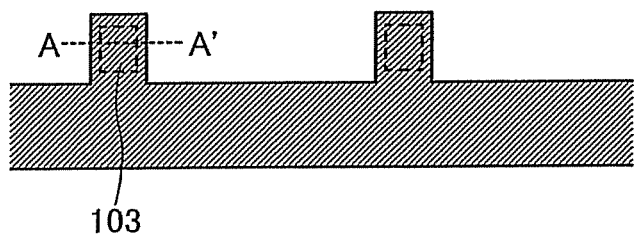
103
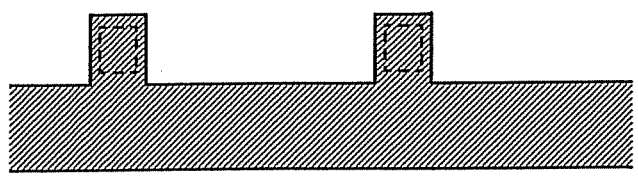

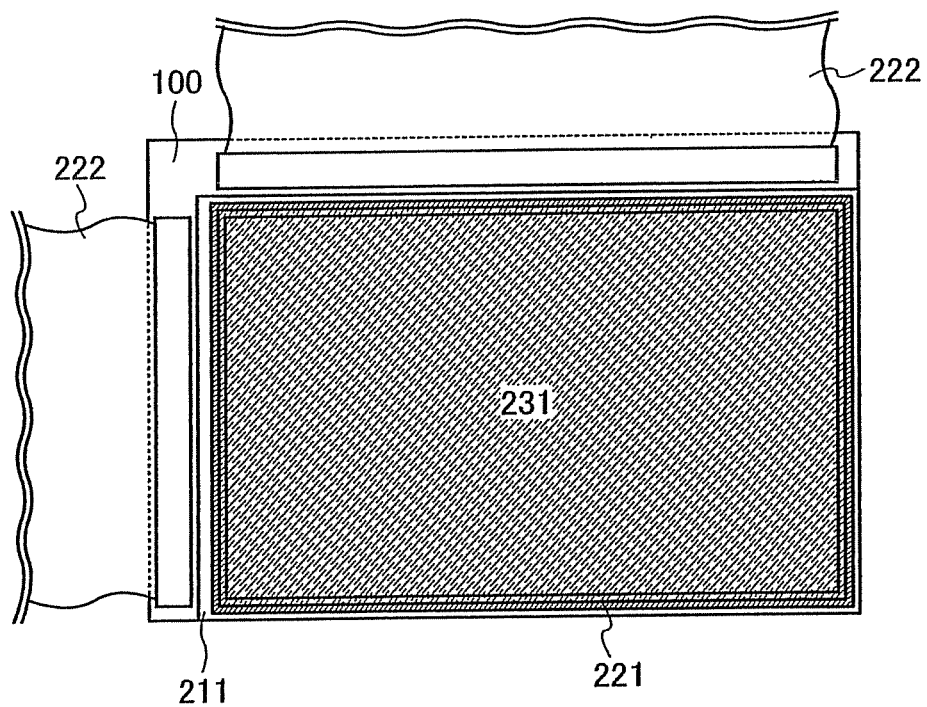

221  231

218

211

PRIOR ART

PRIOR ART

PRIOR ART

C----------------------------------------------------------------------------C'

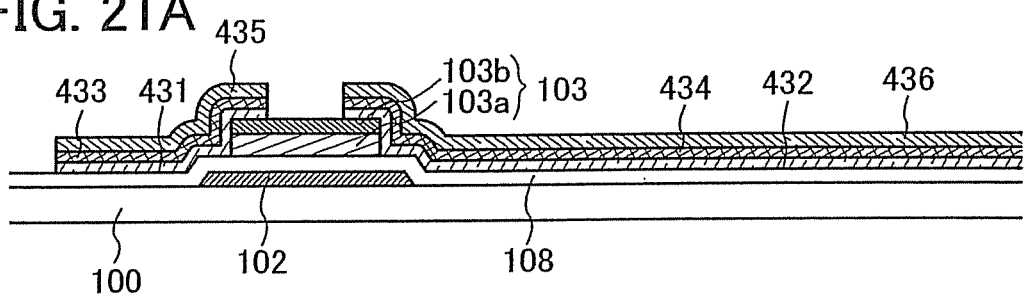
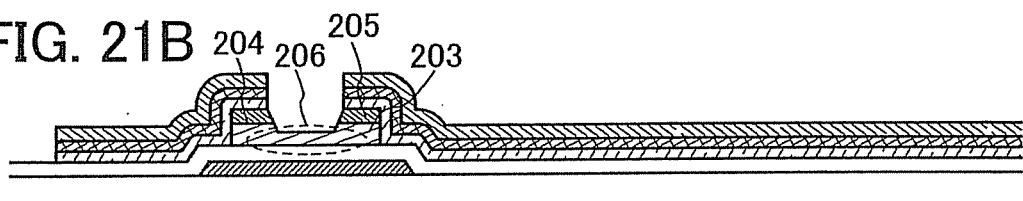
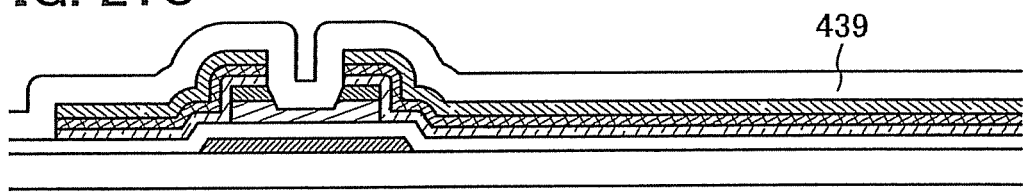
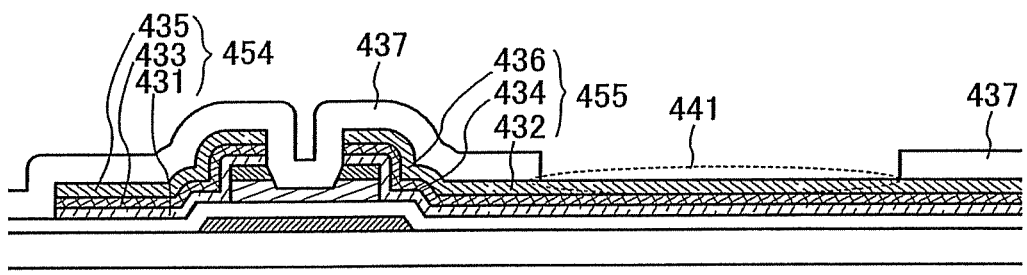
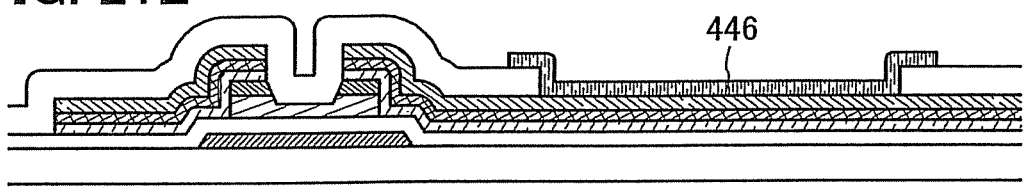

FIG. 41A 921
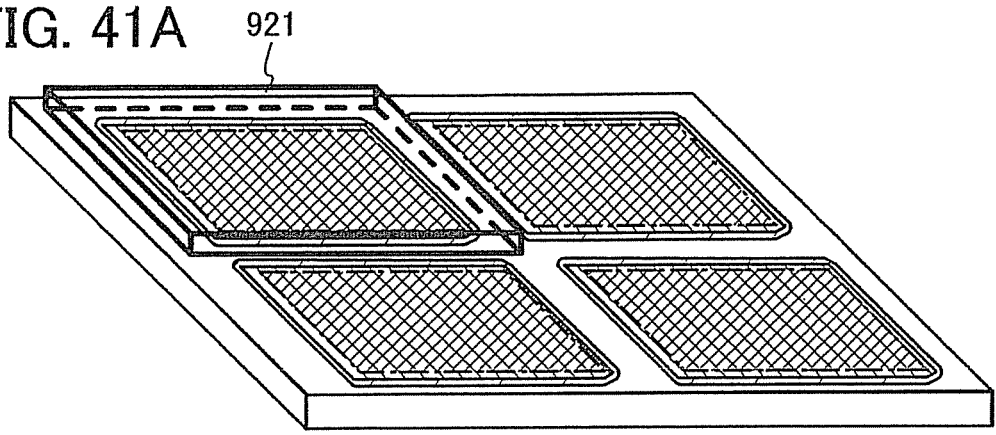
FIG. 41B
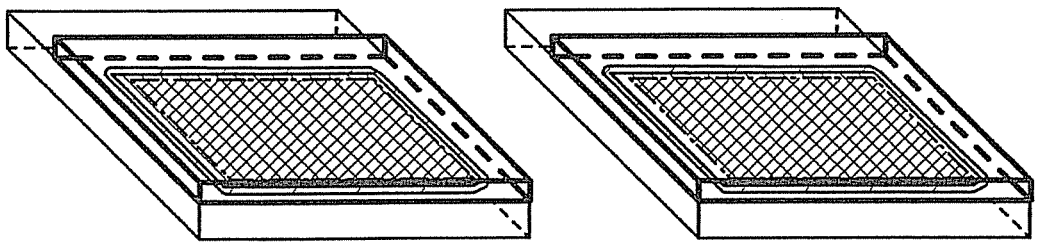
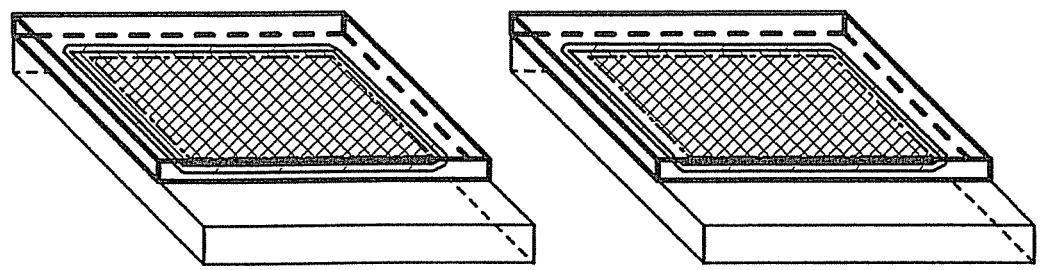

PRIOR ART

SEMICONDUCTOR DEVICE AND METHOD FOR MANUFACTURING THE SAME

This application is a divisional of application Ser. No. 11/640,048 filed on Dec. 12, 2006 now U.S. Pat. No. 8,212,953.

BACKGROUND OF THE INVENTION

1. Field of the Invention

The present invention relates to a bottom gate thin film transistor (hereinafter, abbreviated as a TFT) in which an amorphous semiconductor film provided over a substrate is used, a circuit formed by the TFT, a device including the circuit formed by the TFT, and a manufacturing method thereof.

In particular, the present invention relates to an electrooptic device typified by a liquid crystal display device and a technique which can be favorably applied to an electronic appliance provided with such an electrooptic device.

2. Description of the Related Art

In recent years, a direct-view liquid crystal display device is widely used in order to display an image or character information on an electronic appliance such as a monitor of a laptop personal computer or a desktop personal computer, a mobile phone, an audio reproducing device, a television device, a mobile terminal, a digital still camera, a video camera, or a viewer for viewing an image and a moving picture.

In particular, an active matrix liquid crystal display device enables a high-definition image in comparison with a passive liquid crystal display device, thereby being widely used.

Active elements (for example, thin film transistors) are arranged corresponding to pixels respectively in matrix in a pixel portion which is to be a display region, thereby constituting the active matrix liquid crystal display device. A TFT, as a switching element, controls voltage which is applied to liquid crystal in each pixel so that desirable image display is performed (see Patent Document 1: Japanese Published Patent Application No. 2002-116712).

In the active matrix liquid crystal display device, a TFT, a wiring, an electrode, a contact hole in an insulating film, and the like are formed over a substrate by using a plurality of photomaks by a photolithography technique.

When the wiring or the electrode is formed using metal such as aluminum (Al), tungsten (W), or titanium (Ti), a desired pattern can be formed by performing either dry etching or wet etching.

In addition, as for a light-transmitting conductive film (also referred to as a "transparent conductive film" in this specification) which is used as a material for a pixel electrode of a transmissive liquid crystal display device, a desired pattern can be formed by performing either dry etching or wet etching.

As such a transparent conductive film, metal oxide such as indium tin oxide (hereinafter, also referred to as "ITO"), zinc oxide, or indium zinc oxide (hereinafter, also referred to as "TZO"), or semiconductor oxide is used.

In particular, a transparent conductive film is etched mainly by wet etching.

However, the transparent conductive film exemplified above is disadvantageous in that a residue is easily generated in comparison with metal such as aluminum (Al). Therefore, when a residue is generated and remains over a substrate eventually, current leak might be caused between pixel electrodes.

As is the case with the above transparent conductive film, an insulating film such as a silicon nitride film or a silicon oxide film is disadvantageous in that a residue generated due to wet etching remains in a connection portion between conductive materials. Therefore, there is concern that contact defect or increase in contact resistance might be caused.

In a liquid crystal display device in which a conventional TFT is used, a semiconductor film which becomes a core of a switching function or the whole TFT is covered with a protective film (also referred to as a "passivation film") formed of a silicon nitride film, a silicon oxide film containing nitrogen, or a silicon nitride film containing oxygen in order to be protected from contamination.

The contamination here means alkali metal such as lithium (Li), sodium (Na), or potassium (K), which has an effect of deteriorating a function of a semiconductor as switching.

However, in a case of a transmissive liquid crystal display device or a semi-transmissive liquid crystal display device, this protective film is formed in an aperture which transmits light of backlight and forms an image to be displayed, as well as in an area where a TFT is formed.

Although the light of the backlight penetrates the protective film in the aperture, final intensity of transmitted light is decreased because the light is reflected, refracted, absorbed, or the like inside the protective film. Therefore, luminance of the liquid crystal display device may be decreased compared to that of a backlight source. Moreover, a wavelength of the light is changed from that of the light source after penetrating the protective film for the same reason, and a difference between a color displayed practically and an intended color may be caused.

The conventional active matrix liquid crystal display device includes pixels arranged in matrix, and a method of displaying an image in a display region (a pixel portion) by selecting a scanning line (a gate wiring) by a line sequential driving method is mainly used.

Each scanning signal line is selected in a cycle of 60 Hz or the like. However, an auxiliary capacitor (Cs) is provided in each pixel in order to hold the electric potential of a pixel electrode during a period between the termination of writing to an arbitrary row and the start of writing in the next cycle.

Two methods can be considered as a formation method of the auxiliary capacitor in a conventional active matrix liquid crystal display device in which an amorphous semiconductor film is used: a method in which an auxiliary capacitor is Mimed with a wiring formed of the same material and formed in the same layer as those of a gate wiring (a scanning line) or gate wiring of the adjacent pixel row as one of the electrodes, a pixel electrode as the other electrode, and a gate insulating film and a protective film interposed between the two electrodes (hereinafter, referred to as a "first method"); and a method in which an auxiliary capacitor is formed with an auxiliary capacitor wiring formed of the same material in the same layer as those of the gate wiring and which is separated from a gate wiring, as one of electrodes, an electrode formed of the same material in the same layer as those of a drain electrode and connected to a pixel electrode as the other electrode, and a gate insulating film interposed therebetween (hereinafter, referred to as a "second method").

A top view of a pixel of a conventional active matrix liquid crystal display device is shown in FIG. 2. The liquid crystal display device shown in FIG. 2 includes a gate electrode and gate wiring (the "gate wiring" is also referred to as a "scanning line") 1002, a semiconductor film 1003 of a TFT, a source electrode and source wiring (the "source wiring" is also referred to as a "signal line") 1004, a drain electrode 1005, a pixel electrode 1006, and an auxiliary capacitor 1007. The auxiliary capacitor 1007 is formed of the gate wiring 1002, the pixel electrode 1006, and an insulating film (a dielectric film) formed between the gate wiring 1002 and the pixel electrode 1006.

A manufacturing process of the conventional active matrix liquid crystal display device shown in FIG. 2 will be explained with reference to FIGS. 12A to 12F and FIGS. 13A to 13E. It is to be noted that FIGS. 12A to 12F and FIGS. 13A to 13E correspond to a cross section taken along a line B-B' of FIG. 2.

First, a first conductive film 1021 is formed over a substrate 1000 (see FIG. 12A). Then, a resist mask is formed by a first photolithography process, and an unnecessary portion of the first conductive film 1021 is removed by etching, thereby forming a gate electrode and gate wiring 1002 (see FIG. 12B).

A gate insulating film 1022, an amorphous semiconductor film 1023, and an amorphous semiconductor film 1024 containing an impurity imparting one conductivity type are formed over the substrate 1000 and the gate electrode and gate wiring 1002 (see FIG. 12C). Then, a resist mask is formed by a second photolithography process and unnecessary portions of the amorphous semiconductor film 1023 and the amorphous semiconductor film 1024 containing an impurity imparting one conductivity type are removed by etching, thereby forming an island-shaped semiconductor film 1025a and an island-shaped semiconductor film containing an impurity 1025b (see FIG. 12D).

Next, a second conductive film 1026 is formed over the gate insulating film 1022, the island-shaped semiconductor film 1025a, and the island-shaped semiconductor film containing an impurity 1025b (see FIG. 12E). Then, a resist mask is formed by a third photolithography process, and an unnecessary portion of the second conductive film 1026 is etched, thereby forming a source electrode and source wiring 1004 and a drain electrode 1005 (see FIG. 12F).

Then, the island-shaped semiconductor film 1025a and the island-shaped semiconductor film containing an impurity 1025b are etched in self-alignment manner by using the source electrode and source wiring 1004 and the drain electrode 1005 as masks. The island-shaped semiconductor film containing an impurity 1025b is divided into a source region 1003bs and a drain region 1003bd. Also, the island-shaped semiconductor film 1025a is etched to be an island-shaped semiconductor film 1003a (see FIG. 13A).

A protective film 1027 is formed over the source electrode and source wiring 1004, the drain electrode 1005, the source region 1003bs, the drain region 1003bd, and the island-shaped semiconductor film 1003a (see FIG. 13B). A resist mask is formed by a fourth photolithography process, and the protective film 1027 is etched, thereby forming a contact hole 1001 reaching the drain electrode 1005 (see FIG. 13C).

A third conductive film 1029 is formed covering the protective film 1027 and the contact hole 1001 (see FIG. 13D). A resist mask is formed by a fifth photolithography process, and the third conductive film 1029 is etched, thereby forming a pixel electrode 1006 (see FIG. 13E).

As described above, the pixel of the conventional active matrix liquid crystal display device shown in FIG. 2 is formed by five photolithography processes with the use of the five photomasks.

An example in which an auxiliary capacitor is formed by the above first method is shown in FIG. 2 and FIG. 11. The liquid crystal display device shown in FIG. 2 is an example in which the gate wiring (scanning line) of the adjacent pixel row is one of electrodes and a pixel electrode is the other electrode. In FIG. 2, reference numeral 1002 denotes a gate electrode and gate wiring; 1003, a semiconductor film of a TFT; 1004, a source electrode and source wiring; 1005, a drain electrode; and 1006, a pixel electrode. An auxiliary capacitor 1007 is formed by using the gate wiring 1002, the pixel electrode 1006, a gate insulating film and a protective film formed between the gate wiring 1002 and the pixel electrode 1006 as dielectric films.

A liquid crystal display device shown in FIG. 11 is an example in which a wiring formed of the same material and formed in the same layer as those of a gate wiring is one of electrodes and a pixel electrode is the other electrode. In FIG. 11, reference numeral 1012 denotes a gate electrode and gate wiring; 1013, a semiconductor film of a TFT; 1014, a source electrode and source wiring; 1015, a drain electrode; 1016, a pixel electrode; 1017, an auxiliary capacitor; and 1018, an auxiliary capacitor wiring. The drain electrode 1015 and the pixel electrode 1016 are connected to each other through a contact hole 1011. The auxiliary capacitor wiring 1018 is formed of the same material and formed in the same layer as those of the gate electrode and gate wiring 1012.

The auxiliary capacitor 1017 is formed by using the auxiliary capacitor wiring 1018, the pixel electrode 1016, and a gate insulating film and a protective film formed between the auxiliary capacitor wiring 1018 and the pixel electrode 1016 as dielectric films.

An example in which an auxiliary capacitor is formed by the second method is shown in FIG. 50. In FIG. 50, reference numeral 1032 denotes a gate electrode and gate wiring; 1033, a semiconductor film of a TFT; 1034, a source electrode and source wiring; 1035, a drain electrode; 1036, a pixel electrode; 1037a and 1037b, auxiliary capacitors; 1038, a lower auxiliary capacitor wiring; and 1039a and 1039b, upper auxiliary capacitor electrodes. The drain electrode 1035 is connected to the pixel electrode 1036 through a contact hole 1031.

The upper auxiliary capacitor electrode 1039a is formed of the same material and fat tiled in the same layer as those of the source electrode and source wiring 1034 and the drain electrode 1035, and is connected to the pixel electrode 1036 through two contact holes. The auxiliary capacitor 1037a is formed using the lower auxiliary capacitor wiring 1038 as one of the electrodes, the upper auxiliary electrode 1039a as the other electrode, and a gate insulating film as a dielectric body between the electrodes.

The upper auxiliary capacitor electrode 1039b is also formed of the same material and formed in the same layer as those of the source electrode and source wiring 1034 and the drain electrode 1035, and is connected to the pixel electrode 1036 through a contact hole. The auxiliary capacitor 1037b is formed by using the lower auxiliary capacitor wiring 1038 as one of the electrodes, the upper auxiliary capacitor electrode 1039b as the other electrode, and the gate insulating film as a dielectric body between the electrodes.

Since the dielectric film between the two electrodes may be as thick as one gate insulating film in the second method, the film thickness of the dielectric film can be reduced; accordingly, capacitance can be increased. Therefore, an area for forming the auxiliary capacitor necessary for the second method is smaller than that of the first method.

However, in the second method, there are problems in that an opening ratio is decreased because an area for forming the electrode is necessary in order to provide the auxiliary capacitor line as one of the electrodes in addition to the scanning line (the gate wiring) and yield is decreased because the electrode formed of the same material and formed in the same layer as those of the drain electrode is formed as the other electrode.

On the other hand, in the first method, capacitance is smaller than that of the second method because two layers that are the gate insulating film and the protective film are used for the dielectric films; therefore, a larger area for forming the electrode is necessary. For this reason, problems in that the scanning line itself has to be wide and a portion of the scanning line overlapping with the pixel electrode has to be taken large in design occur.

Furthermore, as shown in FIG. 2 and FIG. 11, in the conventional active matrix liquid crystal display device, the source electrode or the drain electrode connected to the TFT and the pixel electrode are connected to each other through the circular contact hole 1001 or 1011. Accordingly, the TFT and the pixel electrode are electrically connected to each other.

However, a concave is caused on an alignment film due to the contact hole under the alignment film; therefore, ideal rubbing is difficult. For this reason, there is a disadvantage in that disclination of liquid crystals arranged near the portion over the contact hole occurs. Therefore, there is a problem in that quality of display could be poor because light leaks near the portion over the contact hole.

In order to prevent such a problem, there is a method of providing black matrix at a counter substrate side which faces a substrate over which a TFT is formed. In this case, light is shielded in the area where the contact hole is located and a vicinity thereof However, this method is one of factors that decrease an aperture ratio.

The protective film with a predetermined shape is formed by dry etching of a material for forming the protective film. At this time, an unnecessary substance such as part of the protective film material or a reaction product of the material for forming the protective film and an etching gas component which is generated due to etching remains on a surface to be processed as a residue. For example, when this residue is generated between the wiring and the pixel electrode, the residue can function as contact resistance between the pixel electrode and the wiring or prevent electrical contact. Eventually, the residue can seriously damage a function as a liquid crystal display device or make the liquid crystal display impossible to work out Therefore, in order to prevent the residue from remaining, the surface to be processed is cleaned with a fluorine-based chemical, alkali cleaner, a surface active agent, or pure water or a combination of these and ultrasonic cleaning (hereinafter, referred to as cleaner).

However, although, in a structure of the conventional liquid crystal display device, a circular contact hole with a small diameter is used in a contact portion between the pixel electrode and the drain electrode, it has been concerned that a residue or a cleaning liquid might remain on the inner wall or at the bottom of the circular contact hole when a substrate with a surface to be processed is drawn from cleaner after cleaning.

In addition, it has been concerned that, with such a conventional contact hole with a small diameter, the pixel electrode and the drain electrode could be disconnected due to a bump and poor connection might occur.

As a liquid crystal display device, there are a transmissive liquid crystal display device in which light from a backlight provided at the rear of a display device penetrates and display is performed and a reflective liquid crystal display device in which external light is reflected by a reflective electrode provided over a substrate and display is performed.

The transmissive liquid crystal display device is superior in visibility also in a dark indoor place or the like, and the reflective liquid crystal display device is superior in visibility in a bright place of outside. For a display device used both inside and outside, like a cellular phone, there is a semi-transmissive (including a transmissive region and a reflective region approximately equally) liquid crystal display device with both functions of the transmssive liquid crystal display device and the reflective liquid crystal display device, or micro reflective (a reflective region is smaller than a transmissive region) liquid crystal display device.

SUMMARY OF THE INVENTION

It is an object of the present invention to promote improvement in productivity, reduction in costs, and high reliability at the same time in order to supply a product including a liquid crystal display device as described above to the market.

The present invention solves the above problem in an electrooptic device typified by an active matrix liquid crystal display device and a semiconductor device, and it is an object to provide a liquid crystal display device capable of a mass production line with high yield, high luminance, and a high opening ratio, and a manufacturing method thereof.

In the present invention, the above problem is solved and the above object is achieved by removing a protective film in an aperture and over a gate wiring, in a pixel at the same time.

One feature of the present invention is a semiconductor device having an insulating substrate, a thin film transistor (TFT) provided over the insulating substrate, a gate wiring provided above the insulating substrate, a source wiring provided above the insulating substrate, an auxiliary capacitor provided above the insulating substrate, a pixel electrode connected to the thin film transistor, where the thin film transistor and the source wiring are covered with a protective film formed of an insulating film, the protective film has an opening and the auxiliary capacitor is formed in the area where the opening is formed.

It is to be noted that, in this specification, "source wiring" and a "source line" are also referred to as a "signal line". Also, in this specification, a pair of impurity regions in a thin film transistor is referred to as a source region and a drain region for the sake of convenience. However, depending on signals inputted from the signal line, the source region and the drain region could have opposite operations to each other, and the same can be said for a source electrode and a drain electrode.

A semiconductor film is a core of a switching function of a TFT. Silicon is often used for the semiconductor film. A liquid crystal display device is broadly classified into two groups in accordance with a state of a semiconductor film, that is, a liquid crystal display device using an amorphous semiconductor film in which the state of a semiconductor film is amorphous (an amorphous state) and a liquid crystal display device using a crystalline semiconductor film in which the state of a semiconductor film is crystal (a polycrystalline state).

In a liquid crystal display device using a crystalline semiconductor film, a display region and a driver circuit by using a TFT on the periphery of the display region can be formed on a common substrate because carrier mobility in the semiconductor film is high. However, at the same time, decrease in yield or increase in manufacturing costs due to a complicated manufacturing process becomes problematic.

In general, when a crystalline semiconductor film is manufactured, an excimer laser which is one kind of a gas laser using a gas such as XeCl or KrF is processed into a linear laser beam and an amorphous semiconductor film is scanned with the excimer laser beam.

However, under the present situation, since the length of the linear laser beam is limited, there is a problem in that the linear laser beam cannot be adapted to a large glass substrate which is advantageous to cost reduction.

On the other hand, a liquid crystal display device using an amorphous semiconductor film has an advantage that manufacturing costs become low because a manufacturing process thereof is simpler than that of the liquid crystal display device using a crystalline semiconductor film.

One feature of the present invention is a semiconductor device having a substrate; a thin film transistor provided over the substrate, which includes a channel formation region, a source region, a drain region, a gate insulating film, and a gate electrode; a source wiring connected to the source region; a drain electrode connected to the drain region; an auxiliary capacitor provided over the substrate; a pixel electrode connected to the drain electrode; and a protective film which covers the thin film transistor and the source wiring and overlaps with a peripheral part of the pixel electrode, where the protective film has an opening, and the auxiliary capacitor is formed in the area where the opening is formed.

Another feature of the present invention is a semiconductor device having a substrate; a thin film transistor provided over the substrate, which includes a pair of impurity regions having one conductivity type and a channel formation region; a first wiring electrically connected to one of the pair of impurity regions having one conductivity type; a first electrode electrically connected to the other of the pair of impurity regions having one conductivity type; a pixel electrode connected to the first electrode; an auxiliary capacitor provided over the substrate; and a protective film which has an opening over the pixel electrode and the auxiliary capacitor and covers the thin film transistor and the source wiring.

Another feature of the present invention is a semiconductor device having a substrate; a thin film transistor provided over the substrate, which includes a gate wiring, a gate insulating film, a channel formation region, a source region, and a drain region; a source wiring provided over the substrate and connected to the source region; a drain electrode provided over the substrate and connected to the drain region; an auxiliary capacitor provided over the substrate; a pixel electrode connected to the drain electrode; a protective film formed so as to cover the thin film transistor and the source wiring; an opening formed in the protective film; a first alignment film formed over the thin film transistor, the pixel electrode, and the protective film; a counter substrate facing the substrate; a counter electrode formed on the counter substrate; a second alignment film formed on the counter electrode; and a liquid crystal held between the substrate and the counter substrate, where the auxiliary capacitor is formed in the area where the opening is formed.

Another feature of the present invention is a semiconductor device having a substrate; a thin film transistor provided over the substrate, which includes a gate wiring, a gate insulating film, a channel formation region, a source region, and a drain region; a source wiring provided over the substrate and connected to the source region; a drain electrode provided over the substrate and connected to the drain region; an auxiliary capacitor provided over the substrate; a pixel electrode connected to the drain electrode; a protective film formed so as to cover the thin film transistor and the source wiring; and an opening formed in the protective film, where the auxiliary capacitor is formed in the area where the opening is formed, the pixel electrode is a transparent electrode, and a reflective electrode is formed so as to overlap with part of the pixel electrode.

Another feature of the present invention is that the reflective electrode may contain any one of aluminum (Al), silver (Ag), and chromium (Cr).

Another feature of the present invention is a semiconductor device having a substrate; a thin film transistor provided over the substrate, which includes a gate wiring, a gate insulating film, a channel for region, a source region, and a drain region; a source wiring provided over the substrate and connected to the source region; a drain electrode provided over the substrate and connected to the drain region; an auxiliary capacitor provided over the substrate; a pixel electrode connected to the drain electrode, a protective film formed so as to cover the thin film transistor and the source wiring; an opening formed in the protective film; a common wiring formed over the substrate and formed of the same material and formed in the same layer as those of the gate wiring; a plurality of common electrodes connected to the common wiring formed over the substrate and which is formed of the same material and formed in the same layer as those of the pixel electrode; a counter substrate facing the substrate; and a liquid crystal held between the substrate and the counter substrate, where the auxiliary capacitor is formed in the area where the opening is formed.

Another feature of the present invention is a semiconductor device having a substrate; a thin film transistor provided over the substrate, which includes a gate wiring, a gate insulating film, a channel formation region, a source region, and a drain region; a source wiring provided over the substrate and connected to the source region; a drain electrode provided over the substrate and connected to the drain region; an auxiliary capacitor provided over the substrate, a pixel electrode connected to the drain electrode; a protective film formed so as to cover the thin film transistor and the source wiring; an opening formed in the protective film; a plurality of grooves provided in the pixel electrode; a first alignment film formed over the thin film transistor, the pixel electrode, and the protective film; a counter substrate facing the substrate; a counter electrode formed on the counter substrate; a plurality of protrusions provided to the counter electrode; a second alignment film formed on the counter electrode and the plurality of protrusions; and a liquid crystal held between the substrate and the counter substrate, where the auxiliary capacitor is formed in the area where the opening is formed.

Another feature of the present invention is a semiconductor device having a substrate; a thin film transistor provided over the substrate, which includes a gate wiring, a gate insulating film, a channel formation region, a source region, and a drain region; a source wiring provided over the substrate and connected to the source region; a drain electrode provided over the substrate and connected to the drain region; an auxiliary capacitor provided over the substrate; a pixel electrode connected to the drain electrode; a protective film formed so as to cover the thin film transistor and the source wiring; an opening formed in the protective film; a plurality of first grooves provided in the pixel electrode; a first alignment film formed over the thin film transistor, the pixel electrode, and the protective film; a counter substrate facing the substrate; a counter electrode formed on the counter substrate; a plurality of second grooves provided in the counter electrode; a second alignment film formed on the counter electrode and the plurality of second grooves; and a liquid crystal held between the substrate and the counter substrate, where the auxiliary capacitor is formed in the area where the opening is formed, and the first grooves and the second grooves do not overlap each other.

Another feature of the present invention is a semiconductor device having a substrate; a first thin film transistor provided over the substrate, which includes a first gate wiring, a gate insulating film, a first channel formation region, a first source region, and a first drain region; a second thin film transistor provided over the substrate, which includes a second gate wiring, the gate insulating film, a second channel formation region, a second source region, and a second drain region; a source wiring provided over the substrate and connected to the first source region and the second source region; a first drain electrode provided over the substrate and connected to the first drain region; a second drain electrode provided over the substrate and connected to the second drain region; an auxiliary capacitor provided over the substrate; a first pixel electrode connected to the first drain electrode; a second pixel electrode connected to the second drain electrode; an auxiliary capacitor wiring formed of the same material and formed in the same layer as those of the first gate wiring and the second gate wiring; a protective film formed so as to cover the first thin film transistor, the second thin film transistor, and the source wiring; and an opening formed in the protective film; a first alignment film formed over the first thin film transistor, the second thin film transistor, the first pixel electrode, the second pixel electrode, and the protective film; a counter substrate facing the substrate; a counter electrode formed on the counter substrate; a second alignment film formed on the counter electrode; and a liquid crystal held between the substrate an the counter substrate, wherein a first auxiliary capacitor is formed in a region where part of the first pixel electrode and the auxiliary capacitor wiring overlap with each other; a second auxiliary capacitor is formed in a region where part of the second pixel electrode and the auxiliary capacitor wiring overlap with each other; and the first auxiliary capacitor and the second auxiliary capacitor are formed in the area where the opening is formed.

Another feature of the present invention is that the area of the first pixel electrode is the same as the area of the second pixel electrode.

Another feature of the present invention is that the area of the first pixel electrode and the area of the second pixel electrode are different.

Another feature of the present invention is a method for manufacturing a semiconductor device including the steps of forming a gate wiring over a substrate; forming a gate insulating film over the gate wiring; forming an island-shaped semiconductor film and an island-shaped semiconductor film containing an impurity over the gate wiring having the gate insulating film therebetween; forming a source wiring and a drain electrode over the gate insulating film, the island-shaped semiconductor film, and the island-shaped semiconductor film containing an impurity; forming a source region and a drain region from the island-shaped semiconductor film containing an impurity and a channel formation region from the island-shaped semiconductor film by etching the island-shaped semiconductor film and the island-shaped semiconductor film containing an impurity by using the source wiring and the drain electrode as masks; forming an insulating film over the source wiring, the drain electrode, the source region, the drain region, and the channel formation region; removing part of the insulating film so as to expose part of the drain electrode; and forming a pixel electrode to be in contact with a region where the drain electrode is exposed, where the insulating film over the source wiring, the source region, the drain region, and the channel formation region is not removed and the insulating film which is not removed serves as a protective film.

Another feature of the present invention is that the thin film transistor is a bottom gate thin film transistor.

Another feature of the present invention is that the thin film transistor is an inversely staggered thin film transistor.

Another feature of the present invention is that each of the source region, the drain region, and the channel formation region is formed using an amorphous semiconductor film.

Another feature of the present invention is that the drain electrode has an upper drain electrode and a lower drain electrode, the upper drain electrode is removed in the opening, and the pixel electrode is in contact with the lower drain electrode only.

Another feature of the present invention is that the drain electrode has an upper drain electrode, a middle drain electrode, and a lower drain electrode, and the pixel electrode is in contact with the upper drain electrode only. Another feature of the present invention is that an auxiliary capacitor is formed of part of the gate wiring, the gate insulating film, and part of the pixel electrode.

Another feature of the present invention is that the auxiliary capacitor is formed of an auxiliary capacitor wiring formed of the same material as that of the gate wiring, the gate insulating film, and part of a conductive film formed of the same material as that of a drain electrode electrically connected to the pixel electrode.

Another feature of the present invention is that each of the island-shaped semiconductor film and the island-shaped semiconductor film containing an impurity is formed using amorphous semiconductor films.

Another feature of the present invention is that the pixel electrode is a transparent electrode and a reflective electrode is formed to partially overlap with the pixel electrode.

Another feature of the present invention is that the reflective electrode contains any one of aluminum (Al), silver (Ag), and chromium (Cr).

Another feature of the present invention is that the protective film is one of a silicon nitride film, a silicon nitride film containing oxygen, a silicon oxide film containing nitrogen, a silicon oxide film, and a stacked film in which these films are combined.

Another feature of the present invention is that the substrate is an insulating substrate.

Another feature of the present invention is that the substrate is a glass substrate or a quartz substrate.

Another feature of the present invention is that the pixel electrode contains any one of indium oxide, indium tin oxide, and indium oxide-inc oxide alloy.

Another feature of the present invention is that the material of the gate insulating film and the material of the protective film may be different.

Another feature of the present invention is that the semiconductor device is one of a television receiving set, a cellular phone, a liquid crystal display, a computer, a game machine, an image reproducing device, a video camera, a navigation system, an audio reproducing device, and a digital still camera.

It is to be noted that, in this specification, a semiconductor device means an element and device which functions by using a semiconductor in general, and an electrooptic device including the liquid crystal display device and an electronic appliance mounted with the electrooptic device are included in the category of the semiconductor device.

In addition, in this specification, a transparent conductive film, a transparent electrode, and a transparent conductive material are acceptable as long as they are a conductive film with a light-transmitting property, an electrode with a light-transmitting property, a conductive material with a light-transmitting property, and an electrode with a light-transmitting property, respectively, even if they are somewhat clouded or colored. If they have enough transparency for light to be transmitted, they can be considered to be transparent in this specification.

In the present invention, by forming a protective film and an opening in the protective film so as to extend parallel to a source wiring, a residue generated when etching an insulating film for forming a protective film can be reduced and a contact defect between a pixel electrode and a drain electrode due to the residue can be suppressed.

In the same way, a residue generated when etching a transparent conductive material during formation of a pixel electrode can be reduced and leakage current or conductivity due to the residue can be reduced.

By the present invention, disclination of liquid crystals in the vicinity of the portion over a contact hole due to a shape of the contact hole of a protective film, which has been conventionally generated, can be eliminated.

Furthermore, by the present invention, by increasing an area where a pixel electrode and a drain electrode are in contact with each other, contact resistance can be reduced.

A high transmission of light from a light source in the opening of the protective film can be obtained.

In the present invention, the number of photomasks is not required to be increased in comparison with conventional liquid crystal display devices, and a high-quality liquid crystal, display device can be manufactured without increasing the number of manufacturing steps and manufacturing costs.

As described above, by the present invention, a liquid crystal display device with high reliability, high yield, high luminance, and high aperture ratio can be provided.

BRIEF DESCRIPTION OF DRAWINGS

In the accompanying drawings:

FIGS. 4A and 4B are top views each showing a manufacturing method of a liquid crystal display device according to the present invention;

FIG. 9 is a top view of a liquid crystal display device according to the present invention;

FIGS. 21A to 21E are cross-sectional views each showing a manufacturing method of a liquid crystal display device according to the present invention;

FIGS. 41A and 41B are views each showing a manufacturing process of a liquid crystal display device using a liquid crystal dropping method according to the present invention;

DETAILED DESCRIPTION OF THE INVENTION

Embodiment Mode

In this embodiment mode, a liquid crystal display device of the present invention and a manufacturing method thereof will be explained with reference to FIGS. 1A and 1B, FIG. 3, FIGS. 4A and 4B, FIGS. 5A and 5B, FIGS. 6A and 6B, FIGS. 7A to 7F, FIG. 8, FIG. 9, and FIGS. 10A to 10D.

Although the present invention can be carried out in many different modes, and modes and details of the present invention can be modified without departing from the purpose and the scope of the present invention. Therefore, the present invention is not understood as being limited to the description of embodiment mode.

Figure 1A:
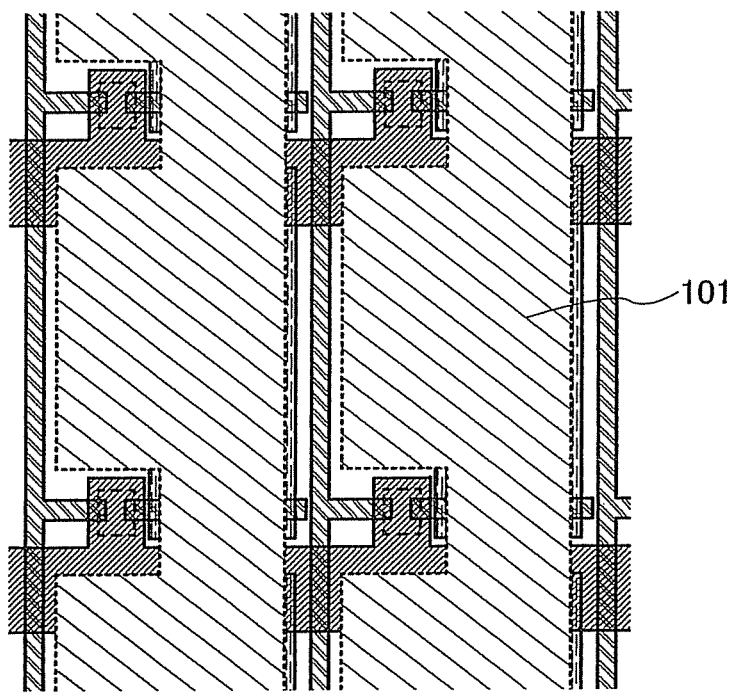
FIGS. 1A and 1B are top views of a pixel in a liquid crystal display device according to the present invention.
Figure 1B:
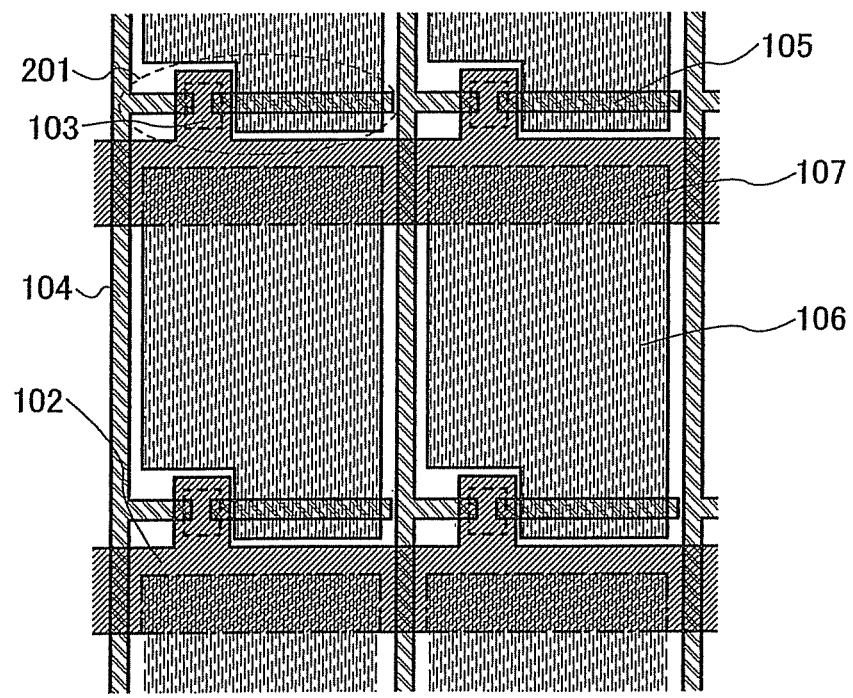
Figure 3:
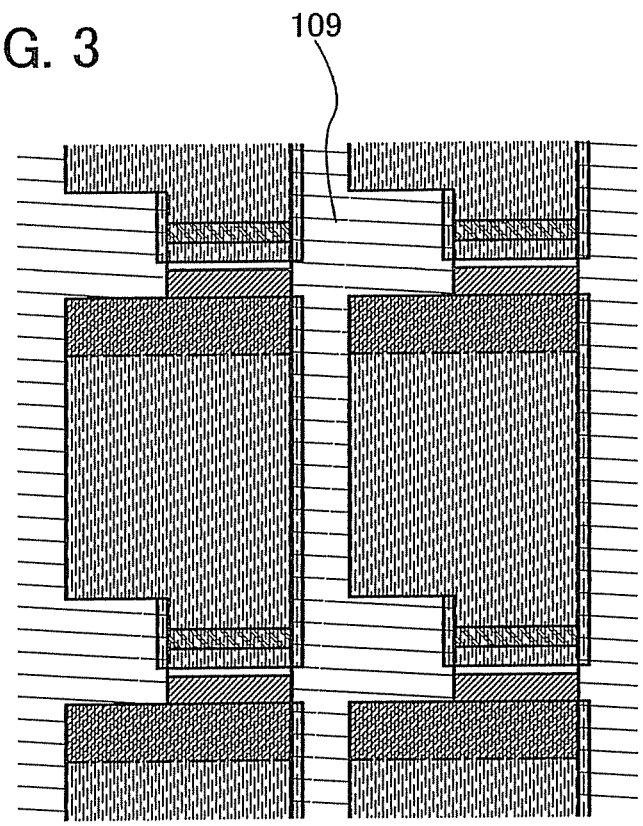
FIG. 3 is a top view of a pixel in a liquid crystal display device according to the present invention.

As for a liquid crystal display device of this embodiment mode, an overview of a transmissive pixel portion formed over a substrate is shown in FIGS. 1A and 1B and FIG. 3. A plurality of pixels is formed in the pixel portion, and a pixel TFT which is an active element is formed in each pixel. FIG. 3 is an actual top view of a pixel. FIG. 1B is a view in which a protective film 109 is removed from the state shown in FIG. 3. FIG. 1A shows a specific position of an opening 101.

In this embodiment mode, a bottom gate TFT, for example, an inversely staggered TFT is formed as a pixel TFT 201. The pixel TFT 201 includes a gate electrode 102, an island-shaped semiconductor film 103, a source electrode 104, and a drain electrode 105. In addition, an auxiliary capacitor (also referred to as a storage capacitor) 107 connected to the pixel TFT 201 and the opening 101, which is also a contact hole through which a pixel electrode 106 and the drain electrode 105 are connected to each other are formed.

The opening 101 is provided in a region between source wirings 104.

FIGS. 4A and 4B, FIGS. 5A and 5B, and FIGS. 6A and 6B are views each showing a top view of a manufacturing process of a pixel of the liquid crystal display device of this embodiment mode. Cross-sectional views taken along a line A-A' in each of FIGS. 4A, 4B, 5A, 5B, 6A and 6B are shown in FIGS. 7A, 7B, 7C, 7D, 7E, and 7F, respectively.

Figure 7A:
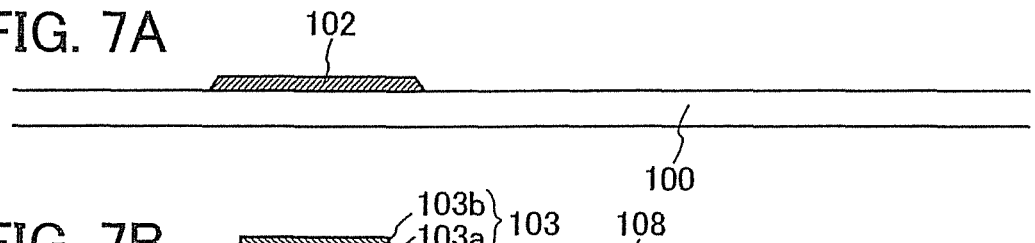
FIGS. 7A to 7F are cross-sectional views each showing a manufacturing method of a liquid crystal display device according to the present invention.

As shown in FIG. 4A which is a top view and FIG. 7A which is a cross-sectional view thereof, a gate electrode and gate wiring 102 is formed over a substrate 100. An insulating substrate is used as the substrate 100. For example, as the substrate 100, a light-transmitting glass substrate such as a barium borosilicate glass substrate, an alumino borosilicate glass substrate, or an alumino silicate glass substrate, typified by #7059, #1737, EAGLE 2000, or the like manufactured by Corning Incorporated can be used. A light-transmitting quartz substrate or the like may also be used.

Although it is preferable that the gate electrode and gate wiring (scanning line) 102 be formed of a low resistant conductive material such as aluminum (Al), there is a problem in that the gate electrode and gate wiring (scanning line) 102 has less heat resistance and is easily eroded when aluminum is used by itself. Therefore, it is desirable to form a stacked film in combination with a heat-resistant conductive material.

As the heat-resistant conductive material, an element selected from molybdenum (Mo), titanium (Ti), tantalum (Ta), tungsten (W), and chromium (Cr), an alloy film containing the elements as its component, or nitride containing the elements as its component may be used. Alternatively, combination of only such heat-resistant materials may be used.

As aluminum, aluminum containing 0.01 to 5 atom % of scandium (Sc), titanium (Ti), silicon (Si), copper (Cu), chromium (Cr), neodymium (Nd), molybdenum (Mo), or the like may be used in addition to pure aluminum. By adding an atom with mass larger than that of aluminum, effects of limiting transfer of an aluminum atom during heat treatment and preventing generation of a hillock are obtained.

As an example of combination of the above aluminum and heat-resistant conductive material, the following can be used: a stacked film of a film containing chromium (Cr) and a film containing aluminum (Al), a stacked film of a film containing chromium (Cr) and a film containing aluminum containing neodymium (Al—Nd), a stacked film of a film containing titanium (Ti), a film containing aluminum (Al), and a film containing titanium (Ti), a stacked film of a film containing titanium (Ti), a film containing aluminum containing neodymium (Al—Nd), and a film containing titanium (Ti), a stacked film of a film containing molybdenum (Mo), a film containing aluminum (Al), and a film containing molybdenum (Mo), a stacked film of a film containing molybdenum (Mo), a film containing aluminum containing neodymium (Al—Nd), and a film containing molybdenum (Mo), a stacked film of a film containing molybdenum (Mo) and a film containing aluminum (Al), a stacked film of a film containing molybdenum (Mo) and a film containing aluminum containing neodymium (Al—Nd), or the like.

As described above, the stacked film is formed over the entire surface of the substrate 100 by sputtering, a first resist mask is formed by a first photolithography process, an unnecessary part is removed by etching, thereby forming the gate electrode and gate wiring 102.

As shown in FIG. 7A, an edge portion of the gate electrode 102 is etched so as to be formed into a tapered shape. By providing the tapered shaped gate electrode 102, coatability of a gate insulating film 108 at the edge portion of the gate electrode 102 and withstand voltage of the gate insulating film 108 can be increased. In addition, by providing the tapered shaped gate electrode 102, an effect of reducing an electric field applied to an island-shaped semiconductor film 103 from the gate electrode 102 is obtained.

The gate electrode and gate wiring 102 is preferably formed to have a thickness of 40 to 400 nm. However, the thickness is determined depending on a substrate size of a liquid crystal display device or a material to be used as a wiring, and it is needless to say that the thickness can be changed according to need.

After formation of the gate electrode and gate wiring (scanning line) 102 in this manner, the gate insulating film 108 is formed. The gate insulating film 108 is formed by plasma CVD or sputtering to have a thickness of 350 to 450 nm. The gate insulating film 108 may be formed using an insulating film such as a silicon nitride film, a silicon oxide film, a silicon nitride film containing oxygen, or a silicon oxide film containing nitrogen, and may be formed as a single layer or stacked layer including these materials.

For example, as the gate insulating film 108, after a silicon nitride film with a thickness of 200 nm is stacked, another silicon nitride film with a thickness of 200 nm may be further stacked. When the gate insulating film 108 is formed by stacking two silicon nitride films, even if a pinhole is generated during formation of the lower silicon nitride film, growth of the pinhole is stopped by forming the upper silicon nitride film. Accordingly, an effect of improving dielectric withstand voltage of a TFT can be obtained.

In addition, by forming the gate insulating film 108 with two silicon nitride films, an effect of preventing freak due to an unnecessary product generated on an inner wall of a CVD apparatus or the like from being mixed into the gate insulating film 108 itself or other film during formation can also be obtained.

Moreover, by changing a film formation condition such as a ratio of produced gas, an effect of selecting a film which is compatible with films that are in contact with an upper surface and a lower surface of the gate insulating film 108, for example, an amorphous semiconductor film which is in contact with the upper surface of the gate insulating film 108, in terms of adhesion or the like, is obtained.

Although described hereinafter, in order to prevent the gate insulating film 108 from being etched while a protective film (passivation film) 109 is etched in a subsequent step, an insulating film with a dense film quality may be formed as the gate insulating film 108 so as to function as an etching stopper of the protective film 109.

When the above silicon nitride film is selected as the gate insulating film 108, alkali metal such as lithium (Li), sodium (Na), or potassium (K) contained in a glass substrate can be prevented from intruding. In addition, the similar effect is also obtained when the gate insulating film 108 is formed using a stacked film of the silicon oxide film and the silicon nitride film, the silicon nitride film containing oxygen, or the silicon oxide film containing nitrogen. In particular, when a halogen element such as fluorine (F) is contained in these films, it is possible that alkali metal is fixed by fluorine and loses mobility.

Next, over the gate insulating film 108, an amorphous semiconductor film is formed with a thickness of 100 to 200 nm over the entire surface of the substrate by a method such as plasma CVD or sputtering.

The amorphous structure can be confirmed by an electron diffraction analysis. A hydrogenated amorphous silicon film (a-Si:H film) is formed to have a thickness of 100 nm by plasma CVD. In addition, an amorphous semiconductor film such as an amorphous silicon germanium ($Si_xGe_y$) film can also be employed as the amorphous semiconductor film.

A microcrystal semiconductor film (semiamorphous semiconductor film) may be formed instead of the amorphous semiconductor film. A semiamorphous semiconductor film typified by a semiamorphous silicon film contains a semiconductor (semiamorphous semiconductor) having an intermediate structure between an amorphous semiconductor and a semiconductor having a crystalline structure (including a single crystal structure and a polycrystalline structure). The semiamorphous semiconductor is a semiconductor having a third condition that is stable in term of free energy, and is a crystalline substance having a short-range order and lattice distortion. A crystal grain thereof can be dispersed in the non-single crystal semiconductor by setting a grain size thereof to be 0.5 to 20 nm. Raman spectrum thereof is shifted toward lower wave number than 520 $cm^{-1}$. The diffraction peaks of (111) and (220), which are thought to be derived from a Si crystal lattice, are observed in the semiamorphous semiconductor by X-ray diffraction. The semiamorphous semiconductor contains hydrogen or halogen of at least 1 atomic % or more as a material for terminating a dangling bond. Such a semiconductor is referred to as a semiamorphous semiconductor (SAS) for the sake of convenience. The lattice distortion is further extended by adding a rare gas element such as helium, argon, krypton, and neon so that the favorable semiamorphous semiconductor with improved stability can be obtained.

A SAS can be obtained by glow discharge decomposition of a gas containing silicon. $SiH_4$ is typical gas containing silicon, and additionally, $Si_2H_6$, $SiH_2Cl_2$, $SiHCl_3$, $SiCl_4$, $SiF_4$, or the like can be used. The SAS can be easily formed by using the gas containing silicon diluted with hydrogen or gas in which one or more of rare gas elements selected from helium, argon, krypton, and neon is/are added to hydrogen. The gas containing silicon is preferably diluted with a 2 to 1000 fold dilution factor.

Furthermore, as a semiconductor film containing an impurity element imparting one conductivity type, an n-type semiconductor film is formed to have a thickness of 20 to 80 nm. For example, an n-type hydrogenated amorphous silicon film may be formed. In order to form the n-type hydrogenated amorphous silicon film, phosphine ($PH_3$) may be added at a concentration of 0.1 to 5% to silane ($SiH_4$). Accordingly, phosphorus (P) is contained in the hydrogenated amorphous silicon film.

When a p-type semiconductor film is used as the semiconductor film containing an impurity element imparting one conductivity type, diborane ($B_2H_6$) is added to silane ($SiH_4$), thereby obtaining a hydrogenated amorphous silicon film containing boron (B) which is a p-type impurity element.

All the above gate insulating film, amorphous semiconductor film, and semiconductor film containing an impurity element imparting one conductivity type can be formed by plasma CVD or sputtering. These films can be continuously formed by changing a reaction gas when plasma CVD is used, or by changing a sputtering gas when sputtering is used.

That is to say, these films can be continuously stacked without being exposed to the air by using the same reaction chamber or a plurality of reaction chambers (so-called multi chamber) in a plasma CVD apparatus or a sputtering apparatus. By using consecutive film formation, the film is not exposed to the air; therefore, in addition to an effect of remarkably reducing probability that a contamination source is mixed, an effect of reducing the time taken for a manufacturing process is obtained.

Figure 7B:
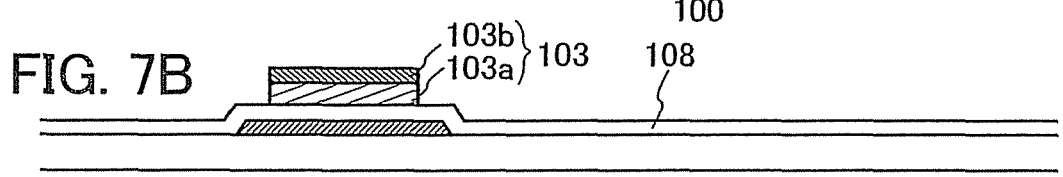
Figure 7C:
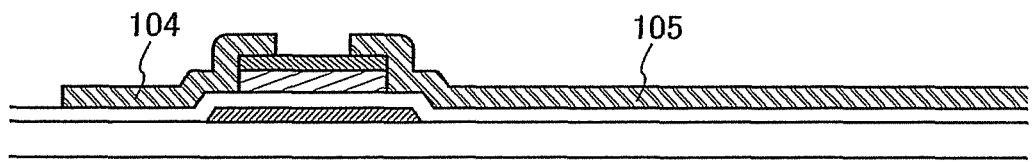

Then, the semiconductor film is formed by stacking the layers as described above. A second resist mask is formed by a second photolithography process, and the island-shape semiconductor film 103 is formed so as to overlap with the gate electrode 102 as shown in the top view FIG. 4B and the cross-sectional view FIG. 7B. As shown in FIG. 7B, the island-shaped semiconductor film 103 includes a stacked layer of an island-shaped amorphous semiconductor film 103a and an island-shaped semiconductor film containing an n-type impurity 103b.

Next, a conductive film is formed by sputtering, vacuum evaporation, MOCVD (metal organic chemical vapor deposition), or the like, a third resist mask is formed by a third photolithography process, and etching treatment is performed, thereby forming a source electrode and source wiring (the "source wiring" is also called a "data signal line" or a "signal line") 104 and a drain electrode 105.

In this embodiment mode, a metal film is used as a conductive film for forming the source electrode and source wiring 104 and the drain electrode 105. Specifically, the source electrode and source wiring 104 and the drain electrode 105 are formed using a stacked film of a film containing molybdenum (Mo), a film containing aluminum (Al), and a film containing molybdenum (Mo).

First, a molybdenum (Mo) film is formed to have a thickness of 20 to 80 nm and an ohmic contact with the island-shaped semiconductor film containing an impurity 103b is made. An aluminum (Al) film is formed to have a thickness of 150 to 300 nm over the molybdenum (Mo) film, and furthermore, a molybdenum (Mo) film is formed to have a thickness of 40 to 120 nm thereover. As a metal layer used here, in addition to the exemplified stacked film of a film containing molybdenum, a film containing aluminum, and a film containing molybdenum, in same manner, the following can be used: the gate electrode and gate wiring 102; a film containing an element selected from molybdenum (Mo), titanium (Ti), tantalum (Ta), tungsten (W), and chromium (Cr); a film containing an alloy containing the elements as its component; a film containing nitride containing the elements as its component; a stacked film of a film containing chromium (Cr) and a film containing aluminum (Al); a stacked film of a film containing chromium (Cr) and a film containing aluminum containing neodymium (Al—Nd); a stacked film of a film containing titanium (Ti), a film containing aluminum (Al), and a film containing titanium (Ti); a stacked film of a film containing titanium (Ti), a film containing aluminum containing neodymium (Al—Nd), and a film containing titanium (Ti); a stacked film of a film containing molybdenum (Mo), a film containing aluminum (Al), and a film containing molybdenum (Mo); a stacked film of a film containing molybdenum (Mo), a film containing aluminum containing neodymium (Al—Nd), and a film containing molybdenum (Mo); a stacked film of a film containing molybdenum (Mo) and a film containing aluminum (Al); a stacked film of a film containing molybdenum (Mo) and a film containing aluminum containing neodymium (Al—Nd); or the like.

Figure 5A:
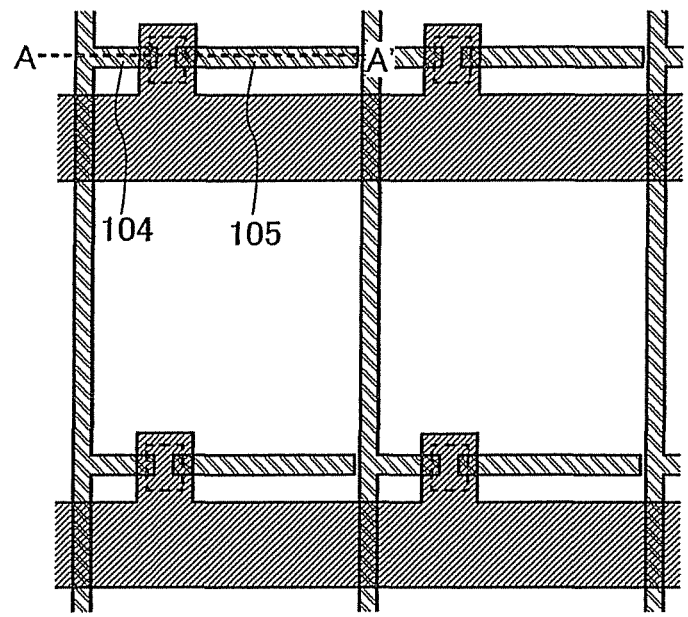
FIGS. 5A and 5B are top views each showing a manufacturing method of a liquid crystal display device according to the present invention.
Figure 7D:
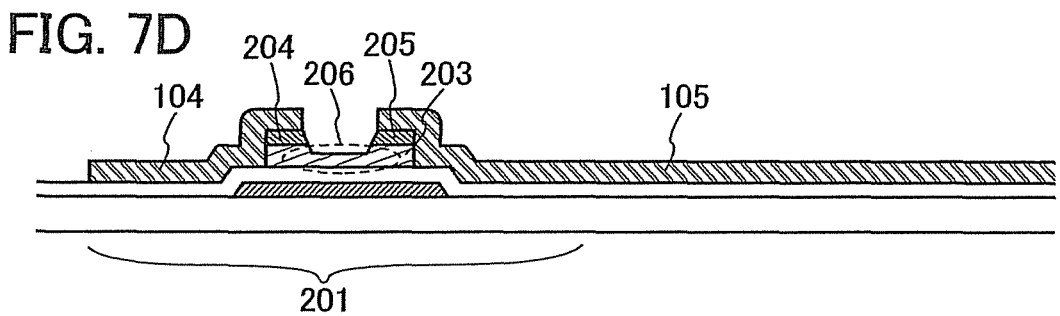

As shown in a top view FIG. 5A and a cross-sectional view FIG. 7D, using the source electrode 104 and the drain electrode 105 as masks, part of the island-shaped amorphous semiconductor film 103a and the island-shaped semiconductor film containing an impurity 103b is removed by dry etching, and the island-shaped semiconductor film containing an impurity 103b is divided into a source region 204 and a drain region 205. Also, the island-shaped amorphous semiconductor film 103a is etched in a self-aligning manner, thereby becoming an island-shaped semiconductor film 203 including a channel formation region 206.

As described above, a bottom gate TFT 201 of this embodiment mode is formed. It is to be noted that, although a channel etched bottom gate TFT is manufactured in this embodiment mode, a channel stopper bottom gate TFT may also be manufactured, if possible.

Thereafter, an insulating film is formed from an inorganic material over the island-shaped semiconductor film 203, the source region 204, the drain region 205, the source electrode and source electrode 104, and the drain electrode 105.

The insulating film formed from an inorganic material is formed of a silicon nitride film, a silicon nitride film containing oxygen, a silicon oxide film containing nitrogen, a silicon oxide film, or a stacked film in combination of these films, and the thickness thereof is 200 to 450 nm. In this embodiment mode, a silicon nitride film is formed using $SiH_4$ and $NH_3$ as material gas by plasma CVD.

Figure 5B:
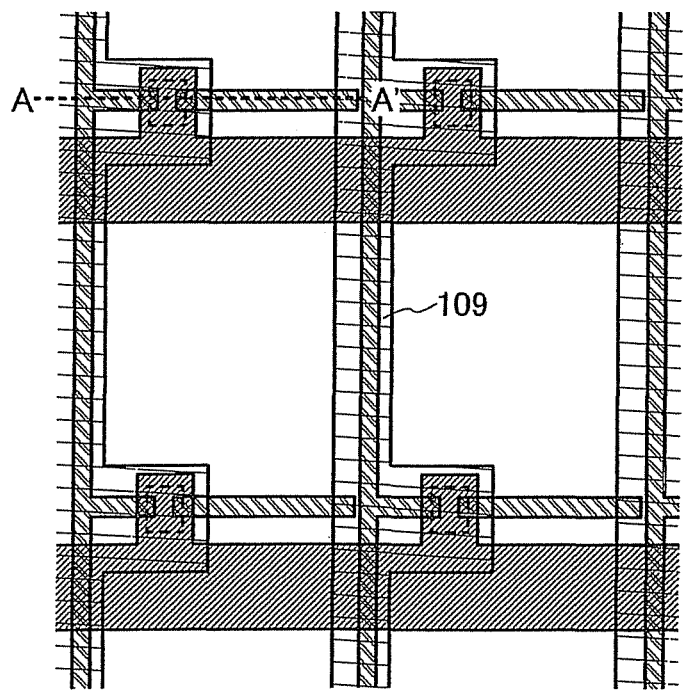
Figure 7E:
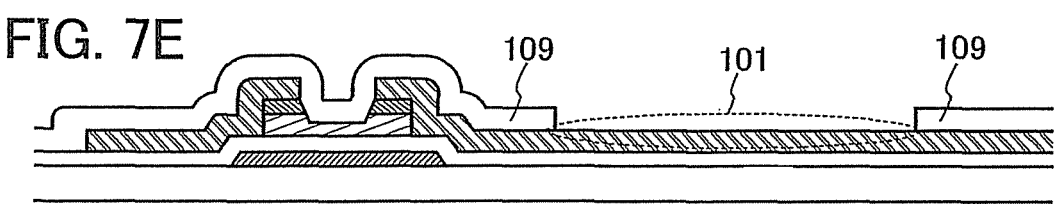

Thereafter, a fourth resist mask is formed by a fourth photolithography process, the insulating film formed from an inorganic material is dry etched, thereby forming a protective film 109 (top view FIG. 5B and cross-sectional view FIG. 7E). Although the protective film 109 covers the TFT, in an opening portion 101 in a pixel portion, the drain electrode 105 or the like is exposed because the insulating film formed from an inorganic film is removed by the dry etching process.

By forming the protective film 109, the TFT 201 can be protected from external contamination. In particular, by forming the protective film 109 to be in contact with the island-shaped semiconductor film 203, the source region 204, and the drain region 205, a contamination source can be prevented from entering the island-shaped semiconductor film 203 which is a core of a switching function.

As shown in FIG. 5B and FIG. 7E, an auxiliary capacitor 107 is formed using part of a pixel electrode 106 to be formed later and the gate wiring 102 in a region where the protective film 109 is not formed and the gate wiring 102 is exposed. Since the insulating film formed from an inorganic material is removed and the protective film 109 is not formed, most of the drain electrode extended from the TFT 201 is exposed.

Further, in this embodiment mode, when forming a resist mask with a predetermined shape in the fourth photolithography process, a resist mask including a bump is formed using a halftone exposure technique.

As shown in FIGS. 1A and 1B and FIG. 5B, an opening 101 is extended parallel to the source wiring 104; accordingly, residue of the protective film 109 generated by the fourth dry etching process and residue of a transparent conductive material generated when forming the pixel electrode 106, which will be described hereinafter, can be reduced. The opening 101 is extended parallel to the source wiring 104, that is, an opening is adjacent to another opening with the source wiring 104 interposed therebetween.

A predetermined portion of a protective film material typified by silicon nitride film is removed by etching using dry etching, as described above. At this time, an unnecessary substance such as part of the protective film material or a reaction product of the protective film material and an etching gas component which is generated due to etching remains on a surface to be processed as a residue. For example, when the residue is generated over a wiring which is to be connected to the pixel electrode 106 later, the residue can function as contact resistance between the pixel electrode 106 and the wiring or prevent electrical contact. Eventually, the residue can seriously damage a function as a liquid crystal display device or make the function itself impossible to work.

In order to prevent the residue from remaining, the surface to be processed is cleaned with a fluorine-based chemical, alkali cleaner, a surface active agent, or pure water or a combination of these and ultrasonic cleaning (hereinafter, referred to as cleaner).

However, in a structure of a conventional liquid crystal display device, a circular contact hole 1001 (for example, a diameter of 5 to 10 µm) was used in a portion where a pixel electrode and a drain electrode were in contact with each other (see FIG. 2C). In such a circular contact hole 1001, there has been concern that a residue or a cleaning liquid might remain on the inner wall or at the bottom of the contact hole when a substrate with a surface to be processed is drawn from cleaner after cleaning.

By using the opening of the present invention instead of the conventional contact hole 1001, a residue can be prevented from remaining and also, the residue can be prevented from remaining, especially around a bump by utilizing an opening 101 extended in a direction parallel to a signal line as a path through which the cleaner runs down, when a substrate with the surface to be processed is drawn from the cleaner after cleaning. In addition, this path can be used also in the above cleaning or a cleaning process with blow of gas or the like.

Figure 6A:
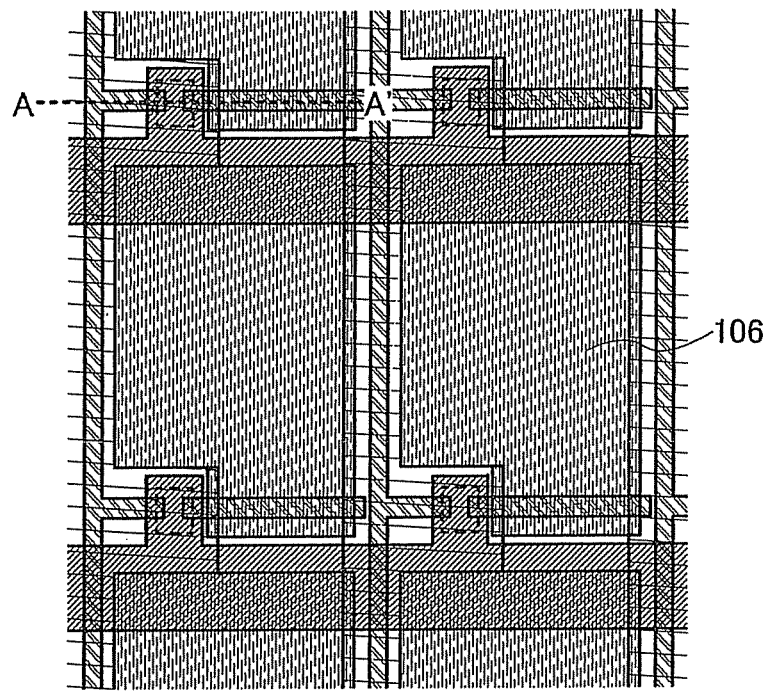
FIGS. 6A and 6B are top views each showing a manufacturing method of a liquid crystal display device according to the present invention.
Figure 6B:
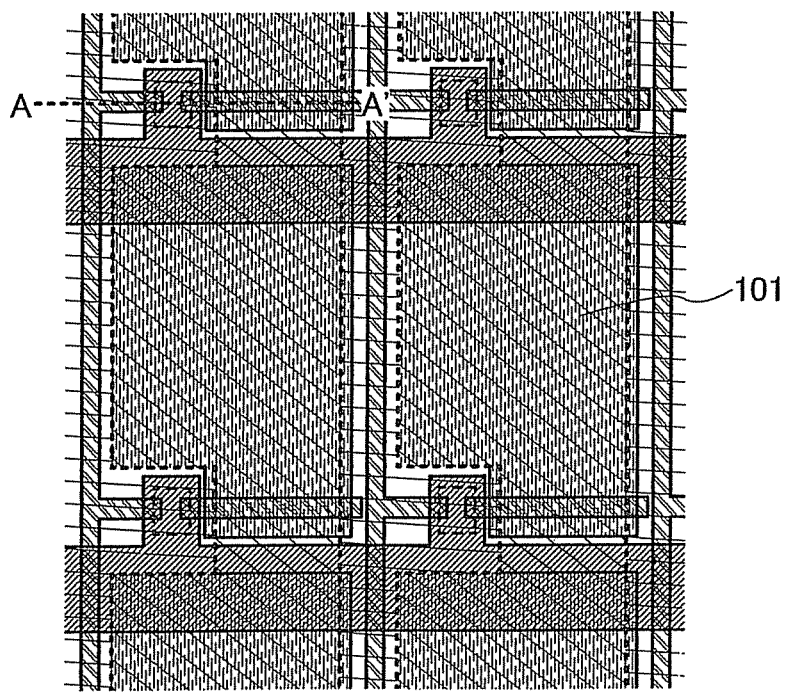
Figure 7F:
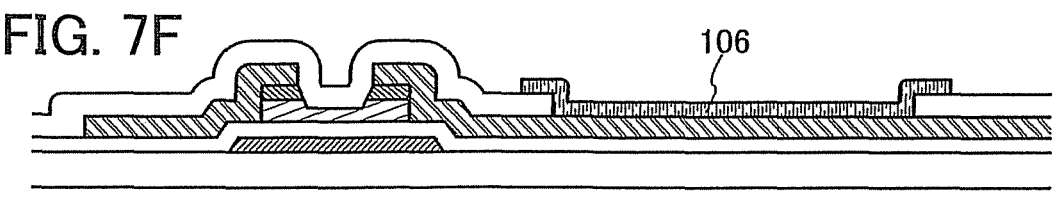

Then, a transparent conductive film is formed to have a thickness of 30 to 120 nm by sputtering, vacuum evaporation, spraying, dipping, or CVD, a fifth resist mask is formed by a fifth photolithography method, and the pixel electrode 106 is formed as shown in top view FIG. 6A and cross-sectional view FIG. 7F. FIG. 6B shows the opening 101 in FIG. 6A. The pixel electrode 106 is connected to the drain electrode 105 in the opening 101.

Figure 2:
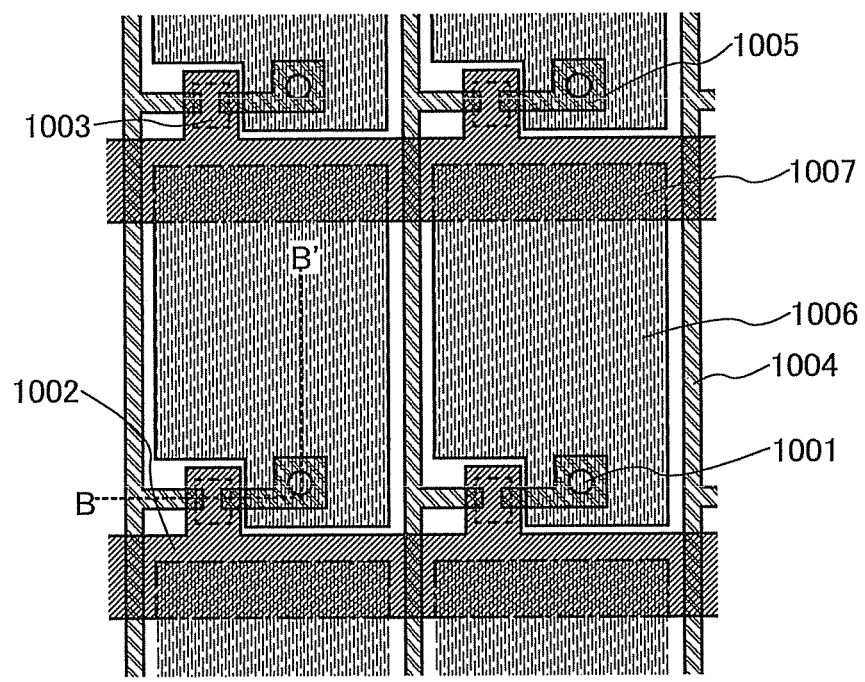
FIG. 2 is a top view of a pixel in a conventional liquid crystal display device.

In the present invention, the drain electrode 105 and the pixel electrode 106 are connected to each other in the opening 101, which could be regarded as that formed by further expanding the contact hole 1001 of the conventional liquid crystal display device shown in FIG. 2. Therefore, the region where the drain electrode 105 and the pixel electrode 106 are connected to each other is dramatically increased in comparison to that of the conventional liquid crystal display device. Accordingly, effects of reducing contact resistance as well as suppressing contact defects which have been conventionally generated can be obtained.

The transparent conductive film is formed using a material such as indium oxide ($In_2O_3$), indium oxide tin oxide alloy (also referred to as indium tin oxide, $In_2O_3$—$SnO_2$, abbreviated as ITO), indium oxide zinc oxide alloy ($In_2O_3$—ZnO) or the like by sputtering, vacuum evaporation, or the like. Since indium itself is rare, the transparent conductive film material which does not contain indium such as tin oxide (SnO) may also be used.

The transparent conductive film is generally etched with an oxidizing acid aqueous solution formed from hydrochroloric acid, nitric acid, iron chloride, high-purity iron chloride, hydrogen bromide, or a combination of these. At this time, part of the transparent conductive film material generated due to etching sometimes remains on the surface to be processed as a residue.

For example, when the formed pixel electrodes are connected by the residue, small leakage current or conduction occurs, which leads to decrease of image quality or difficulty in display itself.

In the present invention, in order to prevent this, by the opening 101 instead of the contact hole which connects the drain electrode 105 to the pixel electrode 106, the residue can be prevented from remaining, especially around a bump by utilizing the opening 101 extended in a direction parallel to a signal line as the path through which the cleaner runs down, when the substrate with the surface to be processed is drawn from the cleaner after cleaning.

Accordingly, through the five photolithography processes with the use of five photomasks, the pixel including the bottom gate T 201, the auxiliary capacitor 107, and the opening can be completed. By forming an image display portion where these pixels are arranged in matrix, one of substrates used for an active matrix liquid crystal display device using a TFT which is an active element can be formed. Such a substrate is referred to as a substrate in this specification for the sake of convenience.

Over the TFT substrate manufactured in this embodiment mode, the auxiliary capacitor 107 of the pixel portion may include the gate wiring 102, the pixel electrode 106, and only the gate insulating film 108 interposed therebetween as a dielectric film. This structure becomes possible by forming the opening 101 extended in column and parallel to the source wiring 104 in the present invention.

In the second method described in the description of the related art, the auxiliary capacitor includes the gate insulating film and the protective film as dielectric films. On the other hand, the auxiliary capacitor 107 in this embodiment mode may include only the gate insulating film 108, which makes it possible to thin the dielectric film substantially and increase capacitance of the auxiliary capacitor 107.

Since capacitance is increased, it is not necessary that a portion where the pixel electrode and the gate wiring overlap is expanded to be provided, unlike in the conventional way. Therefore, the width of the gate wiring 102 can be designed to be thin, which leads to an effect of increasing in an aperture ratio.

However, making the width of the gate wiring 102 thin also leads to increase in resistance of the wiring itself, it is necessary to properly select the width of the gate wiring 102.

In addition, according to this embodiment mode, unlike in the first method described in description of the related art, it is not necessary that the electrode which is connected to the pixel electrode and also is formed of the same material and formed in the same layer as those of the drain electrode is separately provided as the auxiliary electrode. Therefore, a cause of decrease of the yield can be eliminated.

Moreover, over the TFT substrate manufactured in this embodiment mode, the opening 101 where the drain electrode 105 and the pixel electrode 106 are connected to each other is sufficiently large in comparison with the conventional contact hole 1001 shown in FIG. 2.

Therefore, disclination of liquid crystals in an upper portion of the contact hole and in the vicinity thereof, which has been conventionally generated, is not generated. In other words, since an area of black matrix which has been conventionally necessary for preventing light from leaking due to disclination can be reduced, an opening ratio can be increased.

In addition, over the TFT substrate manufactured in this embodiment mode, the opening 101 is used instead of the contact hole 1001 which has been conventionally formed. The opening 101 is a portion through which light emitted from a backlight source is transmitted and in which an image is formed through liquid crystals provided in the upper portion.

Figure 13A:
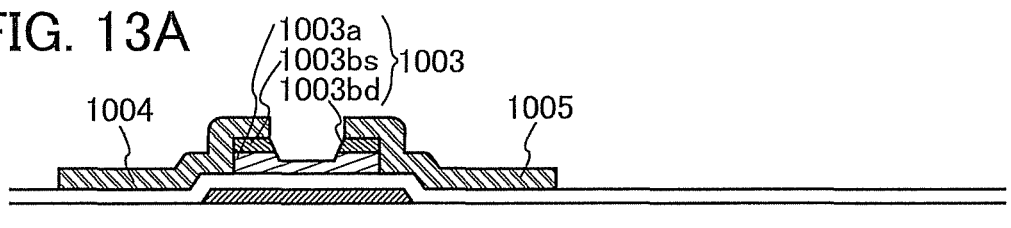
FIGS. 13A to 13E are cross-sectional views each showing a manufacturing method of a conventional liquid crystal display device.
Figure 13B:
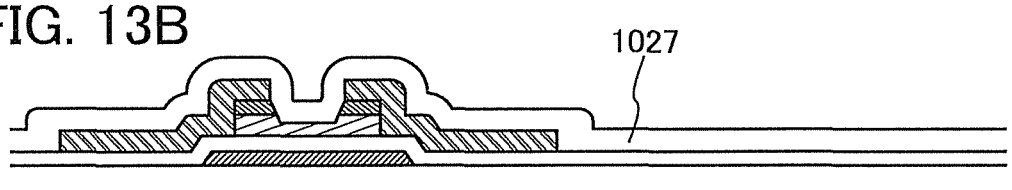
Figure 13C:
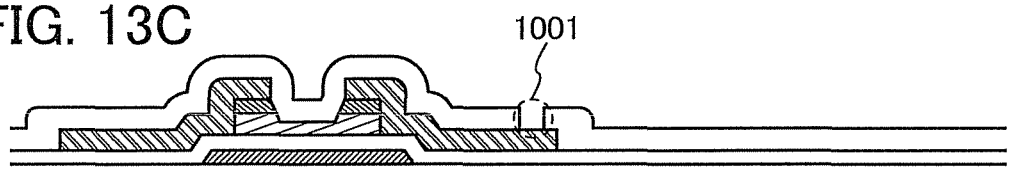
Figure 13D:
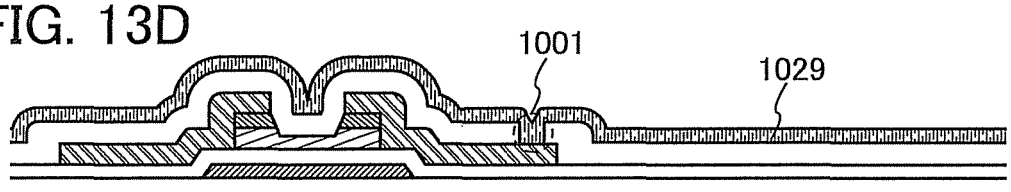
Figure 13E:
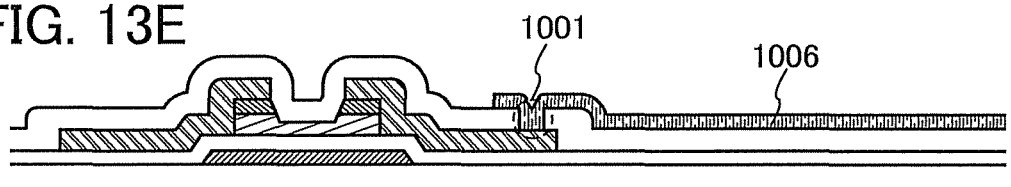

As shown in FIG. 13E, in the conventional way, a protective film 1027 is also formed in the opening 101. However, in the present invention, the protective film has the opening 101.

That is to say, in the conventional liquid crystal display device, the protective film 1027 was formed also in the opening 101, and light is absorbed, reflected, and scattered, which became a cause of decrease in light intensity. However, in the present invention, by removing the protective film in the opening portion, an effect that transmittance of light emitted from the light source in the opening is increased can be obtained.

A manufacturing process after formation of the substrate and until completion of a liquid crystal display device will be hereinafter explained with reference to FIG. 8, FIG. 9, and FIGS. 10A to 10D.

An alignment film 208 is formed so as to cover the protective film 109 and the pixel electrode 106 over the TFT substrate. The alignment film 208 may be formed by a droplet discharging method, a screen printing method, or an offset printing method. Thereafter, rubbing treatment is performed to the surface of the alignment film 208.

Figure 8:
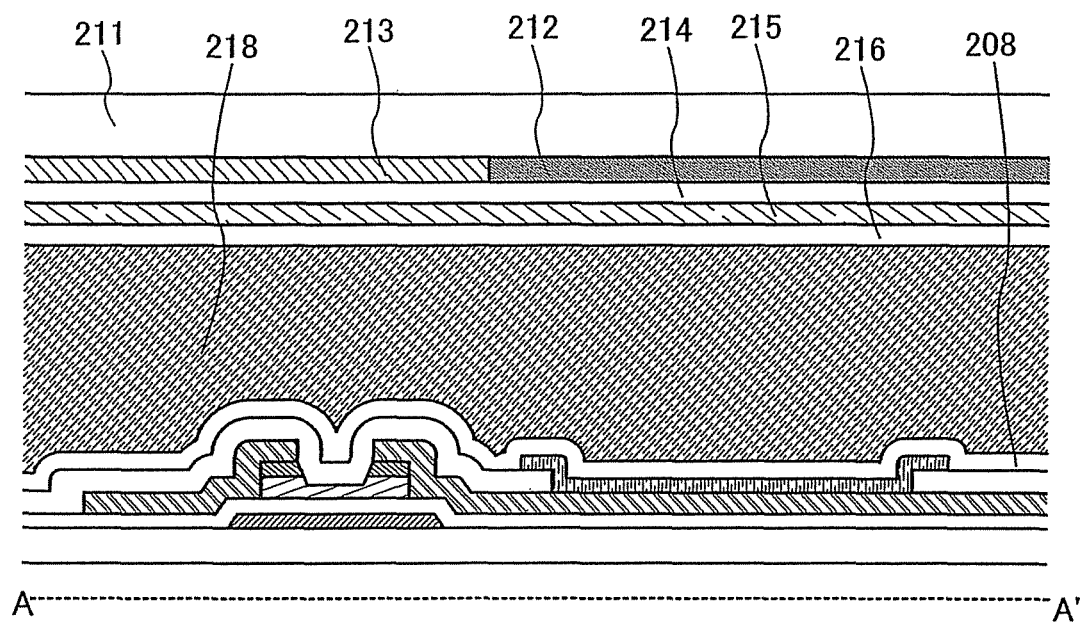
FIG. 8 is a cross-sectional view of a liquid crystal display device according to the present invention.

Then, over a counter substrate 211, a color filter including a colored layer 212, a light-shielding layer (black matrix) 213, and an overcoat layer 214 is provided, a counter electrode 215 formed of a transparent electrode is provided, and an alignment film 216 is formed thereover (see FIG. 8). Since the counter electrode 215 is formed of a transparent electrode, the liquid crystal display device of this embodiment mode becomes a transmissive liquid crystal display device. When the counter electrode 215 is formed of a reflective electrode, the liquid crystal display device of this embodiment mode becomes a reflective liquid crystal display device.

A sealing material 221 having a closed pattern is formed by a dispenser so as to surround a region overlapping with the pixel portion 231. Although an example of forming the sealing material having the closed pattern in order to drop a liquid crystal 218 is shown here, a dip method (pumping method) may be used as well, in which a sealing pattern having an opening is provided and a liquid crystal is injected by utilizing capillary phenomenon after attaching the TFT substrate (see FIG. 10A).

Figure 10A:
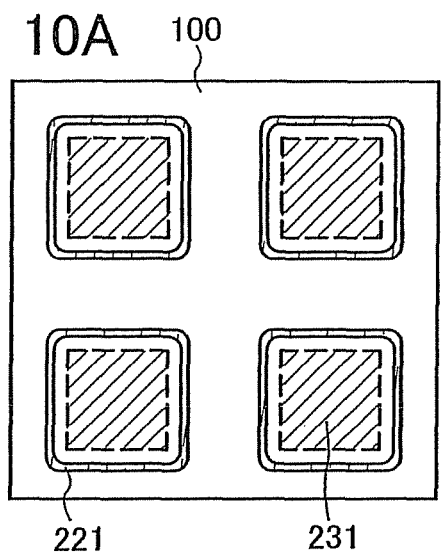
FIGS. 10A to 10D are top views each showing a manufacturing method of a liquid crystal display device according to the present invention.
Figure 10B:
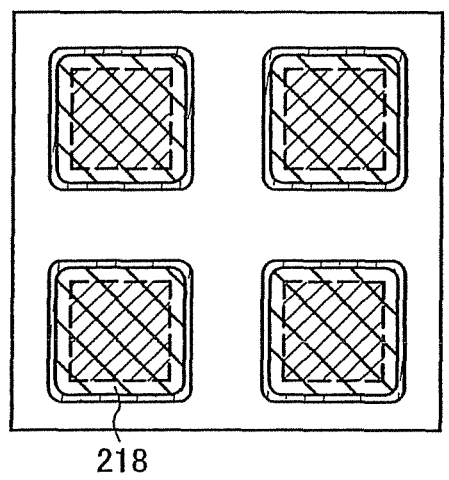
Figure 10C:
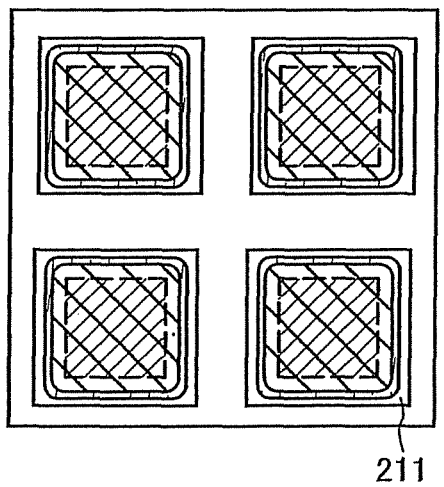
Figure 10D:
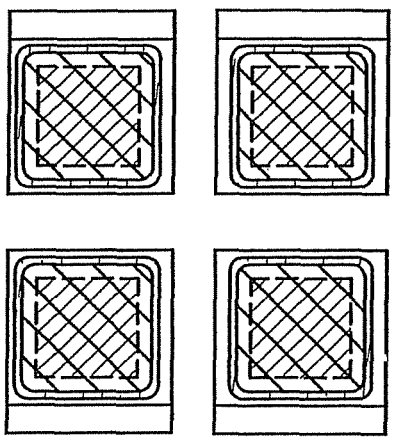
Figure 11:
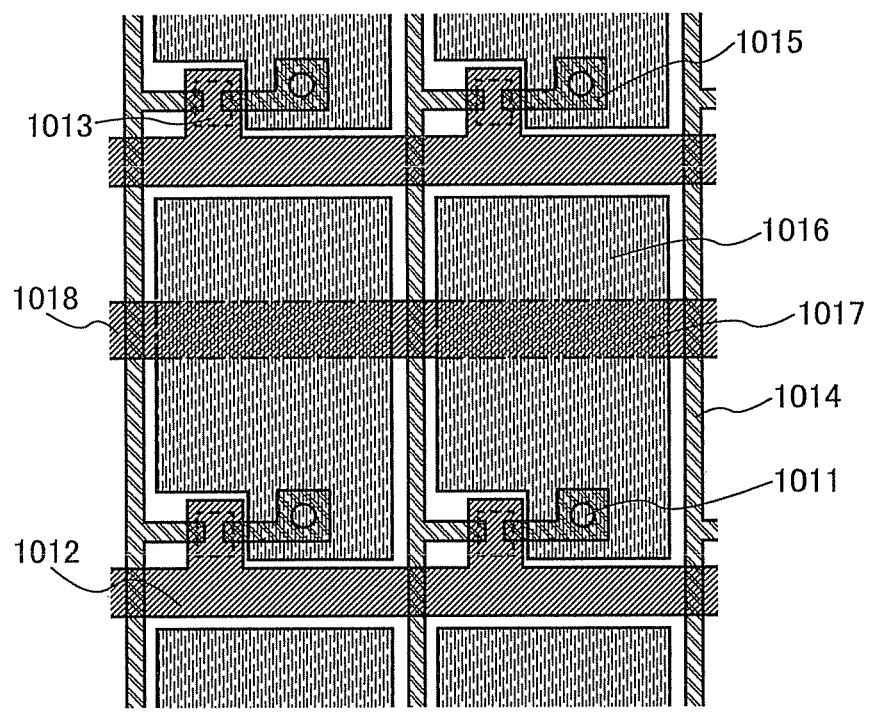
FIG. 11 is a top view of a pixel in a conventional liquid crystal display device.
Figure 12A:
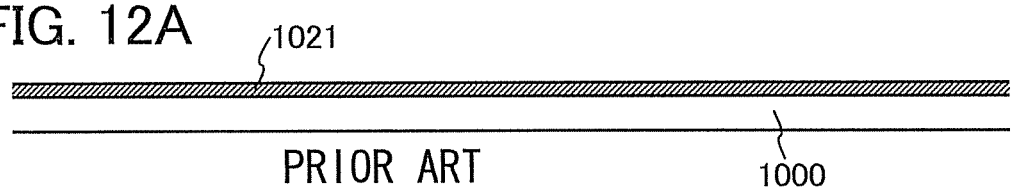
FIGS. 12A to 12F are cross-sectional views each showing a manufacturing method of a conventional liquid crystal display device.
Figure 12B:
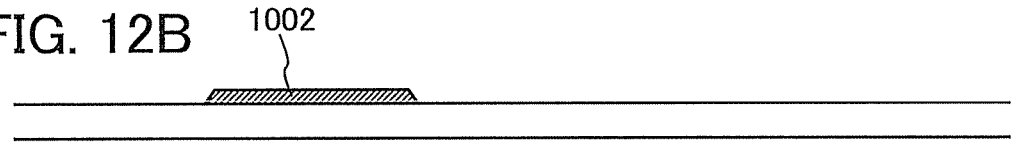
Figure 12C:
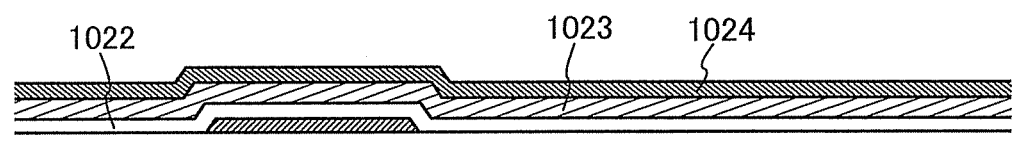
Figure 12D:
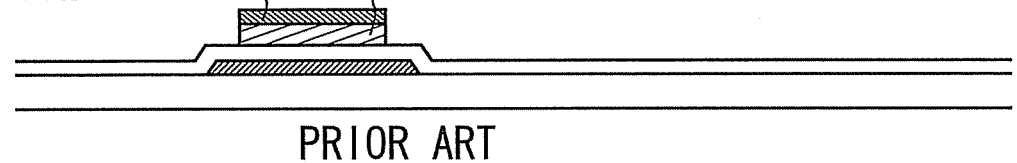
Figure 12E:
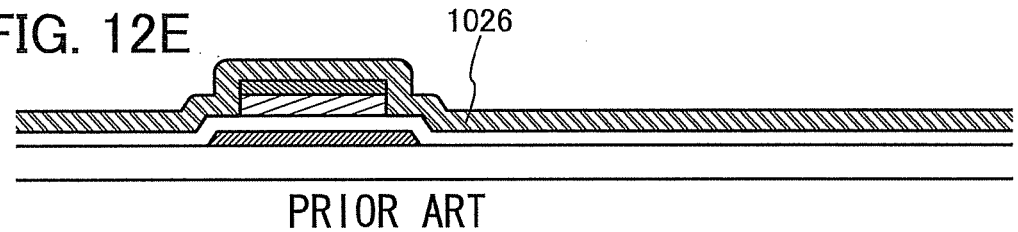
Figure 12F:
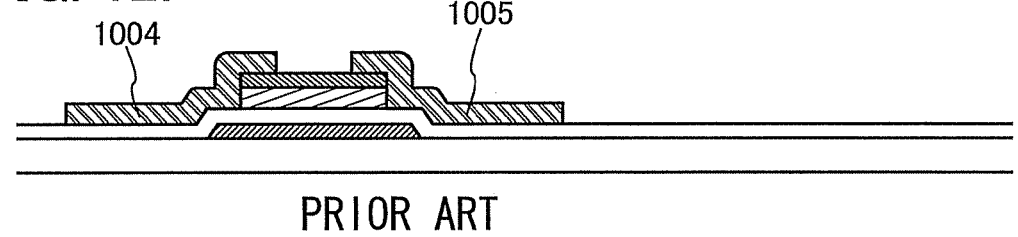

Subsequently, the liquid crystal 218 is dropped under reduced pressure so that an air bubble does not enter (see FIG. 10B), and the substrate 100 and the counter substrate 211 are attached to each other (see FIG. 10C). The liquid crystal 218 is dropped in the sealing pattern of a closed loop once or multiple times.

As an alignment mode of the liquid crystal 218, a TN mode is used in which the arrangement of liquid crystal molecules is twisted at 90° from where light enters toward where light is emitted. The substrates are attached to each other in such a manner that the rubbing directions thereof are orthogonal to each other.

The distance between a pair of the substrates may be kept by dispersing a spherical spacer or forming a columnar spacer formed of a resin, or by mixing filler in the sealing material 221. The aforementioned columnar spacer is formed of an organic resin material containing, as its main component, at least one of acrylic, polyimide, polyimide amide, and epoxy, or an inorganic material such as one of silicon oxide, silicon nitride, and silicon oxide containing nitrogen, or a stacked film thereof.

Then, the substrate is divided. In a case of obtaining a number of panels, the substrate is divided into a number of panels. On the other hand, in a case of obtaining one panel, a dividing step can be omitted by attaching the counter substrate which is cut in advance to the substrate (see FIG. 10D).

Then, an FPC (flexible printed circuit) 222 is attached through an anisotropic conductive layer by using a known technique (see FIG. 9). Through the above steps, a liquid crystal display device is completed. In addition, an optical film is attached as needed. In a case of a transmissive liquid crystal display device, a polarizing plate is attached to each of the active matrix substrate and the counter substrate.

As described above, by the present invention, in the step of forming the protective film (passivation film), the residue which is generated in etching the insulating film can be prevented from remaining, and a contact defect between the pixel electrode 106 and the drain electrode 105 can be reduced.

By the present invention, in the step of forming the pixel electrode 106, the residue which is generated when etching the transparent conductive film material can be prevented from remaining. Accordingly, continuity between the pixel electrodes can be prevented.

In addition, by the present invention, an area where the pixel electrode 106 and the drain electrode 105 are in contact with each other can be dramatically increased in comparison with the conventional liquid crystal display device. Accordingly, contact resistance between the pixel electrode 106 and the drain electrode 105 can be reduced.

Moreover, in the present invention, disturbance of alignment (disclination) of a liquid crystal derived from a shape of a contact hole provided in a pixel electrode, which has been seen in the conventional liquid crystal display device, can be reduced.

Furthermore, in the present invention, the dielectric film of the auxiliary capacitor 107 includes only the gate insulating film 108; therefore, the dielectric film can be substantially thinned, and capacitance of the auxiliary capacitor 107 can be increased. Also, since the capacitance of the auxiliary capacitor 107 is increased, the width of the gate wiring 102 can be designed to be thin, and the area of the auxiliary capacitor 107 can be reduced.

By forming the protective film 109 so as to expand over the entire area of the opening 101 by removing the insulating film formed of the protective film material, transmittance of light from the light source in the opening 101 is increased, and luminance is increased.

In the present invention, the number of photomasks used in the photolithography processes is not increased in comparison with the conventional liquid crystal display device, and a high-quality liquid crystal display device can be manufactured without increasing the number of manufacturing steps or manufacturing costs.

[Embodiment 1]

In this embodiment, an example of forming an island-shaped semiconductor film by etching a semiconductor film with the use of a resist mask which is used for forming a source electrode and source wiring and a drain electrode will be explained with reference to FIGS. 14A to 14D, FIGS. 15A and 15B, and FIGS. 18A and 18B. It is to be noted that a portion which is not explained follows the description of Embodiment Mode.

Figure 14A:
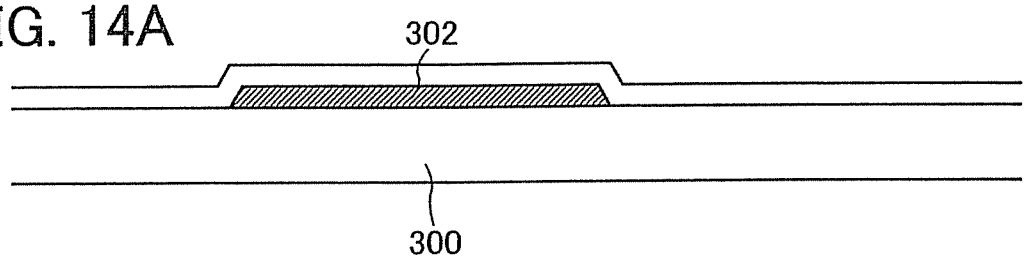
FIGS. 14A to 14D are cross-sectional views each showing a manufacturing method of a liquid crystal display device according to the present invention.

First, a gate electrode and gate wiring 302 is formed over a substrate 300 (see FIG. 14A). The same substrate as the substrate 100 in Embodiment Mode may be used for the substrate 300. In addition, the gate electrode and gate wiring 302 may be formed of the same material and aimed by the same manufacturing process as those of the gate electrode and gate wiring 102 in Embodiment Mode.

Figure 14B:
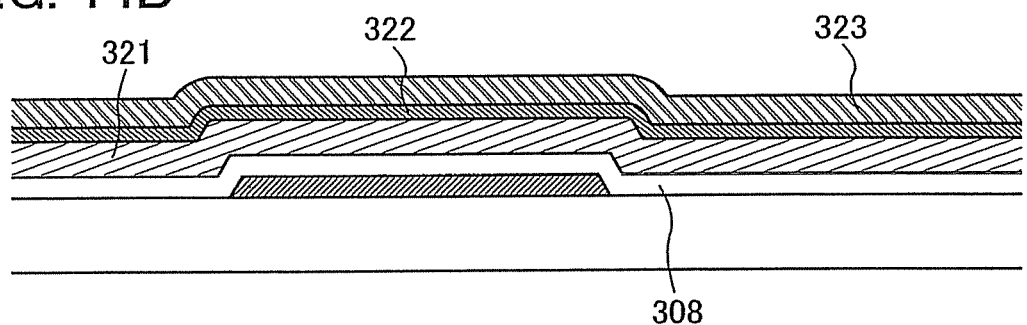

Then, a gate insulating film 308, an amorphous semiconductor film 321, a semiconductor film 322 containing an impurity imparting one conductivity type, and a conductive film 323 are formed over the substrate 300 and the gate electrode and gate wiring 302 (see FIG. 14B).

The gate insulating film 308 may be formed of the same material and formed by the same process as those of the gate insulating film 108 in Embodiment Mode. The amorphous semiconductor film 321 may be formed of the same material and formed by the same process as those of the amorphous semiconductor film for forming the island-shaped semiconductor film 103. The semiconductor film 322 containing an impurity imparting one conductivity type may be formed of the same material and formed by the same process as those of the semiconductor film for forming the source region 204 and the drain region 205.

As the conductive film 323, as in the conductive film described in Embodiment Mode, a metal film may be formed by sputtering, vacuum evaporation, MOCVD (metal organic chemical vapor deposition). As the metal film, the following can be used: a film containing an element selected from molybdenum (Mo), titanium (Ti), tantalum (Ta), tungsten (W), and chromium (Cr); a film containing an alloy containing the elements as its component; a film containing nitride containing the elements as its component; a stacked film of a film containing chromium (Cr) and a film containing aluminum (Al); a stacked film of a film containing chromium (Cr) and a film containing aluminum containing neodymium (Al—Nd); a stacked film of a film containing titanium (Ti), a film containing aluminum (Al), and a film containing titanium (Ti); a stacked film of a film containing titanium (Ti), a film containing aluminum containing neodymium (Al—Nd), and a film containing titanium (Ti); a stacked film of a film containing molybdenum (Mo), a film containing aluminum (Al), and a film containing molybdenum (Mo); a stacked film of a film containing molybdenum (Mo), a film containing aluminum containing neodymium (Al—Nd), and a film containing molybdenum (Mo); a stacked film of a film containing molybdenum (Mo) and a film containing aluminum (Al); a stacked film of a film containing molybdenum (Mo) and a film containing aluminum containing neodymium (Al—Nd); or the like.

Figure 14C:
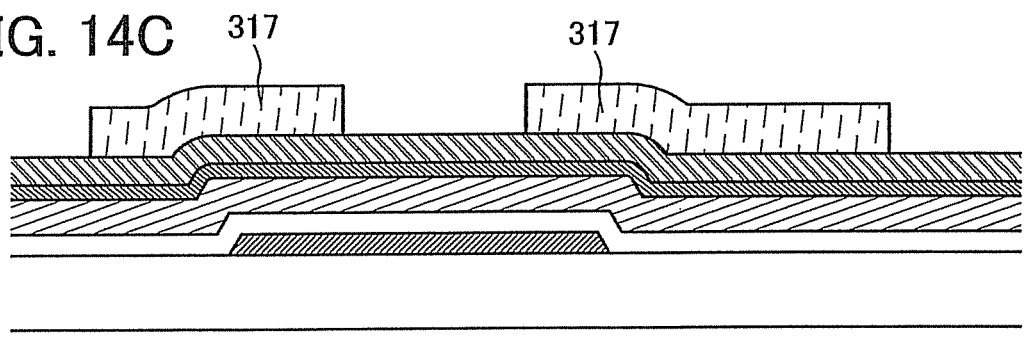
Figure 14D:
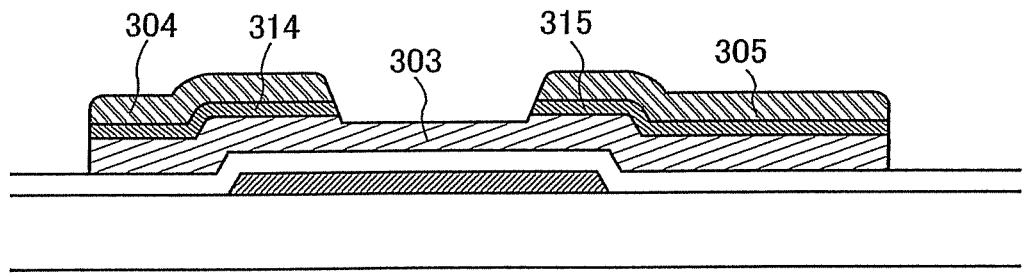

Subsequently, a resist mask 317 is formed by the same process as the third photolithography process in Embodiment Mode (see FIG. 14C). The conductive film 323 is etched using the resist mask 317 by wet etching, and a source electrode and source wiring 304 and a drain electrode 305 are formed.

Then, the amorphous semiconductor film 321 and the semiconductor film 322 containing an impurity imparting one conductivity type are reused as masks for etching without removing the resist mask 317. The amorphous semiconductor film 321 and the semiconductor film 322 containing an impurity imparting one conductivity type are etched by thy etching, the semiconductor film 322 containing an impurity imparting one conductivity type are divided into a source region 314 and a drain region 315, and an island-shaped semiconductor film 303 having a channel formation region is formed from the amorphous semiconductor film 321 (see FIG. 14D).

Next, a protective film 309 is formed of the same material and formed by the same process as those of the protective film 109. As described in Embodiment Mode, an insulating film formed from a protective film material is etched by a fourth photolithography process, thereby forming the protective film 309 (see FIG. 15A).

The protective film 309 is formed so that an edge thereof is positioned inside an edge of the drain electrode 305, and accordingly, the drain electrode 305 is exposed.

Figure 15A:
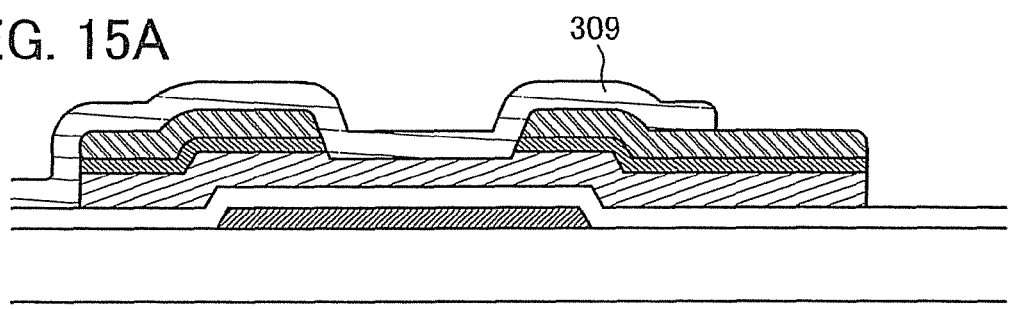
FIGS. 15A and 15B are cross-sectional views each showing a manufacturing method of a liquid crystal display device according to the present invention.
Figure 15B:
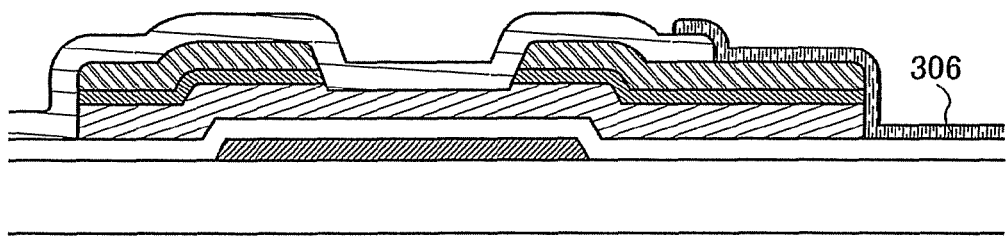

Then, a pixel electrode 306 is formed over the protective film 309, a region where the drain electrode 305 is exposed, and the gate insulating film 308 (see FIG. 15B). Since the edge of the protective film 309 and the edge of the drain electrode 305 are not positioned in the same place and are positioned in separate places apart from each other, coverage of the pixel electrode 306 is improved and disconnection is not easily generated.

Figure 18A:
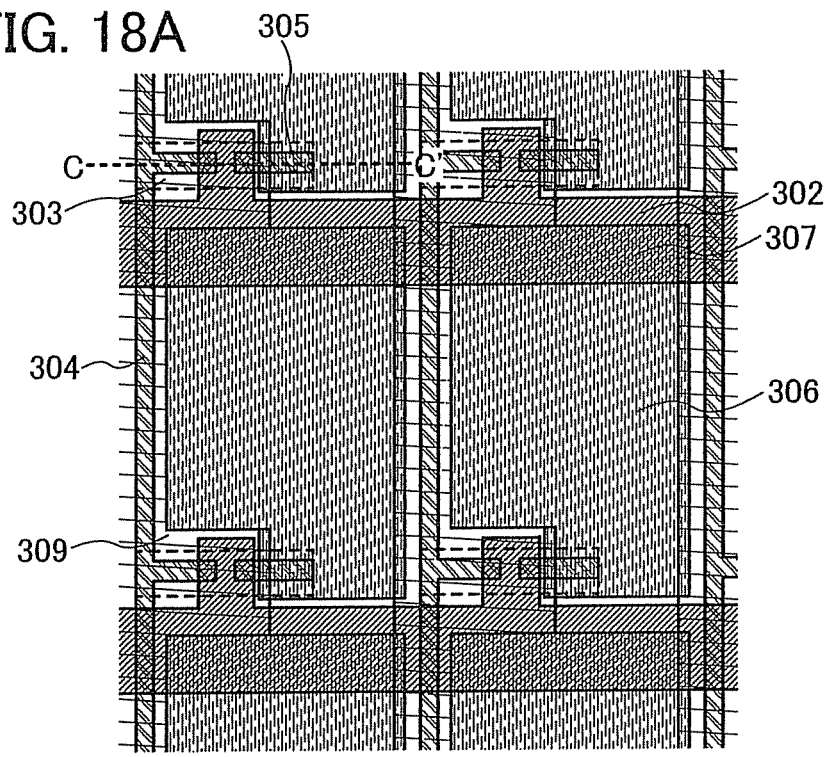
FIGS. 18A and 18B are top views each showing a manufacturing method of a liquid crystal display device according to the present invention.
Figure 18B:
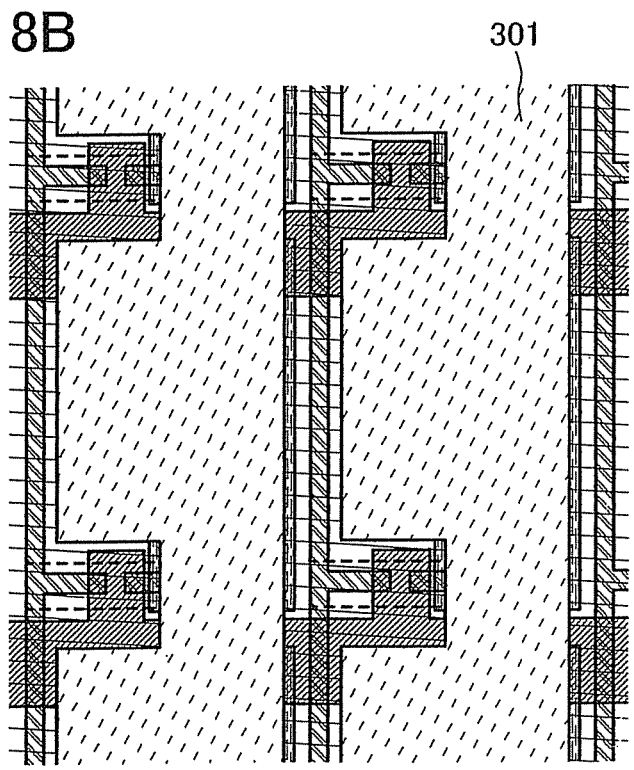

A top view of a pixel of the liquid crystal display device manufactured as described above is shown in each of FIGS. 18A and 18B. A cross-section shown by a line C-C' in FIG. 18A corresponds to FIG. 15B. FIG. 18A is an actual top view of a pixel, and FIG. 18B is a view in which a position of an opening 301 is emphasized.

An auxiliary capacitor 307 includes the gate electrode and gate wiring 302, the pixel electrode 306, and the gate insulating film 308 formed therebetween. Since the insulating film in an opening, which is formed from a protective film material, is removed and the protective film 309 is not formed, only the gate insulating film 308 can be a dielectric film of the auxiliary capacitor 307. Therefore, the auxiliary capacitor 307 with larger capacitance can be formed.

Also in the liquid crystal display device of this embodiment, by expanding a conventional contact hole 1001 over the whole opening of a pixel as in Embodiment Mode, the following effect can be obtained.

In other words, by this embodiment, a residue generated when etching the insulating film during a formation process of the protective film 309 can be prevented from remaining, and contact defect between the pixel electrode 306 and the drain electrode 305 can be reduced.

By this embodiment, a residue generated when etching a transparent conductive film material during a formation process of the pixel electrode 306 can be prevented from remaining. Accordingly, continuity between the pixel electrodes can be prevented.

In addition, by this embodiment, an area where the pixel electrode 306 and the drain electrode 305 are in contact with each other can be dramatically increased in comparison with a conventional liquid crystal display device. Accordingly, contact resistance between the pixel electrode 306 and the drain electrode 305 can be reduced.

Moreover, in this embodiment mode, the edge of the protective film 309 is positioned inside the edge of the drain electrode 305; accordingly, coverage of the pixel electrode 306 is improved and disconnection of the pixel electrode 306 can be prevented.

Furthermore, in this embodiment, disturbance of alignment of a liquid crystal (disclination) derived from a shape of a contact hole provided inside the pixel electrode, which has been seen in the conventional liquid crystal display device, can be reduced.

In addition, in the present invention, the dielectric film of the auxiliary capacitor 307 is formed from almost only the gate insulating film 308; accordingly, the dielectric film can be substantially thinned and capacitance of the auxiliary capacitor 307 can be increased. Also, a narrow width of the gate wiring 302 for increasing the capacitance of the auxiliary capacitor 307 can be designed, and the area of the auxiliary capacitor 307 can be reduced.

By forming the protective film 309 and forming the opening 301 by removing the insulating film formed of the protective film material, transmittance of light from the light source in the opening 301 is increased, and luminance is increased.

In the present invention, the number of photomasks used in the photolithography process is not increased in comparison with the conventional liquid crystal display device, and a high-quality liquid crystal display device can be manufactured without increasing a manufacturing process or manufacturing costs.

It is to be noted that this embodiment can be combined with all structures of or part of the structure of Embodiment Mode, if necessary.

[Embodiment 2]

In this embodiment, a different example from that of Embodiment 1, in a method for forming an island-shaped semiconductor film by etching a semiconductor film with the use of a resist mask used when forming a source electrode and source wiring and a drain electrode, will be explained with reference to FIGS. 16A to 16D, FIGS. 17A to 17D, and FIGS. 19A and 19B. It is to be noted that a portion which is not expressly explained follows the description of Embodiment Mode and Embodiment 1.

Figure 16A:
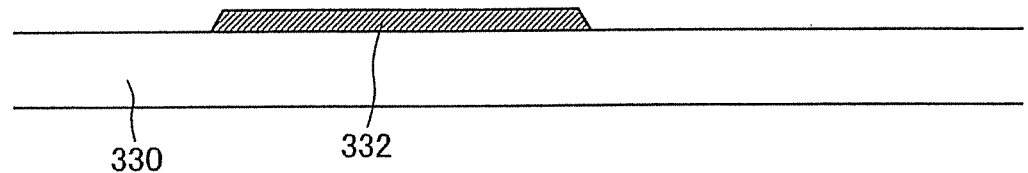
FIGS. 16A to 16D are cross-sectional views each showing a manufacturing method of a liquid crystal display device according to the present invention.
Figure 16B:
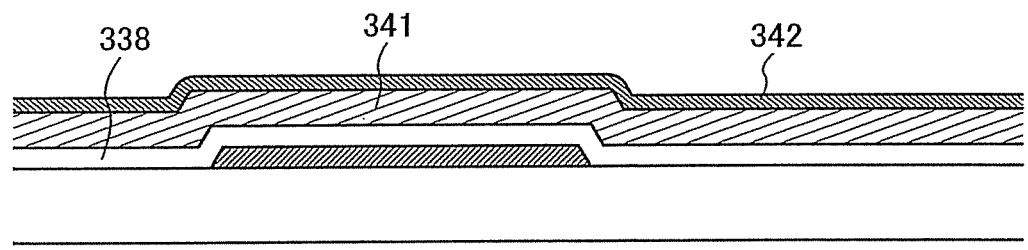
Figure 16C:
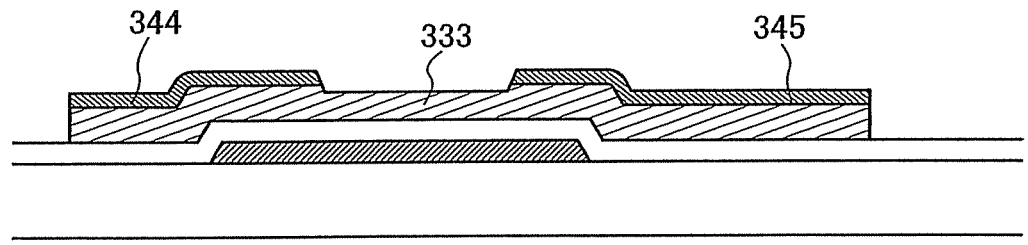

First, by the same process as that of Embodiment Mode or Embodiment 1, a gate electrode and gate wiring 332 is formed over a substrate 330 (see FIG. 16A), and a gate insulating film 338, an amorphous semiconductor film 341, and a semiconductor film 342 containing an impurity imparting one conductivity type are formed thereover (see FIG. 16B).

Next, a photolithography process is performed, a resist mask is formed, the amorphous semiconductor film 341 and the semiconductor film 342 containing impurity imparting one conductivity type are etched, the semiconductor film 342 containing impurity imparting one conductivity type is separated into a source region 344 and a drain region 345, and an island-shaped semiconductor film 333 including a channel formation region is formed from the amorphous semiconductor film 341.

Figure 16D:
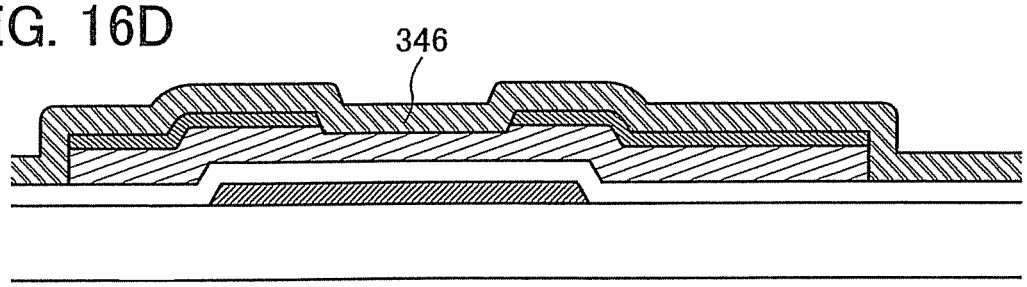

Subsequently, a conductive film 346 is formed over the gate insulating film 338, the island-shaped semiconductor film 333, and the source region 344 and the drain region 345 (see FIG. 16D). The conductive film 346 may be formed in the same way as a conductive film for forming the source electrode and source wiring 104 the drain electrode 105, and the conductive film 323.

Figure 17A:
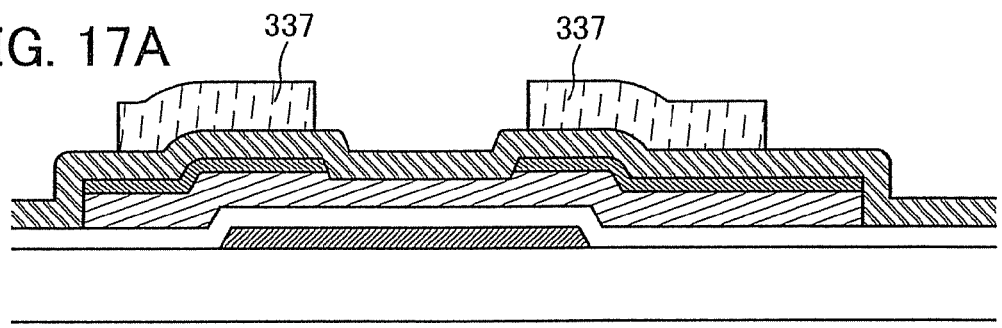
FIGS. 17A to 17D are cross-sectional views each showing a manufacturing method of a liquid crystal display device according to the present invention.

Next, a photolithography process is performed, a resist mask 337 is formed, and the conductive film 346 is etched (see FIG. 17A). By this etching, a source electrode and source wiring 334, and a drain electrode 335 are formed from the conductive film 346 (see FIG. 17B).

Figure 17B:
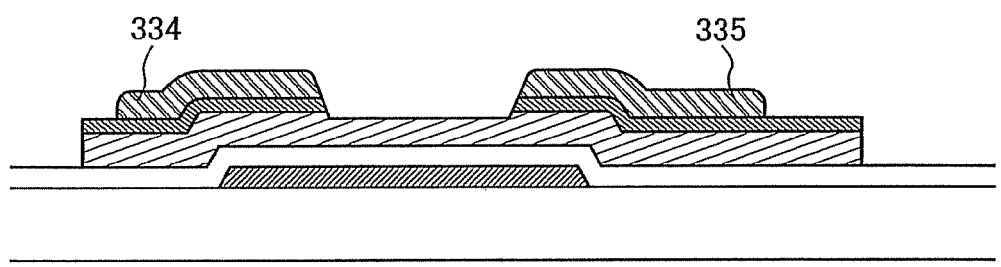
Figure 17C:
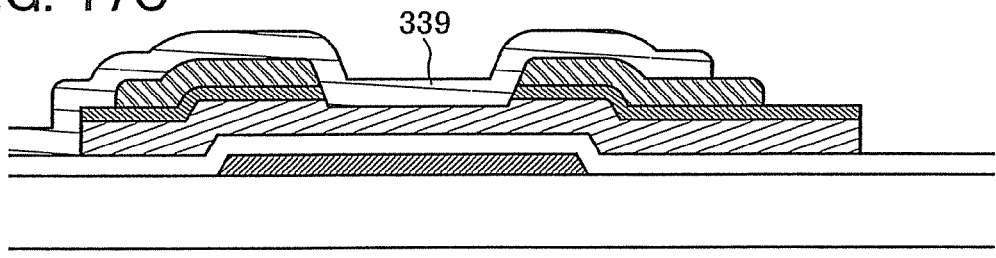

In FIG. 17B, an edge of the source electrode and source wiring 334 is formed so as to be positioned inside an edge of the source region 344. Also, an edge of the drain electrode 335 is formed so as to be positioned inside an edge of the drain region 345. In particular, by forming the drain region 345 so that the edge thereof is closer to inside an opening than the edge of the drain electrode 335 is, a bump can be reduced in a manufacturing process of a pixel electrode 336 which is described later, which is effective.

Furthermore, a protective film 339 is formed of the same material and formed by the same process as those of the protective film 109 or the protective film 309. As described in Embodiment Mode or Embodiment 1, an insulating film formed from a protective film material is etched by a photolithography process, thereby forming the protective film 339 (see FIG. 17C).

The protective film 339 is formed so that an edge thereof is positioned inside an edge of the drain electrode 335, and accordingly, the drain electrode 335 is exposed.

Figure 17D:
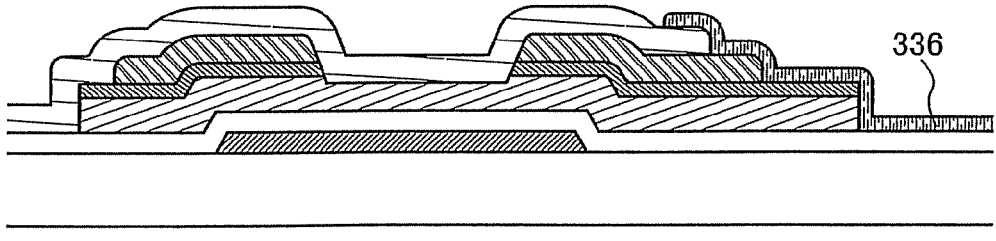

Subsequently, the pixel electrode 336 is formed over the protective film 339, a region where the drain electrode 335 is exposed, and the gate insulating film 338 (see FIG. 17D). Since the edge of the protective film 339, the edge of the drain electrode 335, and the drain region 345 are not positioned in the same place and are positioned in separate places apart from each other, a bump of the pixel electrode 336 is reduced, coverage is improved, and disconnection is not easily generated.

Figure 19A:
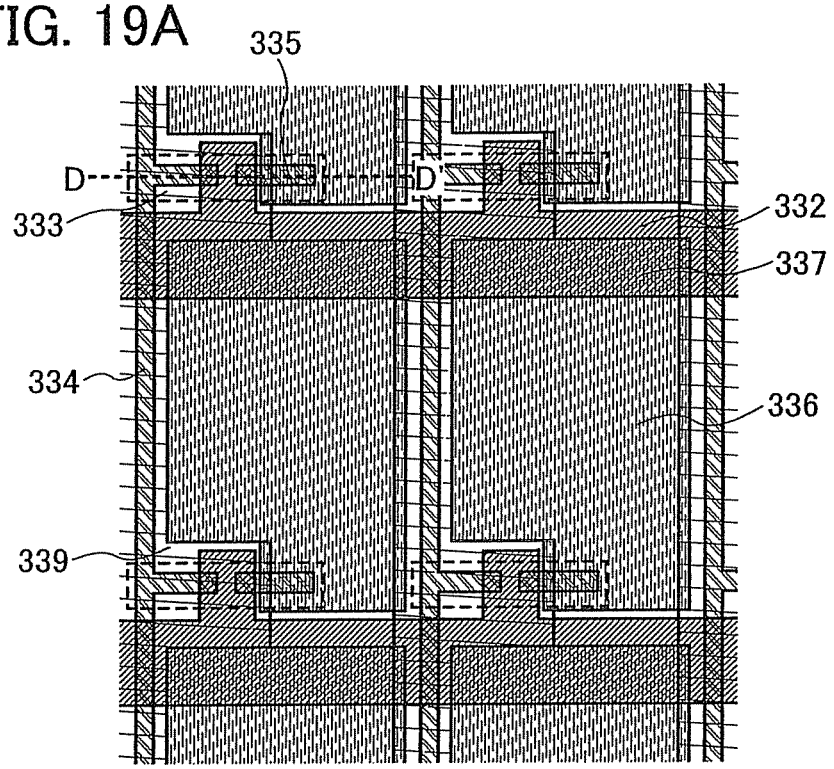
FIGS. 19A and 19B are top views each showing a manufacturing method of a liquid crystal display device according to the present invention.
Figure 19B:
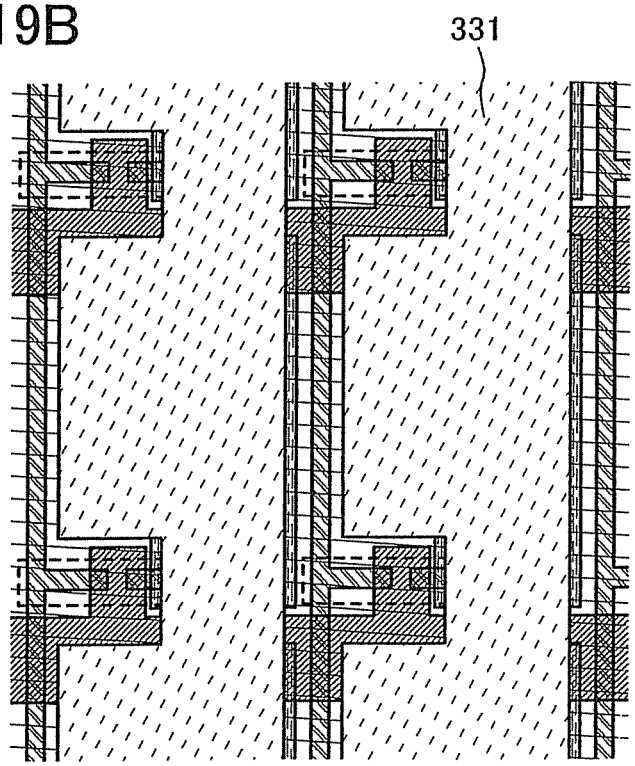

A top view of a pixel of the liquid crystal display device manufactured as described above is shown in each of FIGS. 19A and 19B. A cross-section shown by a line D-D' in FIG. 19A corresponds to FIG. 17B. FIG. 19A is an actual top view of a pixel, and FIG. 19B is a view in which a position of an opening 331 is emphasized.

In this embodiment, in addition to the effect described in Embodiment 1, since the edge of the protective film 339, the edge of the drain electrode 335, and the drain region 345 are placed in different places apart from each other, a bump of the pixel electrode 336 can be reduced, coverage can be improved, and disconnection can be prevented.

It is to be noted that this embodiment can be combined with all structures of or part of the structure of Embodiment Mode and Embodiment 1, if necessary.

[Embodiment 3]

In this embodiment, an example of preventing a drain electrode from being damaged when a protective film is formed by etching an insulating film formed from a protective film material by forming the drain electrode as a stacked film will be explained with reference to FIGS. 20A to 20E and FIGS. 21A to 21E.

In Embodiment Mode, an insulating film formed from a protective film material is etched by dry etching by a fourth photolithography process. A drain electrode 105 formed under the insulating film can be terribly damaged when the drain electrode 105 is exposed, depending on a manufacturing condition such as a kind of etching gas, reaction pressure, a substrate temperature, or high frequency.

If the drain electrode 105 is damaged, electrical connection between the drain electrode 105 and a pixel electrode 106 may be adversely affected.

Therefore, in this embodiment, by forming a drain electrode of a stacked film including a plurality of layers, the drain electrode can be prevented from being damaged.

First, based on the description in Embodiment Mode, the structure shown up to FIG. 7B is formed. It is to be noted that, in this embodiment, a portion which is not expressly described follows the description in Embodiment Mode and Embodiments 1 and 2.

Next, a first conductive film is formed over a gate insulating film 108 and an island-shaped semiconductor film 103 including an island-shaped amorphous semiconductor film 103a and an island-shaped semiconductor film containing an impurity 103b, and a second conductive film is formed thereover.

As a combination of the first conductive film and the second conductive film, a stacked film of a film containing chromium (Cr) and a film containing aluminum (Al), a stacked film of a film containing chromium (Cr) and a film containing aluminum containing neodymium (Al—Nd), or the like can be given.

Next, a photoresist process is performed, a resist mask is formed, the first conductive film and the second conductive film are etched, and the first conductive film becomes a lower-layer source electrode and source wiring 401 and a lower-layer drain electrode 402. The second conductive film becomes an upper-layer source electrode and source wiring 403 and an electrode 404 (see FIG. 20A).

Then, as in Embodiment Mode, parts of the island-shaped amorphous semiconductor film 103a and the island-shaped semiconductor film containing an impurity 103b are removed by dry etching by using the lower-layer source electrode and source wiring 401, the upper layer source electrode and source wiring 403, the lower-layer drain electrode 402, and the electrode 404 as masks, thereby dividing the island-shaped semiconductor film containing an impurity 103b into a source region 204 and a drain region 205. By this etching, the island-shaped amorphous semiconductor film 103a is etched in a self-alignment manner and becomes an island-shaped semiconductor film 203 including a channel formation region 206 (see FIG. 20B).

Figure 20A:
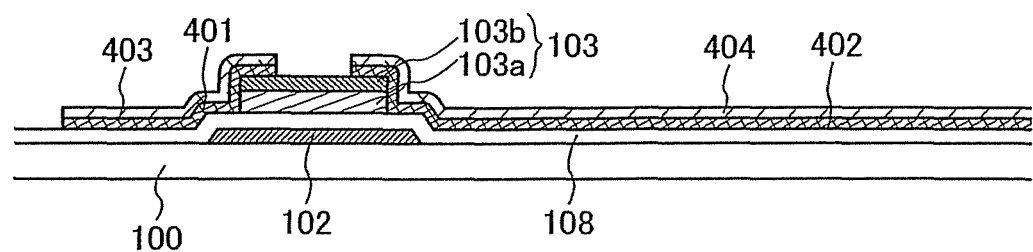
FIGS. 20A to 20E are cross-sectional views each showing a manufacturing method of a liquid crystal display device according to the present invention.
Figure 20B:
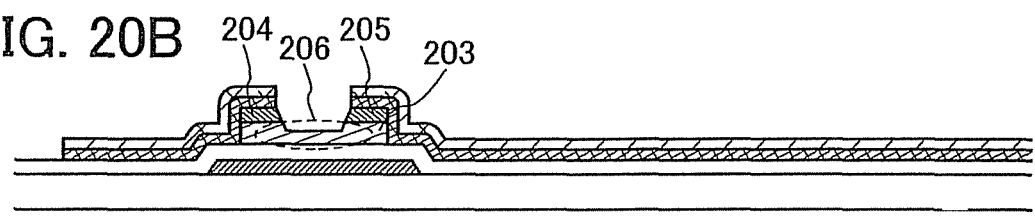
Figure 20C:
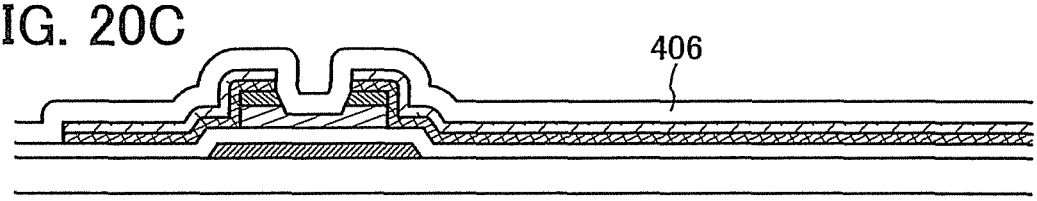
Figure 20D:
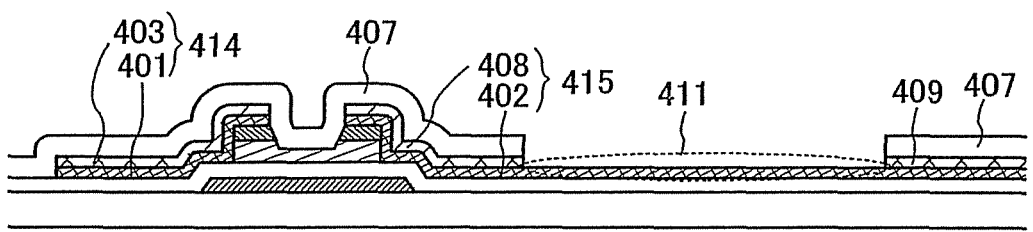

Next, an insulating film 406 formed from an inorganic material is formed covering an entire surface of the substrate (see FIG. 20C).

The insulating film 406 formed from an inorganic material is formed of a silicon nitride film, a silicon nitride film containing oxygen, a silicon oxide film containing nitrogen, a silicon oxide film, or a stacked film in which these films are combined to have a thickness of 200 to 450 nm. In this embodiment, a silicon nitride film is formed using $SiH_4$ and $NH_3$ as material gas by plasma CVD.

Thereafter, a resist mask is formed by a photolithography process, and the insulating film 406 formed from an inorganic material is etched by dry etching, thereby forming a protective film 407. The protective film 407 covers a TFT; however, an opening 411 of a pixel portion is exposed because the insulating film formed from an inorganic material is removed by a dry etching process (see FIG. 20D).

In etching the insulating film by dry etching here, by deliberately removing the electrode 404 formed over the lower-layer drain electrode 402 with the insulating film 406 by etching, the lower-layer electrode 402 is exposed in the opening 411. In addition, the electrode 404 is divided into an upper-layer drain electrode 408 and an electrode 409.

Consequently, the lower-layer source electrode and source wiring 401 and the upper-layer source electrode and source wiring 403 constitute the source electrode and source wiring 414, and the lower-layer drain electrode 402 and the upper-layer drain electrode 408 constitute the drain electrode 415.

Figure 20E:
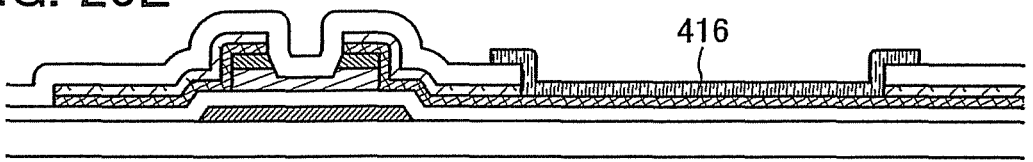

Next, a transparent conductive film 407 is formed over the protective film 407 and the lower-layer drain electrode 402 exposed in the opening 411 and is etched, thereby forming a pixel electrode 416 (see FIG. 20E). If the transparent conductive film is formed from oxide such as indium tin oxide (ITO), the oxide contains large amount of oxygen; therefore, if the transparent conductive film is in contact with a film containing aluminum, deterioration of electrical or physical connection with aluminum (Al) or deterioration of reliability due to erosion after formation may occur. The second conductive film for forming the lower-layer drain electrode 402 is an aluminum film or a film containing aluminum. Therefore, when the insulating film 406 is etched for forming the protective film 407, by etching the electrode 404 as well, which becomes the upper-layer drain electrode 408, connection between aluminum (Al) and the transparent conductive film can be avoided.

FIGS. 21A to 21E show examples in which a drain electrode is formed of three stacked films.

First, based on the description in Embodiment Mode, the structure shown up to FIG. 7B is formed.

Subsequently, a third conductive film, a fourth conductive film, and a fifth conductive film are sequentially formed over a gate insulating film 108 and an island-shaped semiconductor film 103 including an island-shaped amorphous semiconductor film 103a and an island-shaped semiconductor film containing an impurity 103b.

As an example of a material for the third conducive film and the fifth conductive film, a heat-resistant conductive material film such as molybdenum (Mo) is given, and as an example of a material for the fourth conductive material film, a pure aluminum (Al) film or an aluminum (Al) film containing other elements such as aluminum containing neodymium (Al—Nd) film is given.

Next, a photoresist process is performed, a resist mask is formed, and the third conductive film, the fourth conductive film, and the fifth conductive film are etched. Third conductive film is a lower-layer source electrode and source wiring 431 and a lower-layer drain electrode 432. The fourth conductive film is a middle-layer source electrode and source wiring 433, and a middle-layer drain electrode 434. The fifth conductive film is an upper-layer source electrode and source wiring 435 and an upper-layer drain electrode 436 (see FIG. 21A). It is to be noted that the lower-layer source electrode and source wiring 431, the middle-layer source electrode and source wiring 433, and the upper-layer source electrode and source wiring 435 constitute a source electrode and source wiring 454, and the lower-drain electrode 432, the middle-layer drain electrode 434, and the upper-layer drain electrode 436 constitute a drain electrode 455.

Subsequently, as in Embodiment Mode, the island-shaped amorphous semiconductor film 103a and the island-shaped semiconductor film containing an impurity 103b are partially removed by dry etching by using the source electrode and source wiring 454 and the drain electrode 455 as masks, thereby dividing the island-shaped semiconductor film containing an impurity 103b into a source region 204 and a drain region 205. In addition, by this etching, the island-shaped amorphous semiconductor film 103a is etched in a self-alignment manner and becomes an island-shaped semiconductor film 203 including a channel formation region 206 (see FIG. 21B).

Next, an insulating film 439 formed from an inorganic material is formed covering an entire surface of a substrate (see FIG. 21C). It is to be noted that the insulating film 439 may be formed of the same material and formed by the same process as those of the insulating film 406.

Thereafter, a resist mask is formed by a photolithography process, and the insulating film 439 formed from an inorganic material is etched by dry etching, thereby forming a protective film 437. The protective film 437 covers a TFT; however, an opening 441 of a pixel portion is exposed because the insulating film formed from an inorganic material is removed by a dry etching process (see FIG. 21D).

When the insulating film 439 is etched, the drain electrode 455 might be damaged. However, there is an advantage that the lower-layer drain electrode 432 formed from a heat-resistant conductive material is not damaged because the upper-layer drain electrode 436 and the middle-layer drain electrode 434 exist. In other words, by three-layered drain electrode, influence by reduction in film due to etching can be suppressed.

Then, a transparent conductive film is formed over the protective film 437 and the upper-layer drain electrode 436 exposed in the opening 441, and is etched, thereby forming a pixel electrode 446 (see FIG. 21E).

In FIG. 21E, even if the pixel electrode contains oxide such as indium tin oxide (ITO), connection between aluminum (Al) and the transparent conductive film can be avoided because the upper-layer drain electrode 436 formed of a heat-resistant conductive material film exists over the middle-layer drain electrode 434 containing aluminum.

In this embodiment, in addition to the effect described in Embodiment 1, an effect of further suppressing damage to the drain electrode when etching the insulating film formed of a protective film material is obtained.

It is to be noted that this embodiment can be combined with all structures of or part of the structure of Embodiment Mode and Embodiments 1 and 2, if necessary.

[Embodiment 4]

Although a transmissive liquid crystal display device and a manufacturing method thereof are explained in Embodiment Mode and Embodiments 1 to 3, a semi-transmissive liquid crystal display device or a micro-transmissive liquid crystal display device will be explained with reference to FIGS. 22A and 22B and FIGS. 23A and 23B in this embodiment.

When either a semi-transmissive liquid crystal display device or a micro-transmissive liquid crystal display device is manufactured, after the transmissive TFT substrate described in Embodiment Mode and Embodiments 1 to 3 is formed, a reflective electrode is formed using a metal film with high reflectivity such as aluminum (Al), silver (Ag), or chromium (Cr) so that at least part of the reflective electrode overlaps with a transparent pixel electrode and is electrically in contact therewith.

A portion where the reflective electrode is formed becomes a reflective electrode region, and an opening, which is other portion, becomes a transmissive region. By making an area ratio of the reflective region almost equal to that of the transmissive region, a semi-transmissive liquid crystal display device can be manufactured. By making the area ratio of the reflective region smaller than that of the transmissive region, a micro-transmissive liquid crystal display device can be manufactured.

If the transmissive liquid crystal display device described in Embodiment Mode and Embodiments 1 to 3 is a total transmissive liquid crystal display device, light of backlight is transmitted in the total transmissive liquid crystal display device, thereby displaying an image. On the other hand, a micro-transmissive liquid crystal display device or a semi-transmissive liquid crystal display device has a reflective electrode; therefore, external light can be used and power consumption can be suppressed.

Figure 22A:
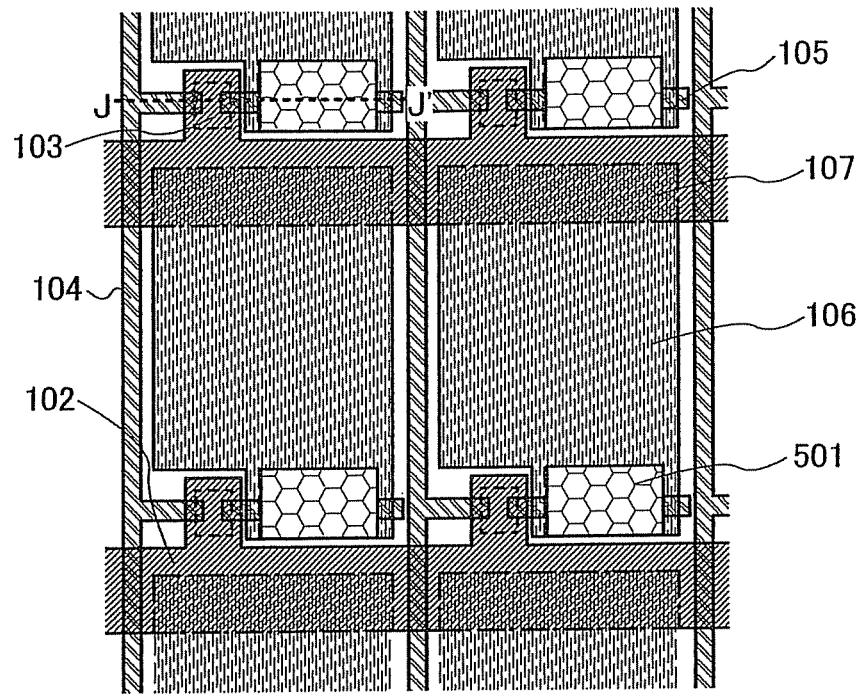
FIGS. 22A and 22B are top views each showing a manufacturing method of a liquid crystal display device according to the present invention.

FIG. 22A shows a structure of a liquid crystal display device in which a reflective electrode 501 is formed in the liquid crystal display device in FIG. 1B in Embodiment Mode. It is to be noted that a protective film 109 is omitted for better viewing of the drawings. The area of the reflective electrode 501 is much smaller than that of a pixel electrode 106 which is a transparent electrode, and a reflective region is smaller than a transmissive region. Therefore, a liquid crystal display device having a pixel structure shown in FIG. 22A is a micro-transmissive liquid crystal display device.

Figure 22B:
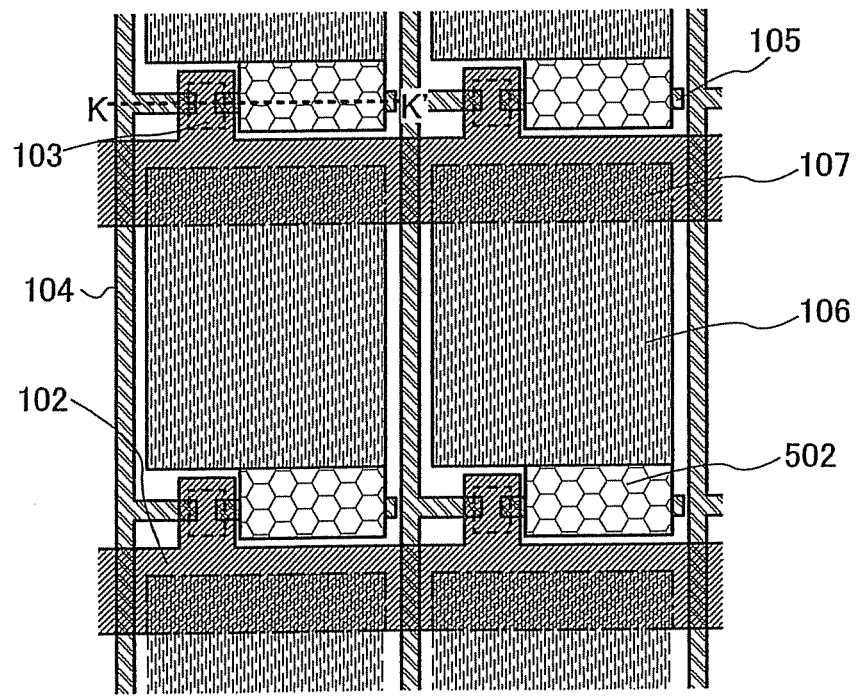

Also, FIG. 22B shows a structure of a liquid crystal display device in which a reflective electrode 501 is formed in the liquid crystal display device in FIG. 1B in Embodiment Mode. The area of a reflective electrode 502 is much smaller than that of a pixel electrode 106. The liquid crystal display device shown in FIG. 22B is a micro-transmissive liquid crystal display device.

Figure 24A:
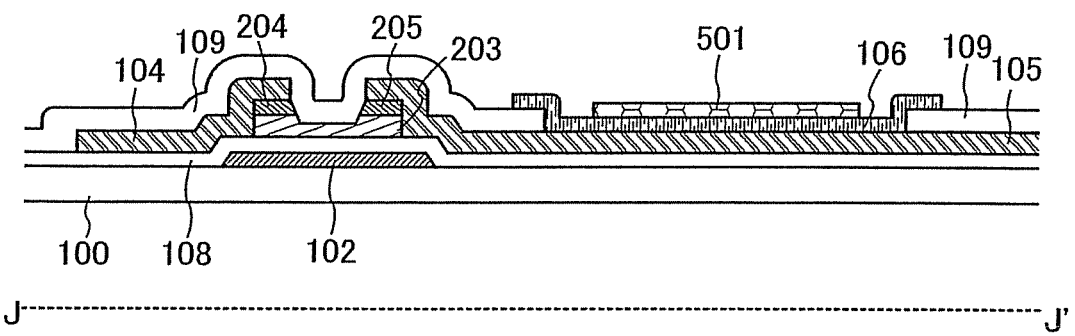
FIGS. 24A and 24B are cross-sectional views each showing a manufacturing method of a liquid crystal display device according to the present invention.
Figure 24B:
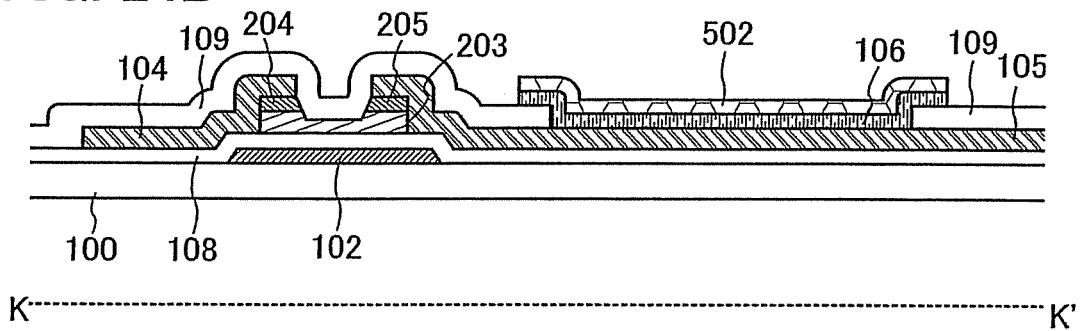

A cross-sectional view taken along a line J-J' of the pixel in the liquid crystal display device of FIG. 22A is shown in FIG. 24A, and a cross-sectional view taken along a line K-K' of the pixel in the liquid crystal display device of FIG. 22B is shown in FIG. 24B.

The reflective electrode 501 of FIG. 22A is formed so that edges thereof are positioned inside edges of the pixel electrode 106. On the other hand, in the liquid crystal display device of FIG. 22B, the reflective electrode 502 is positioned so that the edges thereof are positioned at the same place as edges of the pixel electrode 106.

Figure 23A:
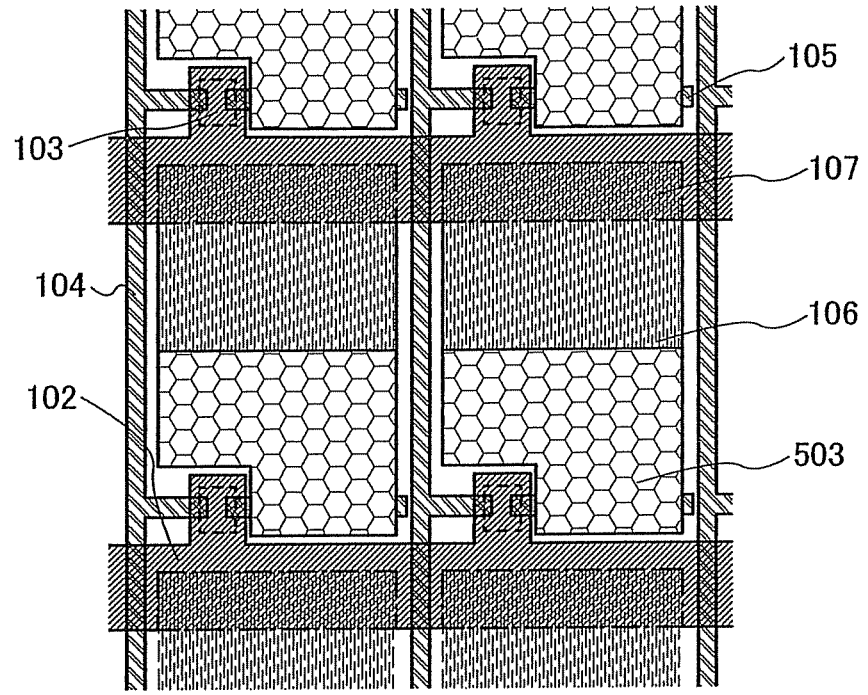
FIGS. 23A and 23B are top views each showing a manufacturing method of a liquid crystal display device according to the present invention.

FIG. 23A shows a structure of a liquid crystal display device in which a reflective electrode 503 is formed in the liquid crystal display device in FIG. 1B in Embodiment Mode. The reflective electrode 503 is formed so that an area thereof is almost half of an area of a pixel electrode 106 which is a transparent electrode. In other words, an area of a reflective portion and an area of a transmissive portion are almost equal; therefore, a liquid crystal display device having a pixel structure shown in FIG. 23A is a semi-transmissive liquid crystal display device.

Figure 23B:
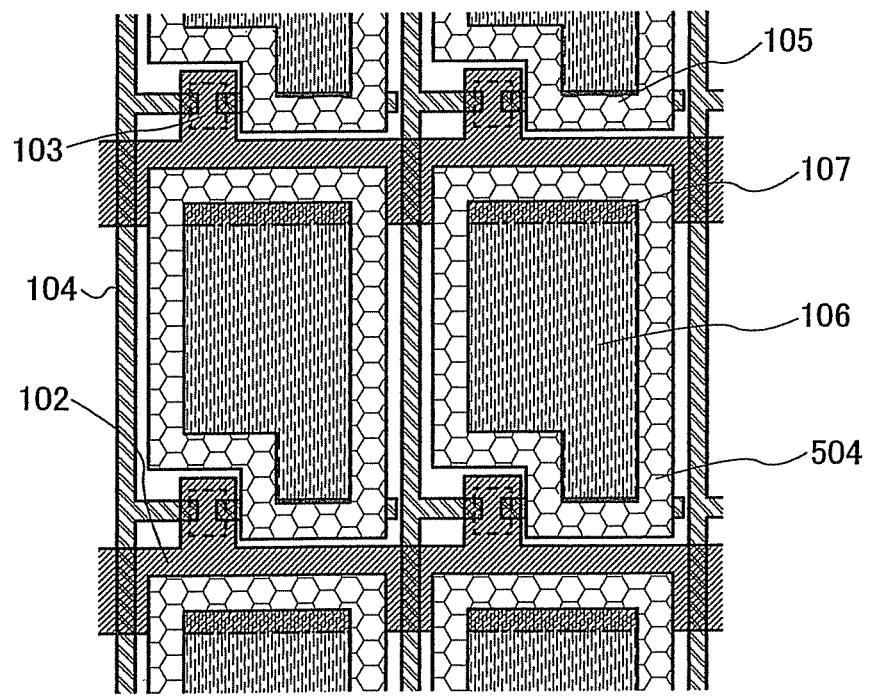

FIG. 23B shows another example of a semi-transmissive liquid crystal display device. A reflective electrode 504 is Mimed so as to trace outer circumference of a pixel electrode 106 along a rim of the pixel electrode 106. Since the area of a transmissive region and the area of a reflective region are the same in this shape, a liquid crystal display device which is more easily viewable can be obtained.

That is to say, in this embodiment, in addition to the effect described in Embodiment 1, advantages that external light can be used and power consumption can be suppressed are obtained.

It is to be noted that this embodiment can be combined with all structures of or part of the structure of Embodiment Mode and Embodiments 1 to 3, if necessary.

[Embodiment 5]

In this embodiment, a connection method between a wiring formed of a gate wiring material and a wiring formed of a source wiring material in a region other than a pixel portion, for example, a periphery portion will be explained with reference to FIGS. 25A to 25E, FIGS. 26A to 26C, and FIG. 27. It is to be noted that a portion which is not expressly explained follows the description of Embodiment Mode.

Figure 26A:
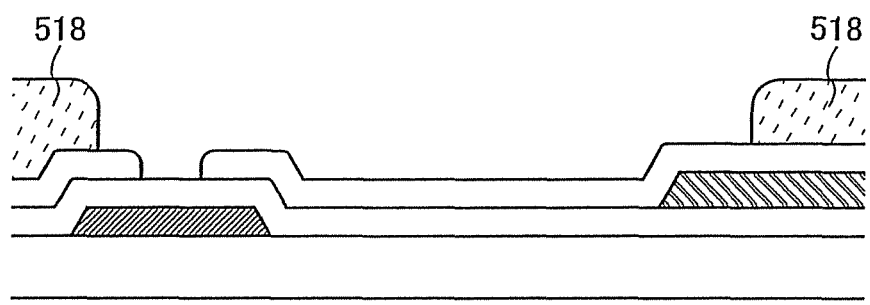
FIGS. 26A to 26C are cross-sectional views each showing a manufacturing method of a liquid crystal display device according to the present invention.
Figure 26B:
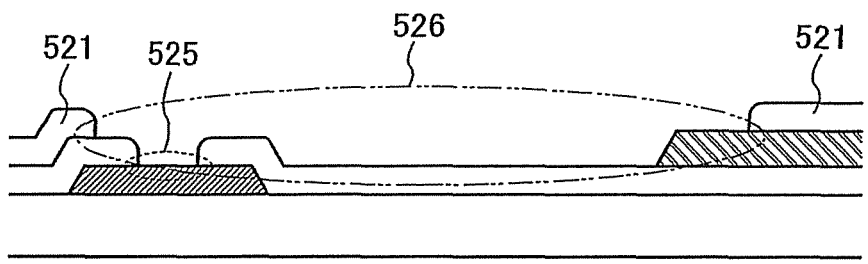
Figure 26C:
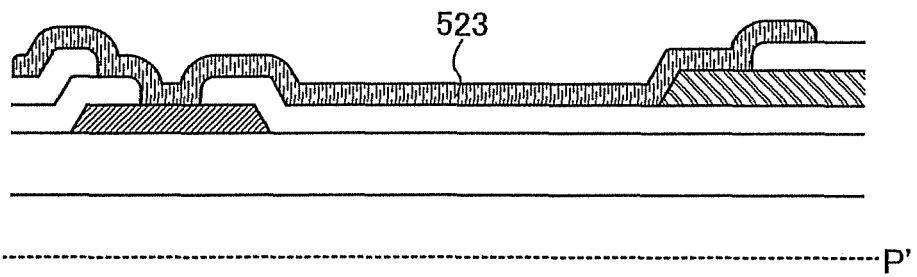
Figure 27:
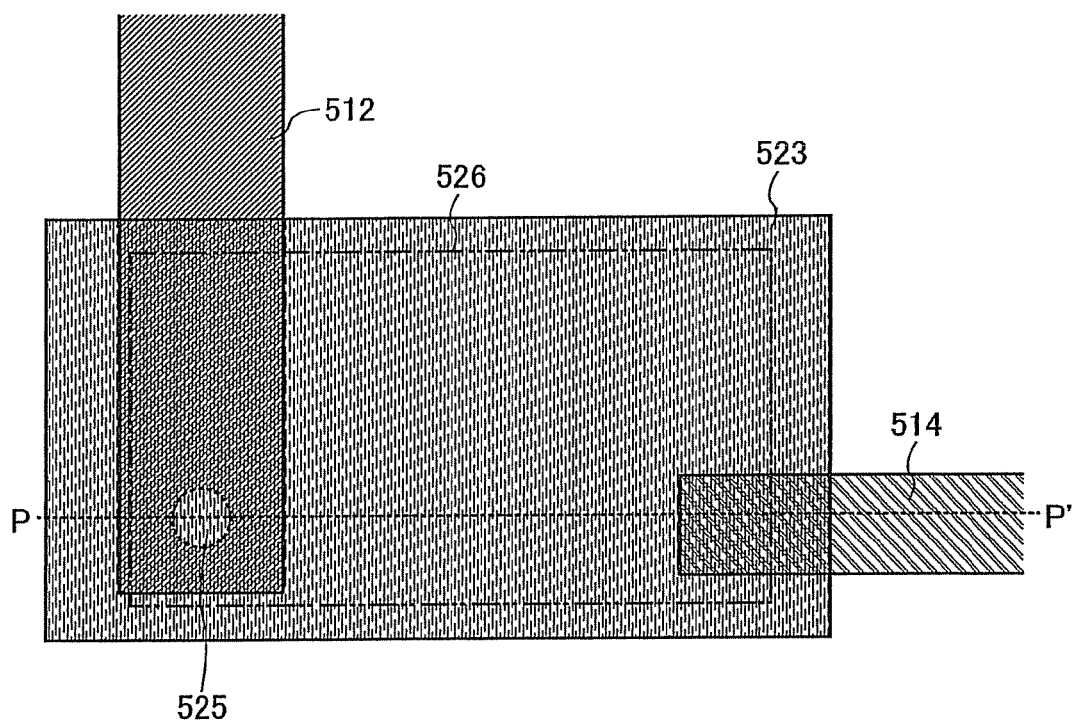
FIG. 27 is a top view showing a manufacturing method of a liquid crystal display device according to the present invention.

FIG. 27 is a top view which shows a connection structure between a wiring formed of a gate wiring material and a wiring formed of a source wiring material. FIGS. 25A to 25E and FIGS. 26A to 26C are cross-sectional views each showing a step for forming the connection structure shown in the cross-sectional view of FIG. 27 which is a top view. FIG. 26C is a cross-sectional view of a portion taken along a line P-P' of FIG. 27.

In FIG. 27, a wiring 512 formed of a gate wiring material and a wiring 514 formed of a source wiring material are connected to each other through a conductive film 523 formed of a transparent conductive material.

Figure 25A:
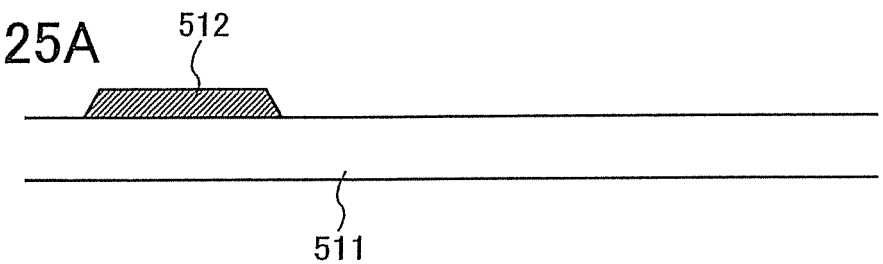
FIGS. 25A to 25E are cross-sectional views each showing a manufacturing method of a liquid crystal display device according to the present invention.

First, as shown in FIG. 25A, based on the method described in Embodiment Mode, the wiring 512 formed of a gate wiring material is formed over a substrate 511. Thereafter, as shown in FIG. 25B, a gate insulating film 513 is formed over an entire surface of the substrate 511.

Figure 25B:
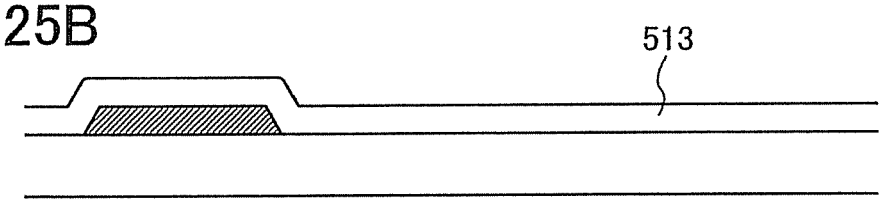
Figure 25C:
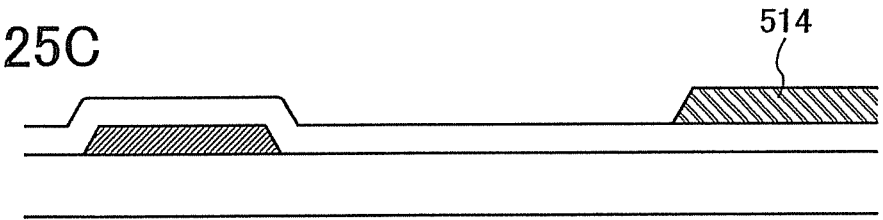
Figure 25D:
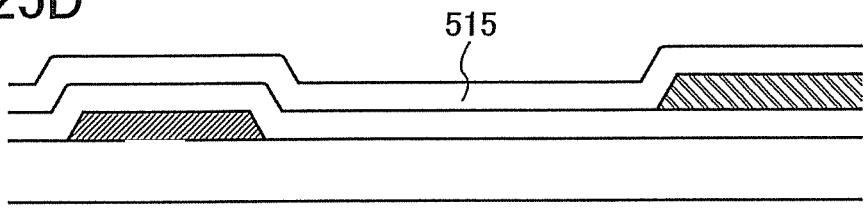

Next, as shown in FIG. 25B, based on the method described in Embodiment Mode, the wiring 514 formed of a source wiring material is formed. Then, as shown in FIG. 25D, a protective film 515 is formed over the gate insulating film 513 and the wiring 514.

Figure 25E:
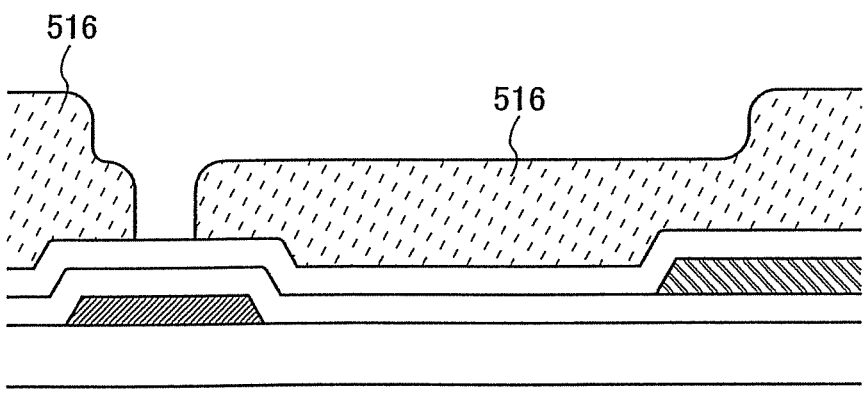

Then, in the fourth photolithography process described in Embodiment Mode, by using a halftone exposure technique with the use of a halftone mask, a resist mask 516 with bumps is formed (see FIG. 25E). By etching with the resist mask 516, a contact hole 525 is formed in an insulating film directly above the wiring 512 formed of a gate wiring material as shown in FIG. 26A. However, the insulating film in which the contact hole is formed is preferably only the protective film 515, and etching is performed so that the gate insulating film remains. The protective film 515 becomes a protective film 517 in which the contact hole 525 is formed.

Next, as shown in FIG. 26A, the resist mask 516 is partially removed by ashing treatment using oxygen in a radical state, thereby deforming the resist mask 516 like a resist mask 518.

A protective film 521 is formed by etching the protective film 517 again using the deformed resist mask 518. As shown in FIG. 26B, by this etching, the contact hole 525 over the wiring 512 formed of a gate wiring material is formed, and an opening 526 including the contact hole 525 over the wiring 512 formed of a gate wiring material and part of the wiring 514 formed of a source wiring material is formed.

Although the contact hole 525 is formed so that the width thereof is narrower than that of the wiring 512 formed of a gate wiring material in this embodiment, a wide contact hole including both edges of the wiring 512 formed of a gate wiring material may be formed.

Subsequently, as shown in FIG. 26C, by forming a conductive film 523 formed of a transparent conductive material over the contact hole 525 and the opening 526, the wiring 512 formed of a gate wiring material and the wiring 514 formed of a source wiring material can be connected through the conductive film 523 formed of a transparent conductive material.

The above wiring 512 formed of a gate wiring material in the periphery has the same structure and the same material as those of the gate electrode and gate wiring 102 in the pixel described in Embodiment Mode. The gate insulating film 513 has the same structure and the same material as those of the gate insulating film 108 in a pixel portion. In addition, the wiring 514 formed of a source wiring material has the same structure and the same material as those of the source electrode and wiring 104 and the drain electrode 105 in the pixel portion. Moreover, the protective film 521 and the conductive film 523 formed of a transparent conductive material have the same structure and the same material as those of the protective film 109 and the pixel electrode 106 in the pixel portion, respectively.

Therefore, the wiring in the periphery can also be formed by the same method as the pixel portion and concurrently with the pixel portion. Accordingly, a TFT substrate can be manufactured without increasing the number of masks.

In this embodiment, an advantage that the peripheral wiring can be formed without increasing the number of masks can be obtained as well as the effect described in Embodiment Mode.

It is to be noted that this embodiment can be combined with all structures of or part of the structure of Embodiment Mode and Embodiments 1 to 4, if necessary.

[Embodiment 6]

In this embodiment, a liquid crystal display device of an IPS (In-Plane Switching) mode will be explained with reference to FIG. 28 and FIGS. 29A to 29C.

Figure 28:
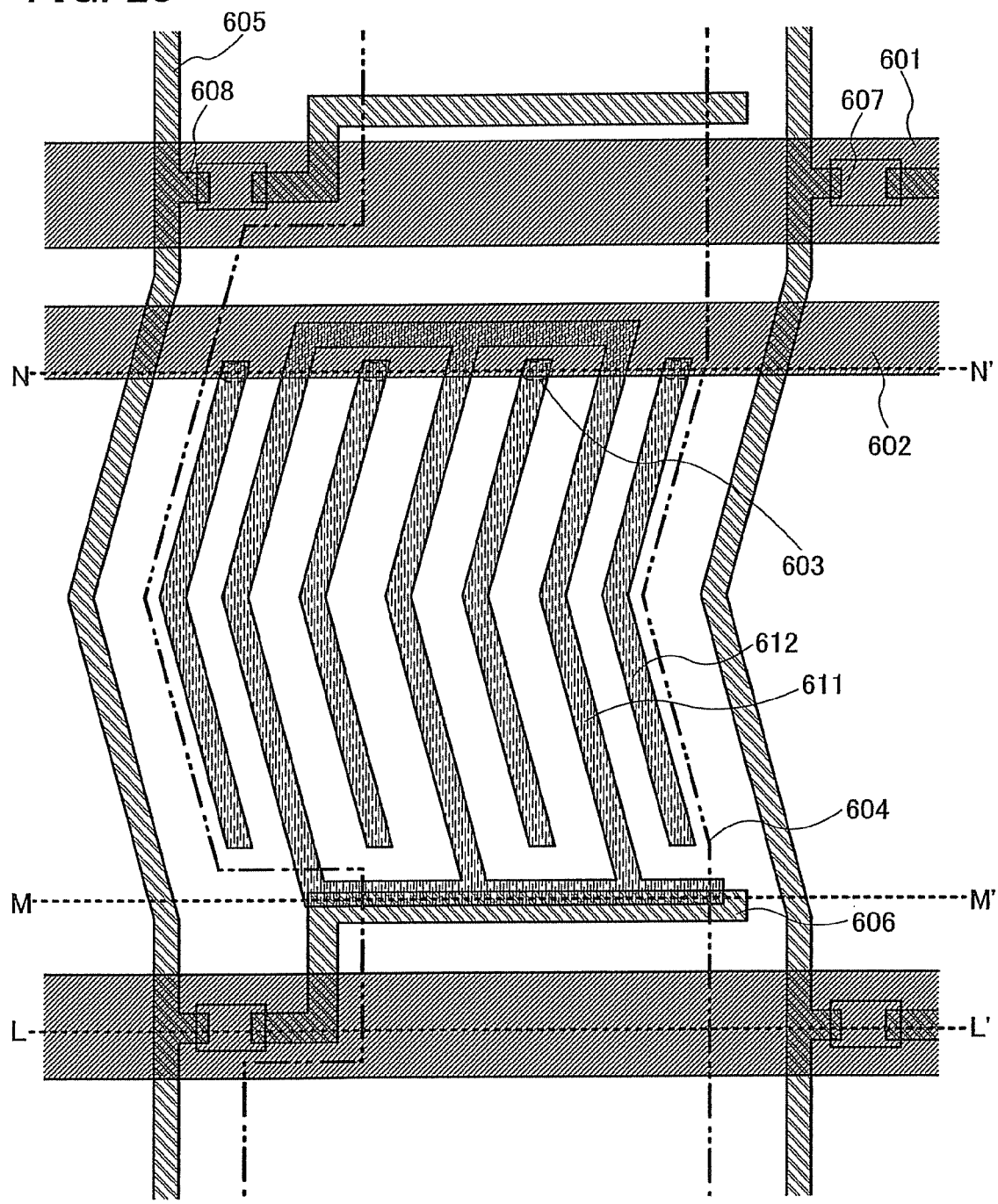
FIG. 28 is a top view of a pixel in a liquid crystal display device according to the present invention.

FIG. 28 is a top view showing one arbitrary pixel in a liquid crystal display device of an IPS mode of this embodiment. In addition, FIGS. 29A, 29B, and 29C are cross-sectional views taken along a line L-L', a line M-M', and a line N-N' of FIG. 28, respectively.

In FIG. 28 and FIGS. 29A to 29C, a gate wiring 601 and a common wiring 602 are formed over a substrate 600. The gate wiring 601 and the common wiring 602 are formed of the same material, the same layer, and by the same process. A gate insulating film 614 is formed over the gate wiring 601 and the common wiring 602.

It is to be noted that the substrate 600 may be formed of the same material as the substrate 100 described in Embodiment Mode. The gate wiring 601 and the common wiring 602 may be formed of the same material and by the same manufacturing process as those of the gate electrode and gate wiring 102 in Embodiment Mode. Moreover, the gate insulating film 614 may be formed of the same material and by the same manufacturing process as those of the gate insulating film 108 in Embodiment Mode.

Figure 29A:
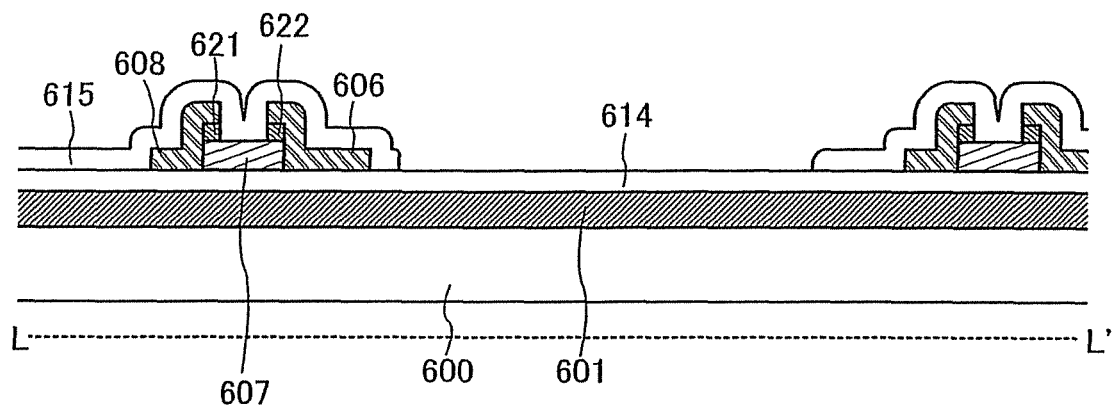
FIGS. 29A to 29C are cross-sectional views each showing a manufacturing method of a liquid crystal display device according to the present invention.
Figure 29B:
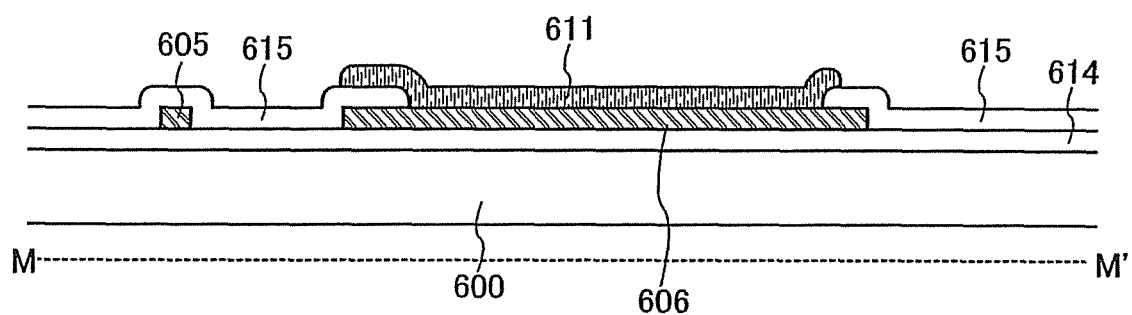
Figure 29C:
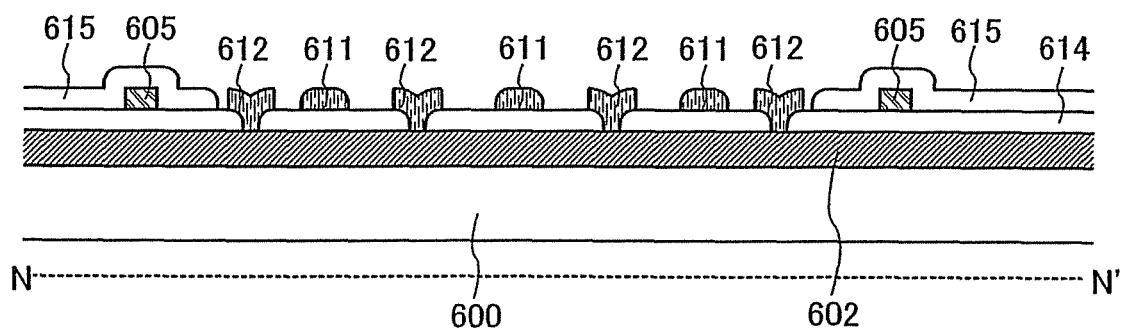

A TFT which becomes a switching element of the pixel has the gate wiring 601, the gate insulating film 614, an island-shaped semiconductor film 607, a source region 621, a drain region 622, a source electrode 608, and a drain electrode 606 (see FIG. 29A).

It is to be noted that island-shaped semiconductor film 607, the source region 621, and the drain region 622 of the TFT may be formed based on the formation method of the island-shaped semiconductor film 203, the source region 204, and the drain region 205 in Embodiment Mode, respectively.

Although the source electrode 608 and a source wiring 605 are separated for the sake of convenience, they are formed of the same conductive film and connected to each other. In addition, the drain electrode 606 is also formed of the same material and formed by the same process as those of the source electrode 608 and the source wiring 605.

A protective film 615 may be formed of the same material and by the same process as those of the protective film 109 described in Embodiment Mode. In addition, the protective film 615 is removed in an opening 604 shown by alternate long and two short dashes line, and an insulating film formed in the opening 604 is only the gate insulating film 614.

The drain electrode 606 and a pixel electrode 611 are electrically connected to each other by being in contact with each other in the opening 604 (see FIG. 29B).

The source electrode 608 and the source wiring 605 may be formed of the same material and by the same process as those of the source electrode and source wiring 104 in Embodiment Mode. The drain electrode 606 may be formed of the same material and by the same process as those of the drain electrode 105 in Embodiment Mode.

The pixel electrode 611 and each of a plurality of common electrodes 612 are formed of the same material and by the same process. The common electrode 612 is electrically connected to the common wiring 602 through a contact hole 603 in the gate insulating film 614 (see FIG. 29C).

It is to be noted that the pixel electrode 611 and the common electrode 612 are formed of the same material and formed by the same manufacturing process as those of the pixel electrode 106 described in Embodiment Mode.

A lateral electric field parallel to the substrate 600 is generated between the pixel electrode 611 and the common electrode 612, and a liquid crystal is controlled.

Since liquid crystal molecules do not stand up obliquely in the liquid crystal display device of the IPS mode, there are few changes in an optical characteristic of an angle, and a wide viewing characteristic can be obtained. In this embodiment, in addition to the effect described in Embodiment 1, there is an advantage that the wide viewing characteristic can be obtained.

It is to be noted that this embodiment can be combined with all structures of or part of the structure of Embodiment Mode and Embodiments 1 to 5, if necessary.

[Embodiment 7]

In this embodiment, a liquid crystal display device of an MVA (Multi-domain Vertically Aligned) mode will be explained with reference to FIG. 30, FIGS. 31A and 31B, and FIGS. 32A and 32B.

Figure 30:
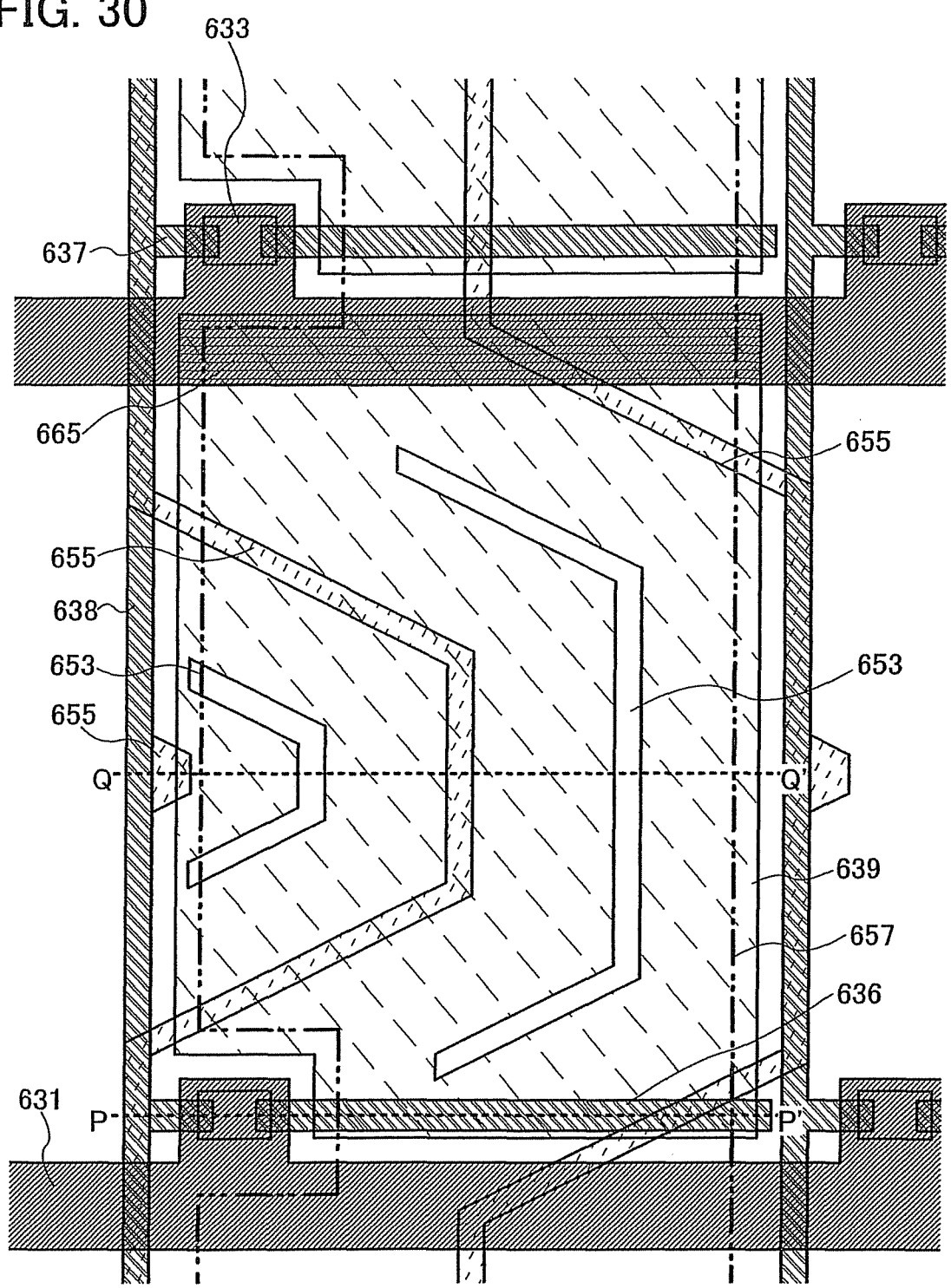
FIG. 30 is a top view of a pixel in a liquid crystal display device according to the present invention.

FIG. 30 is a top view showing one arbitrary pixel in a liquid crystal display device of an MVA mode of this embodiment. In addition, FIGS. 31A and 31B are cross-sectional views taken along a line P-P' and a line Q-Q', respectively.

Figure 31A:
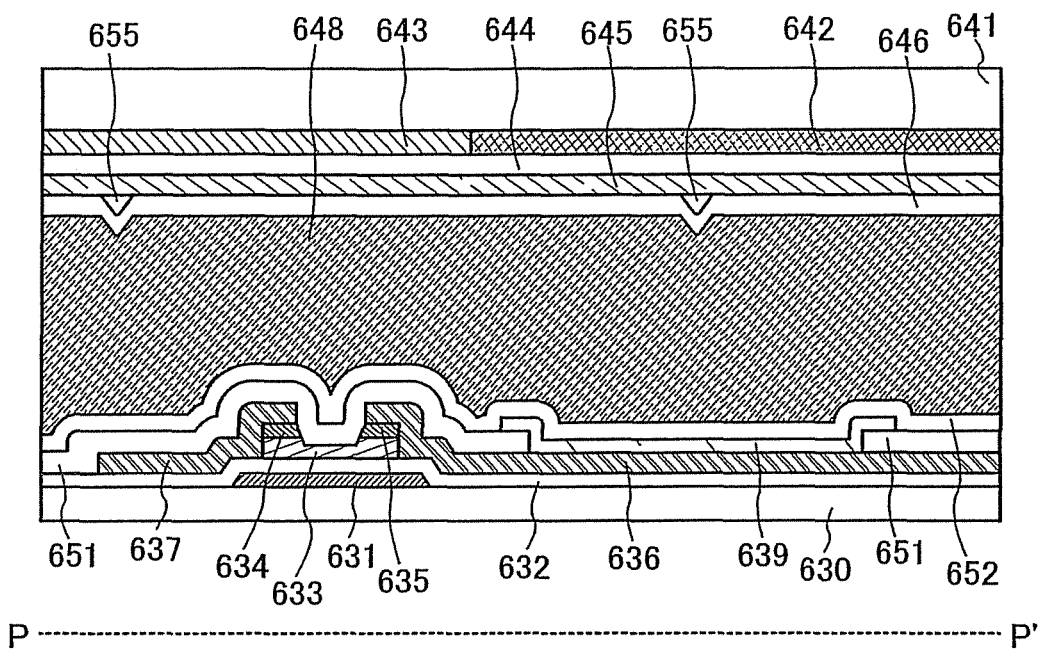
FIGS. 31A and 31B are cross-sectional views showing a manufacturing method of a liquid crystal display device according to the present invention.
Figure 31B:
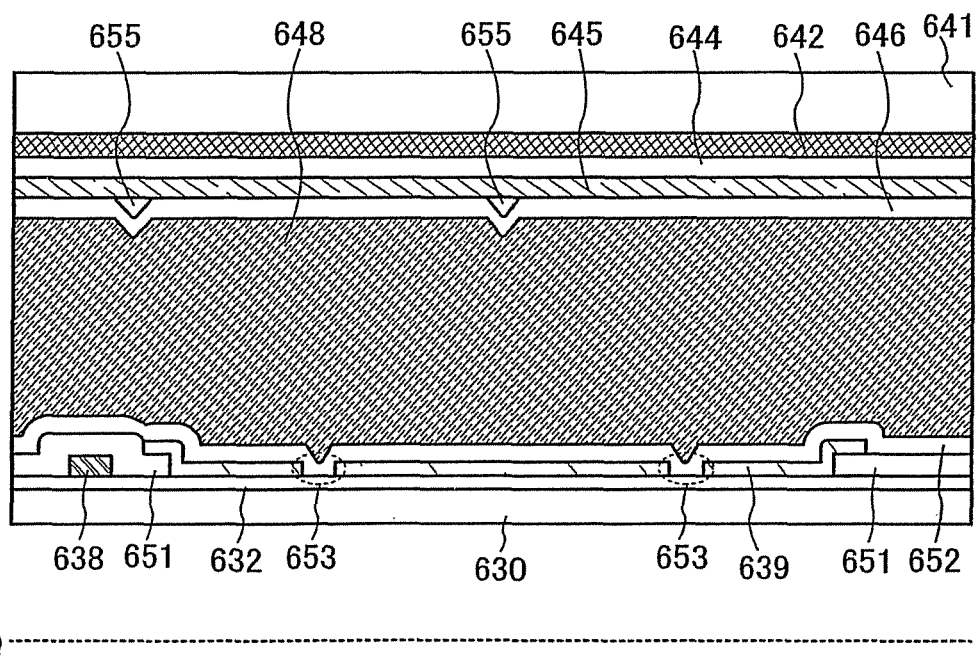

In FIG. 30 and FIGS. 31A and 31B, a gate wiring 631 is formed over a substrate 630 and a gate insulating film 632 is formed over the gate wiring 631.

The substrate 630 may be formed of the same material as that of the substrate 100 described in Embodiment Mode. In addition, the gate wiring 631 may be formed of the same material and by the same manufacturing process as those of the gate wiring 102 described in Embodiment Mode. Moreover, the gate insulating film 632 may be formed of the same material and by the same manufacturing process as those of the gate insulating film 108 described in Embodiment Mode.

A TFT which is a switching element of the pixel has the gate wiring 631, the gate insulating film 632, an island-shaped semiconductor film 633, a source region 634, a drain region 635, a source electrode 637, and a drain electrode 636 (see FIG. 31A).

It is to be noted that the island-shaped semiconductor film 633, the source region 634, and the drain region 635 of the TFT may be formed based on the formation method of the island-shaped semiconductor film 203, the source region 204, and the drain region 205 in Embodiment Mode, respectively.

Although the source electrode 637 and a source wiring 638 are separated for the sake of convenience, they are formed of the same conductive film and connected to each other. In addition, the drain electrode 636 is also formed of the same material and formed by the same process as those of the source electrode 637 and the source wiring 638.

A protective film 651 may be formed of the same material and formed by the same process as those of the protective film 109 described in Embodiment Mode. In addition, the protective film 651 is removed in an opening 657 shown by alternate long and two short dashes line, and only the gate insulating film 632 may be formed in the opening 657 as an insulating film.

The source electrode 637 and the source wiring 638 may be formed of the same material and formed by the same process as those of the source electrode and source wiring 104 in Embodiment Mode. The drain electrode 636 may be formed of the same material and by the same process as those of the drain electrode 105 in Embodiment Mode.

It is to be noted that a pixel electrode 639 may be formed of the same material and by the same manufacturing process as those of the pixel electrode 106 described in Embodiment Mode.

A plurality of grooves 653 is formed in the pixel electrode 639.

In a region where the gate wiring 631 and the pixel electrode 639 overlap with each other, an auxiliary capacitor 665 is formed using the gate insulating film 632 as a dielectric.

An alignment film 652 is formed over the protective film 651 and the pixel electrode 639. The alignment film 652 may be formed by a droplet discharge method, screen printing, or offset printing.

On a counter substrate 641, a color filter including a colored layer 642, a light-shielding layer (black matrix) 643, and an overcoat layer 644 is provided, and a counter electrode 645 formed of a transparent electrode and an alignment film 646 is formed thereon.

A plurality of protrusions (also referred to as ribs) 655 is formed on the counter electrode 645. The protrusion 655 may be formed from a resin such as acrylic. The protrusion 655 may be symmetrical, desirably a tetrahedron., A liquid crystal 648 is formed between the substrate 630 and the counter substrate 641 based on the description of Embodiment Mode.

Figure 32A:
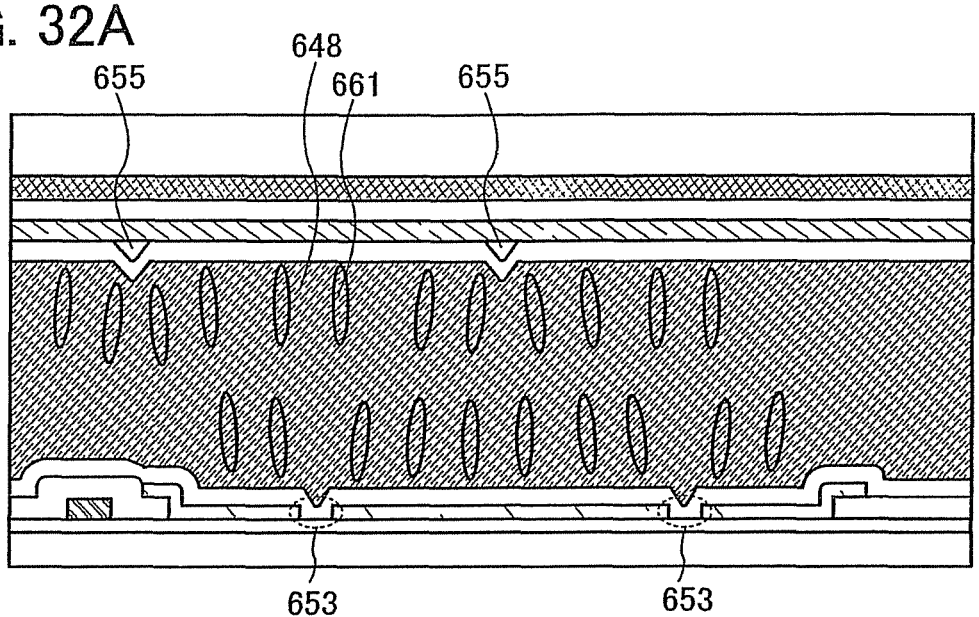
FIGS. 32A and 32B are views each showing movement of liquid crystal molecules of a liquid crystal display device according to the present invention.
Figure 32B:
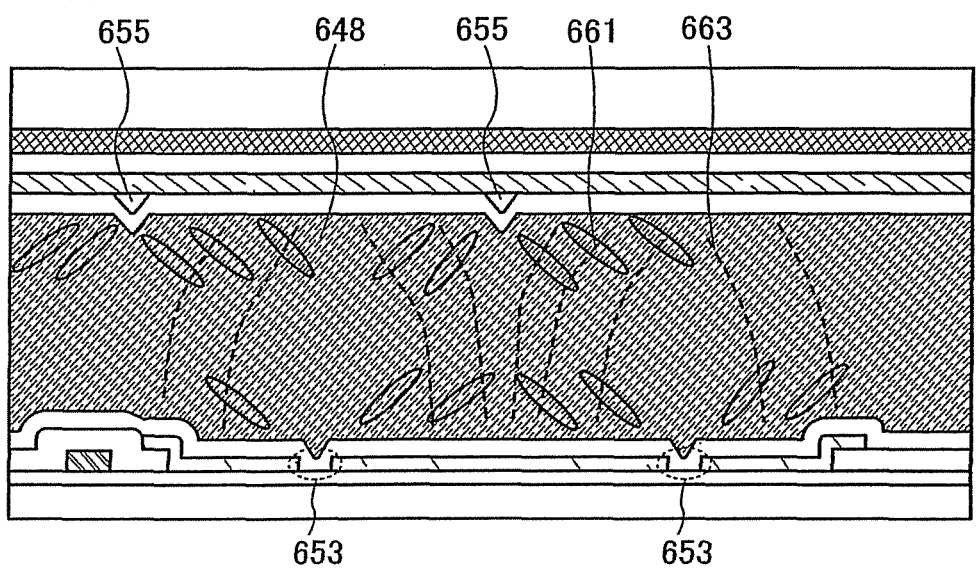

FIGS. 32A and 32B are views each showing movement of liquid crystal molecules 661 in FIG. 31B.

In an MVA mode, a liquid crystal display device is driven so that the liquid crystal molecules 661 in a liquid crystal layer 648 incline symmetrically with respect to the protrusion 655. Accordingly, a difference in color seen from right and left sides can be suppressed. When inclination directions of the liquid crystal molecules 661 are varied in a pixel, uneven color is not generated from any directions of eyes.

FIG. 32A shows a state in which voltage is not applied, that is, a state in which the applied voltage is 0 V. When the applied voltage is 0 V, the liquid crystal molecules 661 align to be perpendicular to the substrates 630 and 641. Therefore, incident light entered from a polarizing plate with which the substrates 630 and 641 are provided directly penetrates the liquid crystal molecules 661, and the direction along which light vibrates intersects with the transmission axis of the polarizing plate on the output side at right angles. Accordingly, the light is not emitted, and thus a dark state is obtained.

FIG. 32B shows a state in which voltage is applied. When the voltage is applied, an electric field 663 is generated as shown in FIG. 32B; accordingly, the liquid crystal molecules 661 incline in an inclination direction of the protrusion 655. Accordingly, the long axes of the liquid crystal molecule 661 and an absorption axis of the polarizing plate intersect with each other, and light penetrates the polarizing plate on the output side, and thus a light state is obtained.

By providing the protrusion 655, the liquid crystal display device is driven so that the liquid crystal molecules 661 incline in the direction perpendicular to the inclined surfaces of the protrusion 655, and display with a symmetric property and a favorable viewing angle characteristic can be obtained.

In addition, in the MVA mode, rubbing of the alignment films 646 and 652 is not necessary; therefore, the number of manufacturing steps can be reduced. Moreover, because a rubbing process is not necessary, an impurity to the liquid crystal 648 due to rubbing can be eliminated. Accordingly, an alignment defect or poor display quality can be suppressed.

Accordingly, in the liquid crystal display device of the MVA mode of this embodiment, display with a symmetric property and a favorable viewing angle characteristic can be obtained in addition to the effect described in Embodiment 1.

It is to be noted that this embodiment can be combined with all structures of or part of the structure of Embodiment Mode and Embodiments 1 to 6, if necessary.

[Embodiment 8]

In this embodiment, a liquid crystal display device of a PVA (Patterned Vertical Alignment) mode will be explained with reference to FIG. 33, FIGS. 34A and 34B, and FIGS. 35A and 35B.

Figure 33:
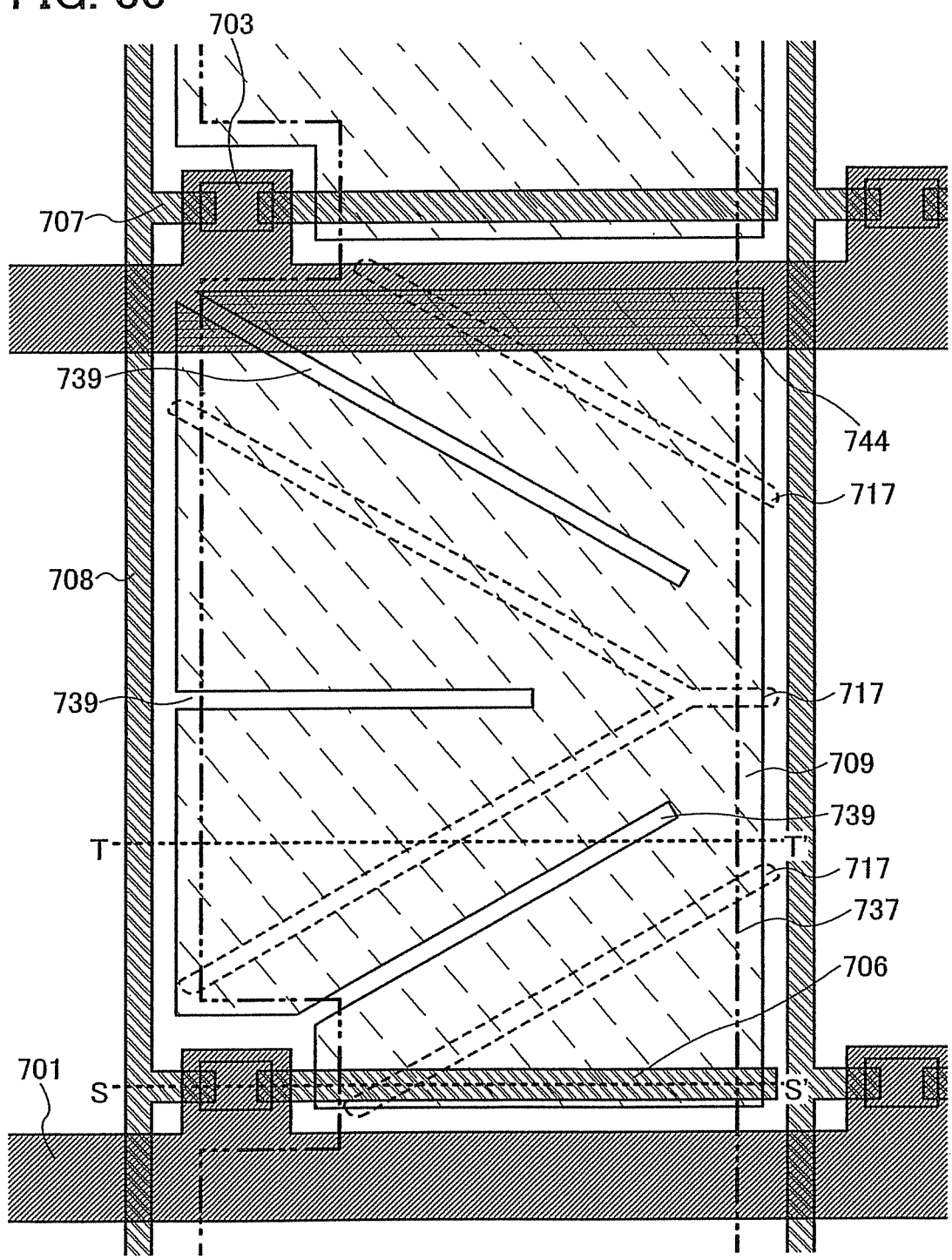
FIG. 33 is a top view of a pixel in a liquid crystal display device according to the present invention.

FIG. 33 is a top view showing one arbitrary pixel in a liquid crystal display device of a PVA mode of this embodiment. In addition, FIGS. 34A and 3413 are cross-sectional views taken along a line S-S' and a line T-T', respectively.

Figure 34A:
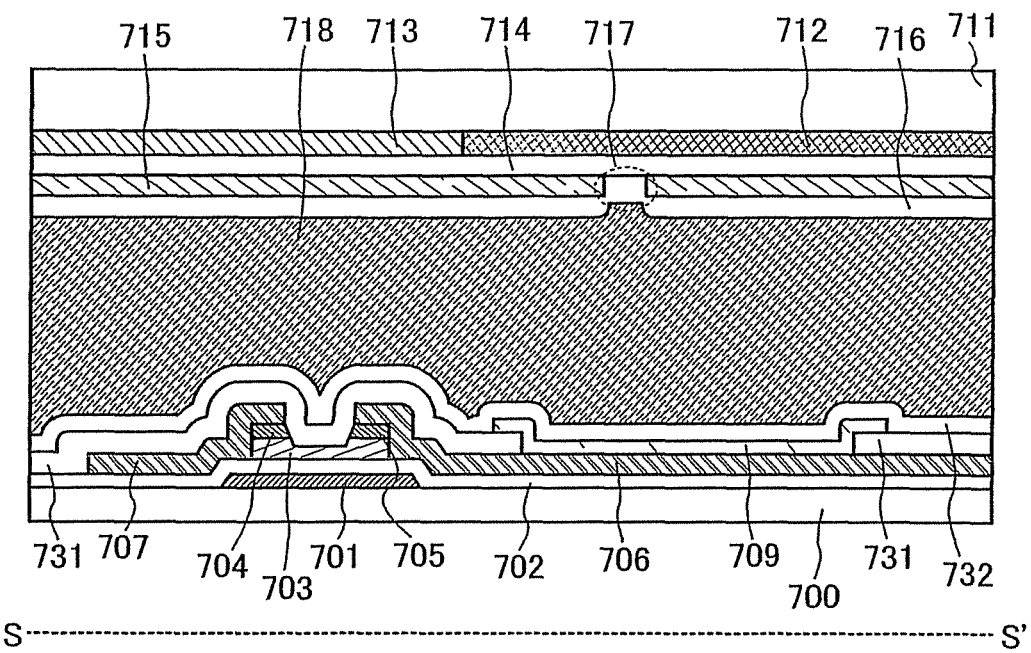
FIGS. 34A and 34B are cross-sectional views each showing a manufacturing method of a liquid crystal display device according to the present invention.
Figure 34B:
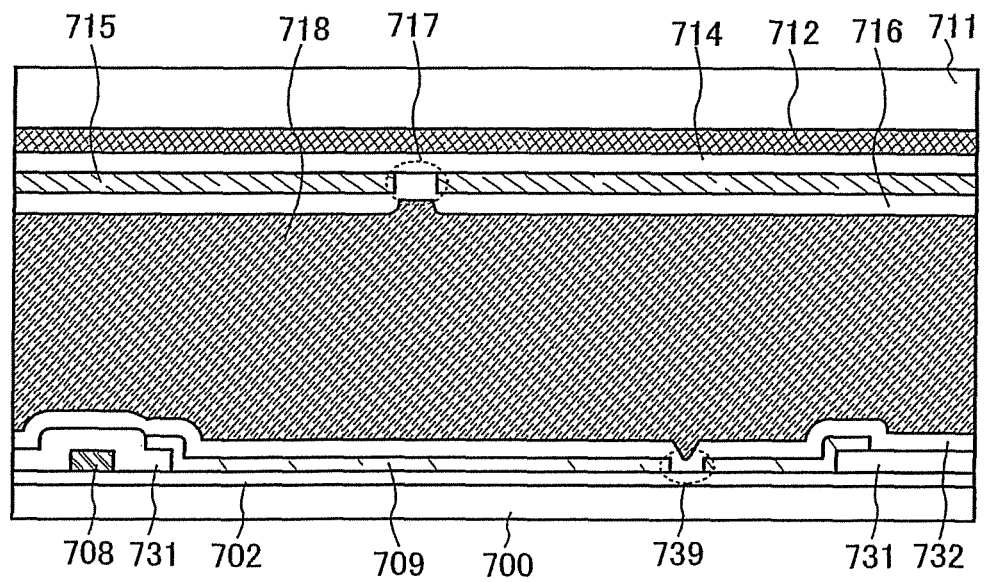

In FIG. 33 and FIGS. 34A and 34B, a gate wiring 701 is formed over a substrate 700 and a gate insulating film 702 is formed over the gate wiring 701.

The substrate 700 may be formed of the same material as that of the substrate 100 described in Embodiment Mode. In addition, the gate wiring 701 may be formed of the same material and formed by the same manufacturing process as those of the gate wiring 102 described in Embodiment Mode. Moreover, the gate insulating film 702 may be formed of the same material and formed by the same manufacturing process as those of the gate insulating film 108 described in Embodiment Mode.

A TFT which becomes a switching element of the pixel has the gate wiring 701, the gate insulating film 702, an island-shaped semiconductor film 703, a source region 704, a drain region 705, a source electrode 707, and a drain electrode 706 (see FIG. 34A).

It is to be noted that the island-shaped semiconductor film 703, the source region 704, and the drain region 705 of the TFT may be formed based on the formation method of the island-shaped semiconductor film 203, the source region 204, and the drain region 205 in Embodiment Mode, respectively.

Although the source electrode 707 and a source wiring 708 are separated for the sake of convenience, they are formed of the same conductive film and connected to each other. In addition, the drain electrode 706 is formed of the same material and formed by the same process as those of the source electrode 707 and the source wiring 708.

A protective film 731 may be formed of the same material and formed by the same process as those of the protective film 109 described in Embodiment Mode. In addition, the protective film 731 is removed in an opening 737 shown by alternate long and two short dashes line, and only the gate insulating film 702 may be formed in the opening 737 as an insulating film.

The source electrode 707 and the source wiring 708 may be formed of the same material and formed by the same process as those of the source electrode and source wiring 104 in Embodiment Mode. The drain electrode 706 may be fanned of the same material and formed by the same process as those of the drain electrode 105 in Embodiment Mode.

It is to be noted that a pixel electrode 709 may be formed of the same material and by the same manufacturing process as those of the pixel electrode 106 described in Embodiment Mode.

A plurality of grooves 739 is formed in the pixel electrode 709.

In a region where the pixel electrode 709 and the gate wiring 701 overlap with each other, an auxiliary capacitor 744 is formed having the gate insulating film 702 therebetween.

An alignment film 732 is formed over the protective film 731 and the pixel electrode 709. The alignment film 732 may be formed by a droplet discharge method, screen printing, or offset printing.

On a counter substrate 711, a color filter including a colored layer 712, a light-shielding layer (black matrix) 713, and an overcoat layer 714 is provided, and a counter electrode 715 formed of a transparent electrode and an alignment film 716 is formed thereon.

A plurality of grooves 717 is formed in the counter electrode 715. The grooves 717 in the counter electrode 715 are aligned so as not to overlap with the grooves 739 in the pixel electrode 709 (see FIG. 33).

A liquid crystal 718 is formed between the substrate 700 and the counter substrate 711 based on the description of Embodiment Mode.

Figure 35A:
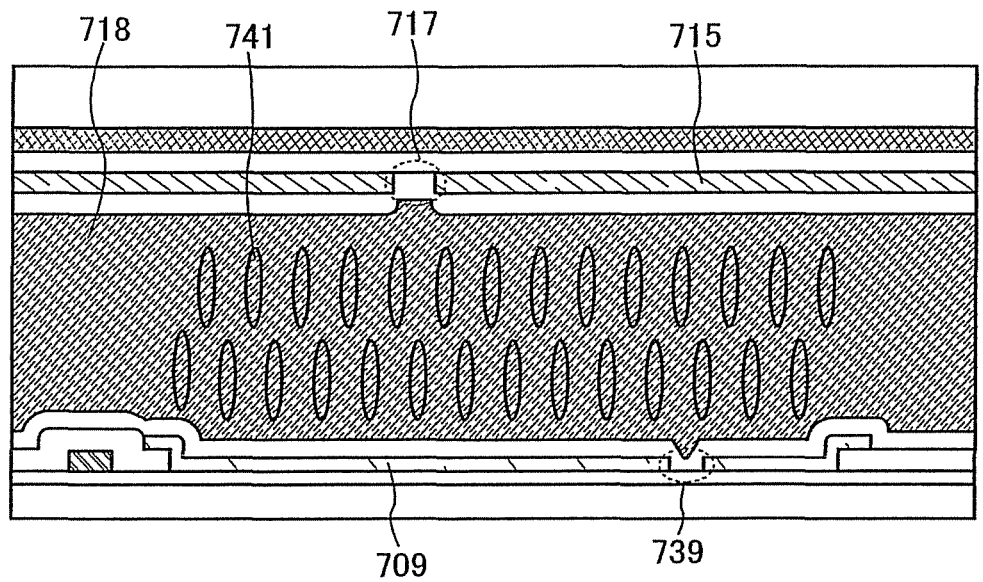
FIGS. 35A and 35B are views each showing movement of liquid crystal molecules of a liquid crystal display device according to the present invention.
Figure 35B:
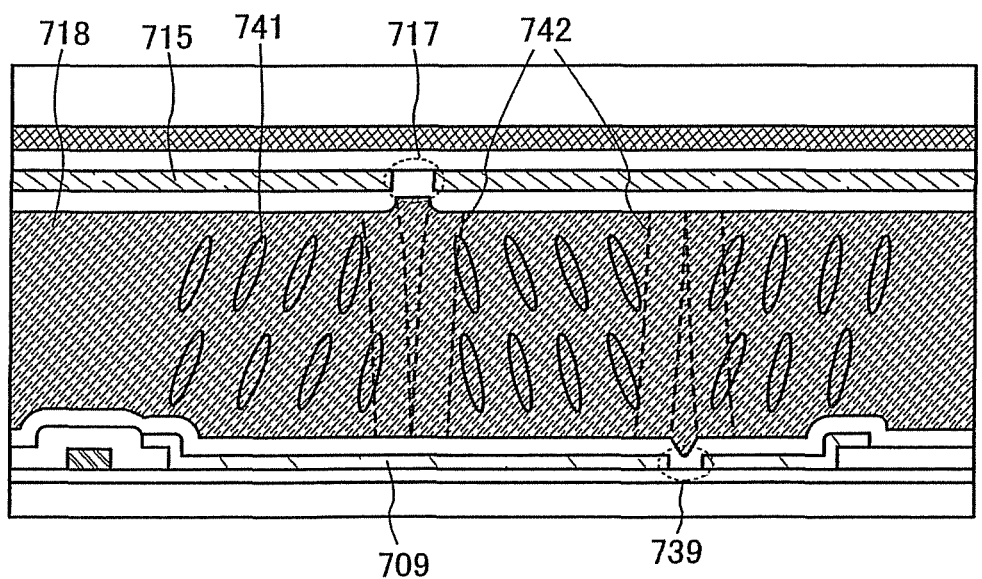

FIGS. 35A and 35B are views each showing movement of liquid crystal molecules 741 in FIG. 34B.

In the PVA mode, the grooves 717 of the counter electrode 715 and the grooves 739 of the pixel electrode 709 are placed so as not to overlap each other, and the liquid crystal molecules 741 in the liquid crystal 718 are aligned toward the grooves 717 and the grooves 739 that are placed so as not to overlap each other; accordingly, light is transmitted.

FIG. 35A shows a state in which voltage is not applied, that is, a state in which the applied voltage is 0 V. When the applied voltage is 0 V, the liquid crystal molecules 741 align to be perpendicular to the substrate 700. Therefore, incident light entered from a polarizing plate provided on the substrate 700 or 711 directly penetrates the liquid crystal molecules 741, and the direction to which light vibrates intersects with the transmission axis of a polarizing plate on an output side at right angles. Accordingly, the light is not emitted, and thus a dark state is obtained.

FIG. 35B shows a state in which voltage is applied. When the voltage is applied, an electric field 742 is generated obliquely as shown in FIG. 35B, and thus the liquid crystal molecules 741 incline obliquely. Accordingly, the long axes of the liquid crystal molecules 741 and the absorption axis of the polarizing plate intersect with each other, and light penetrates the polarizing plate on the output side, and thus a light state is obtained.

By providing the grooves 717 in the counter electrode 715 and the grooves 739 in the pixel electrode 709, by the oblique electric field 742 toward the grooves 717 and 739, the liquid crystal molecules 741 are driven obliquely. Accordingly, display with a symmetric property in an oblique direction as well as up and down or right and left and with a favorable viewing angle characteristic can be obtained.

In addition, in the PVA mode, rubbing of the alignment films 716 and 732 is not necessary; therefore, the number of manufacturing steps can be reduced. Moreover, because a rubbing process is not necessary, an impurity to the liquid crystal 718 due to rubbing can be eliminated. Accordingly, an alignment defect or poor display quality can be suppressed.

Accordingly, in the liquid crystal display device of the PVA mode of this embodiment, display with a symmetric property and a favorable viewing angle characteristic can be obtained in addition to the effect described in Embodiment 1.

It is to be noted that this embodiment can be combined with all structures of or part of the structure of Embodiment Mode and Embodiments 1 to 7, if necessary.

[Embodiment 9]

In this embodiment, a liquid crystal display device of a subpixel division driving method will be explained with reference to FIG. 36, FIGS. 37A and 37B, and FIG. 38.

In the subpixel division driving method, one pixel is divided into a plurality of subpixels, thereby being driven.

Figure 36:
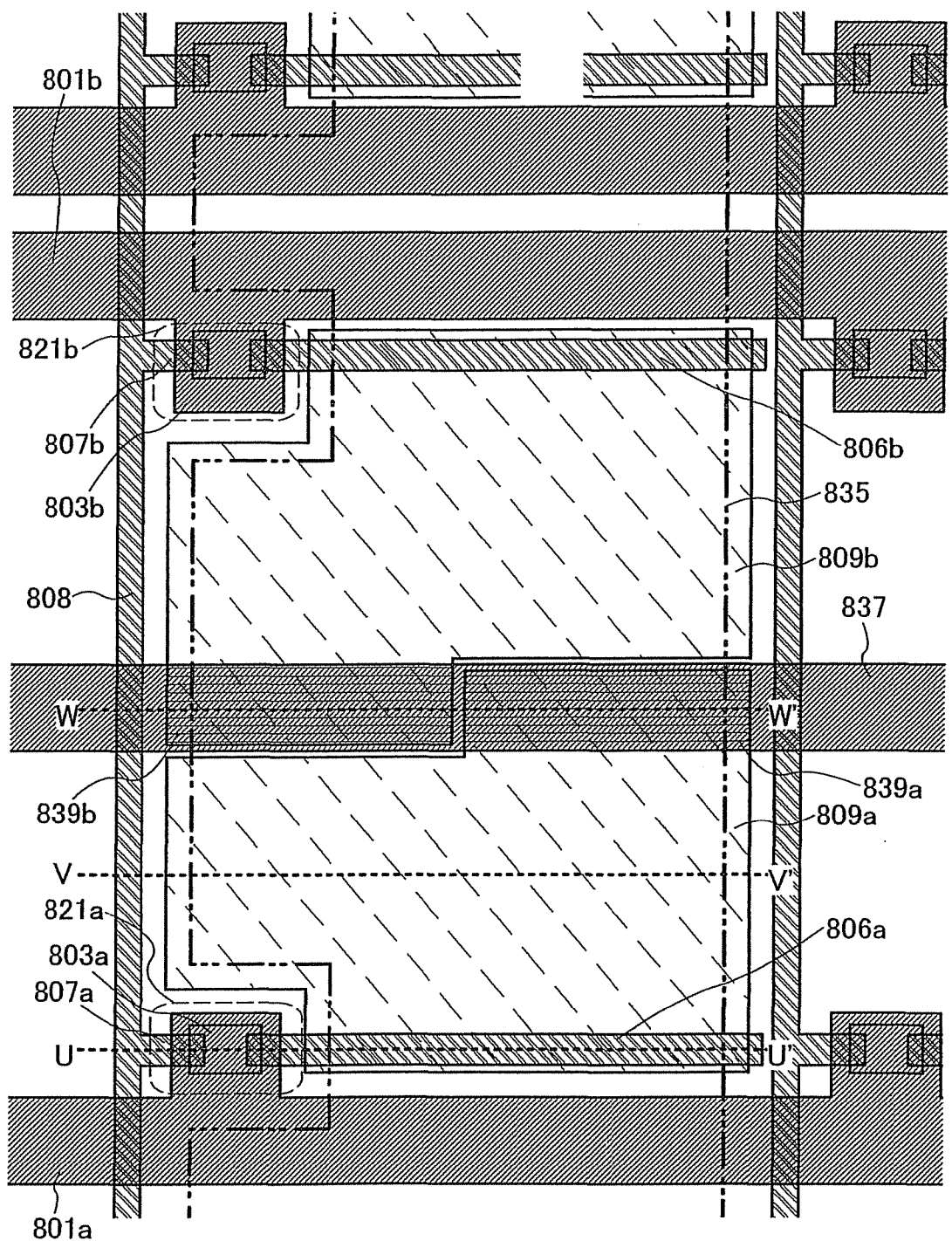
FIG. 36 is a top view of a pixel in a liquid crystal display device according to the present invention.
Figure 37A:
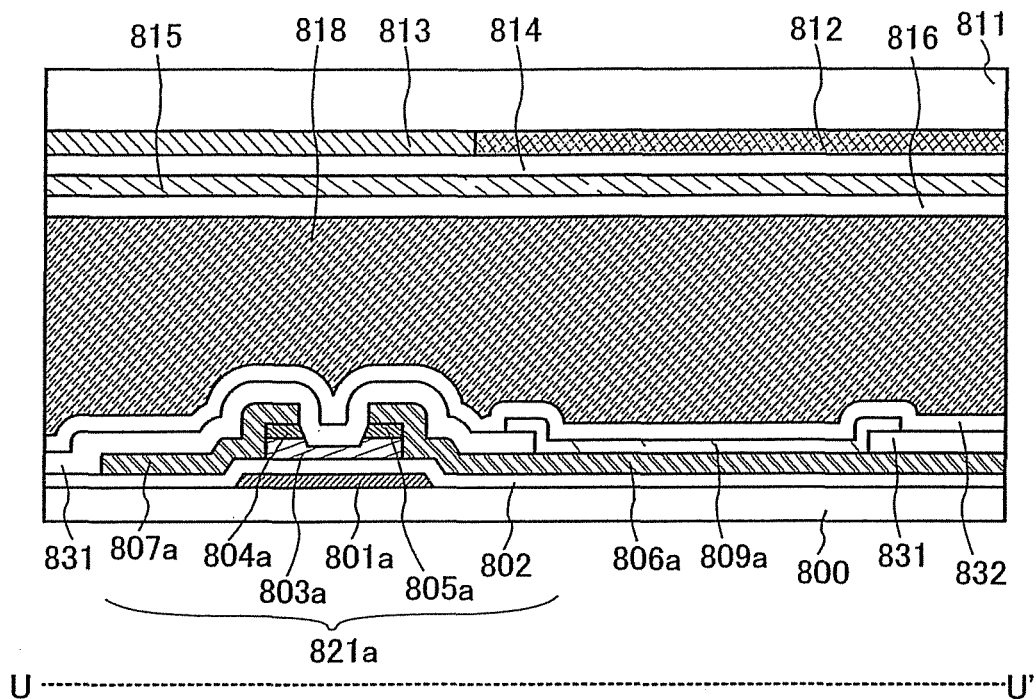
FIGS. 37A and 37B are cross-sectional views each showing a manufacturing method of a liquid crystal display device according to the present invention.
Figure 37B:
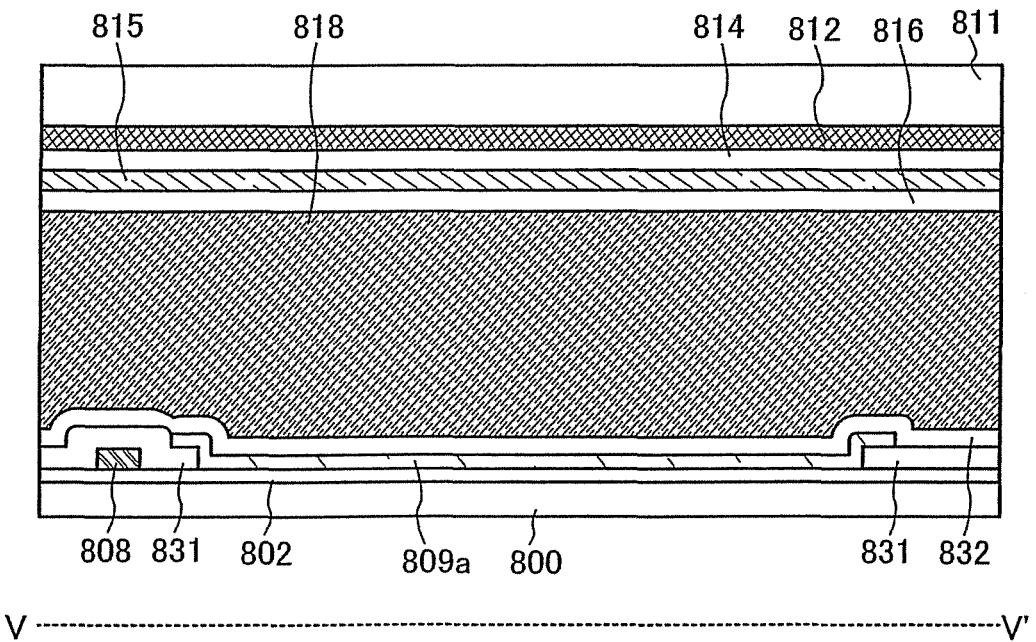
Figure 38:
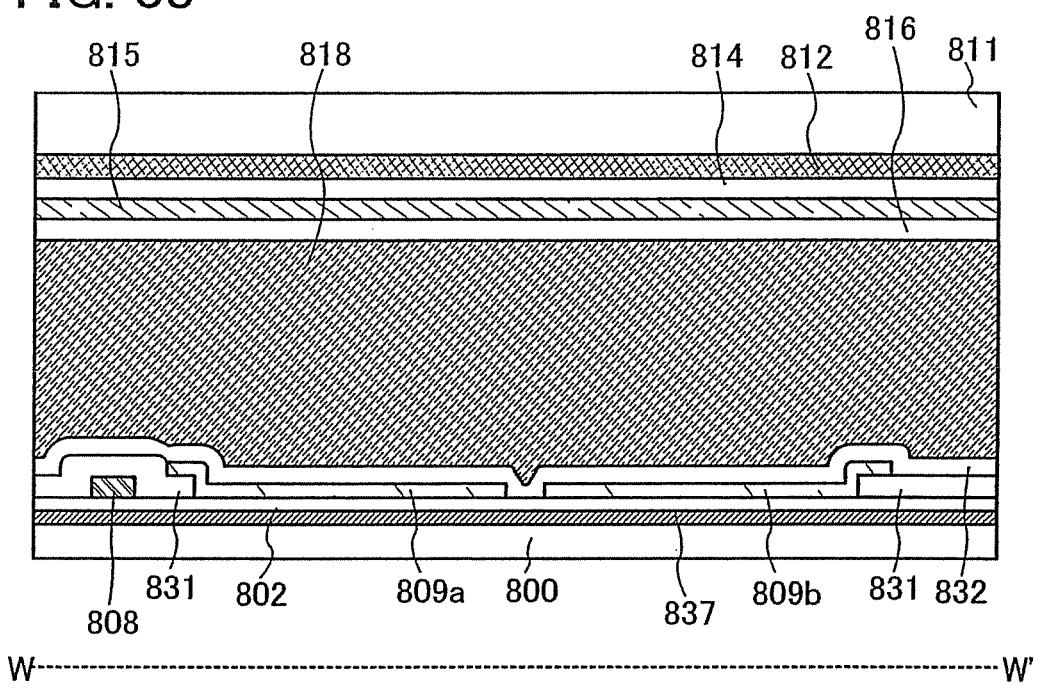
FIG. 38 is a cross-sectional view showing a manufacturing method of a liquid crystal display device according to the present invention.

FIG. 36 is a top view of one arbitrary pixel in a liquid crystal display device of the subpixel division driving method of this embodiment. In addition, FIGS. 37A and 37B and FIG. 38 are cross-sectional views taken along a line U-U', a line V-V', and a line W-W' in FIG. 36, respectively.

In FIG. 36, FIGS. 37A and 37B, and FIG. 38, gate wirings 801a and 801b are formed over a substrate 800, and a gate insulating film 802 is formed over the gate wirings 801a and 801b.

The substrate 800 may be formed of the same material as that of the substrate 100 described in Embodiment Mode. In addition, the gate wirings 801a and 801b may be formed of the same material and formed by the same manufacturing process as those of the gate wiring 102 described in Embodiment Mode. Moreover, the gate insulating film 802 may be formed of the same material and formed by the same manufacturing process as those of the gate insulating film 108 described in Embodiment Mode.

In the liquid crystal display device of the subpixel division driving method, a plurality of pixel TFTs which is a switching element is formed in one pixel. In this embodiment, a TFT 821a and a TFT 821b which are two pixel TFTs are formed in one pixel.

The TFT 821a has the gate wiring 801a, the gate insulating film 802, an island-shaped semiconductor film 803a, a source region 804a, a drain region 805a, a source electrode 807a, and a drain electrode 806a (see FIG. 37A). It is to be toted that the TFT 821b has the same structure as that of the TFT 821a and has the gate wiring 801b, the gate insulating film 802, an island-shaped semiconductor film 803b, a source region 804b (not shown), a drain region 805b (not shown), a source electrode 807b, and a drain electrode 806b.

It is to be noted that the island-shaped semiconductor film 803a of the TFT 821a and the island-shaped semiconductor film 803b of the TFT 821b, the source regions 804a and 804b, and the drain regions 805a and 805b may be formed based on the forming method of the island-shaped semiconductor film 203, the source region 204, and the drain region 205, respectively.

Although the source electrodes 807a and 807b and a source wiring 808 are separated for the sake of convenience, they are formed of the same conductive film and connected to each other. In addition, the drain electrodes 806a and 806b are formed of the same material and formed by the same process as those of the source electrodes 807a and 807b and the source wiring 808.

A protective film 831 may be formed of the same material and formed by the same process as those of the protective film 109 described in Embodiment Mode. In addition, the protective film 831 is removed in an opening 835 shown by alternate long and two short dashes line, and an insulating film formed in the opening 835 is only the gate insulating film 802.

The source electrodes 807a and 807b and the source wiring 808 may be formed of the same material and formed by the same process as those of the source electrode and source wiring 104 of Embodiment Mode. Also, the drain electrodes 806a and 806b may be formed of the same material and by the same process as those of the drain electrode 105 of Embodiment Mode.

A pixel electrode 809a is provided in the TFT 821a and is directly connected to the drain electrode 806a in the opening 835. In the same way, a pixel electrode 809b is provided in the TFT 821b and is directly connected to the drain electrode 806b in the opening 835.

It is to be noted that the pixel electrodes 809a and 809b may be formed of the same material and formed by the same manufacturing process as those of the pixel electrode 106 described in Embodiment Mode.

The area of the pixel electrode 809a and the area of the pixel electrode 809b may be the same or different from each other. An area ratio of the pixel electrode 809a and an area ratio of the pixel electrode 809b may be changed according to need. For example, the area ratio between the pixel electrode 809a and the pixel electrode 809b can be set 5:5, 1:9, 3:7, 6:4, 8:2 or the like.

In a region where the pixel electrode 809a and an auxiliary capacitor wiring 837 overlap with each other, an auxiliary capacitor 839a is formed having the gate insulating film 802 therebetween. In the same way, in a region where the pixel electrode 809b and the auxiliary capacitor wiring 837 overlap with each other, an auxiliary capacitor 839b is formed having the gate insulating film 802 therebetween.

The auxiliary capacitor wiring 837 may be formed of the same material and may be formed in the same layer as those of the gate electrode and gate wirings 801a and 801b.

An alignment film 832 is formed over the protective film 831 and the pixel electrodes 809a and 809b. The alignment film 832 may be formed by a droplet discharge method, a screen printing method, or an offset printing method.

Over a counter substrate 811, a color filter including a colored layer 812, a light-shielding layer (black matrix) 813, and an overcoat layer 814 is provided, and a counter electrode 815 formed of a transparent electrode and an alignment film 816 is formed thereover.

A liquid crystal 818 is formed between the substrate 800 and the counter substrate 811 based on the description of Embodiment Mode.

As shown in this embodiment, by dividing one pixel into a plurality of subpixels, gray-scale display can be improved.

Accordingly, in the liquid crystal display device of the subpixel division method of this embodiment, a liquid crystal display device with improved gray-scale display can be obtained in addition to the effect described in Embodiment 1.

It is to be noted that this embodiment can be combined with all structures of or part of the structure of Embodiment Mode and Embodiments 1 to 8, if necessary.

[Embodiment 10]

In this embodiment, an example in which a droplet discharge method is used for dropping a liquid crystal. In this embodiment, an example of obtaining four panels from a large-sized substrate will be explained with reference to FIGS. 39A to 39D, FIGS. 40A and 40B, FIGS. 41A and 41B, and FIGS. 42A and 42B.

Figure 39A:
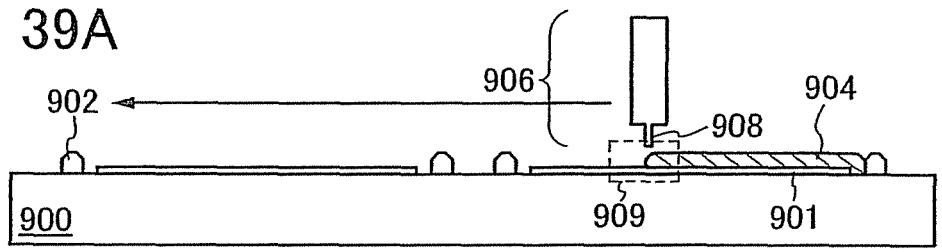
FIGS. 39A to 39D are views each showing a manufacturing process of a liquid crystal display device using a liquid crystal dropping method according to the present invention.

FIG. 39A shows a cross-sectional view of a liquid crystal layer formation by a dispenser (or an inkjet) in progress, and a liquid crystal material 904 is discharged, sprayed, or dropped from a nozzle 908 of a droplet discharging apparatus 906 so as to cover a pixel portion 901 that is surrounded by a sealant 902. The droplet discharging apparatus 906 is moved in the direction of an arrow in FIG. 39A. It is to be noted that, although that an example of moving the nozzle 408 is shown here, the liquid crystal layer may be formed by fixing the nozzle and moving the substrate 900.

Figure 39B:
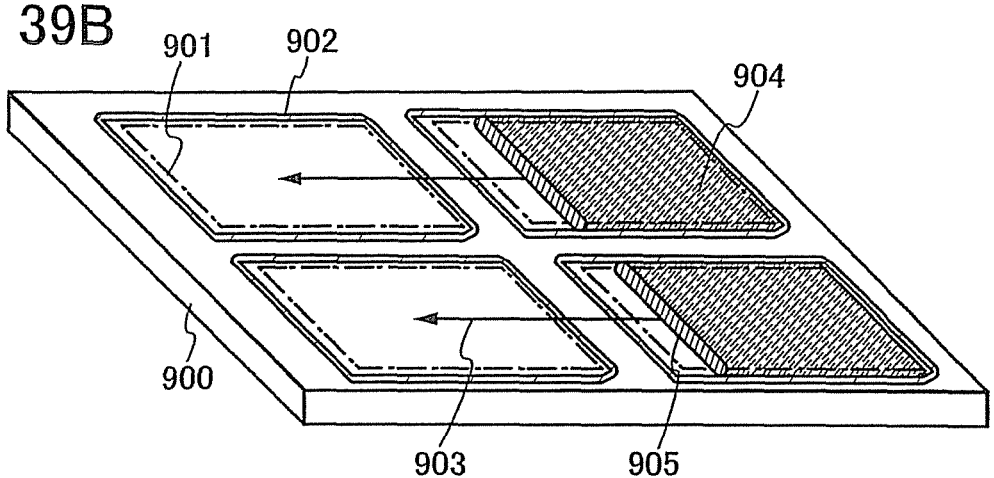

Also, a perspective view is shown in FIG. 39B, which shows a scene where the liquid crystal material 904 is selectively discharged, sprayed, or dropped just in regions surrounded by the sealant 902, and a dropping surface 905 is moved in a nozzle scanning direction 903.

Figure 39C:
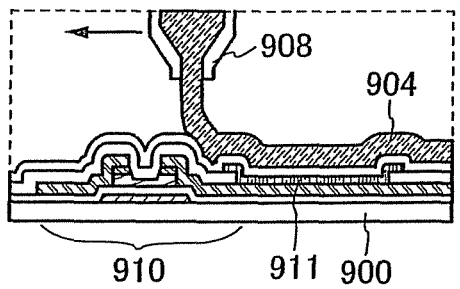
Figure 39D:
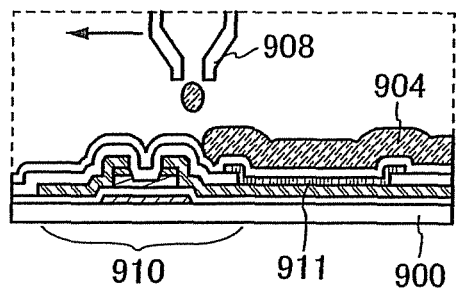

Also, FIGS. 39C and 39D each show an enlarged cross-sectional view of a portion 909 surrounded by a dotted line in FIG. 39A. When viscosity of the liquid crystal material is high, the liquid crystal material is discharged continuously, and sticks without a break as in FIG. 39C. On the other hand, when viscosity of the liquid crystal material is low, the liquid crystal material is discharged intermittently, and droplets are dropped in a dot form as shown in FIG. 39D.

It is to be noted that in FIGS. 39C and 39D, reference numerals 900, 910, and 911 denote a substrate, a TFT, and a pixel electrode, respectively. The pixel portion 901 includes pixel electrodes 911 arranged in matrix and a switching element connected to the pixel electrodes 911, and here, the TFT 910 and a storage capacitor that are formed based on the descriptions of Embodiment Mode and Embodiment 1 are also included.

A panel manufacturing flow is explained below with reference to FIGS. 40A and 40B and FIGS. 41A and 41B.

Figure 40A:
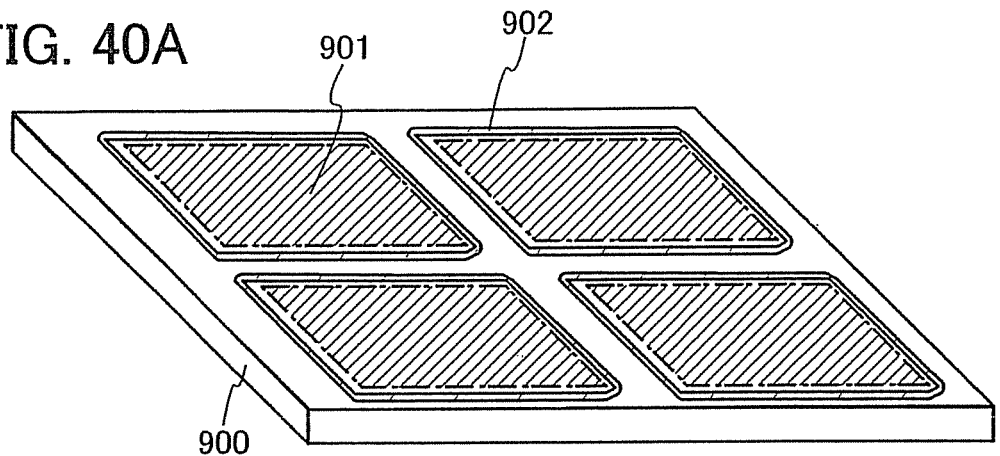
FIGS. 40A and 40B are views each showing a manufacturing process of a liquid crystal display device using a liquid crystal dropping method according to the present invention.

First, the first substrate 900 with an insulating surface over which the pixel portion 901 is formed is prepared. For the first substrate 900, formation of an alignment film, rubbing treatment, dispersion of a spherical spacer or formation of a columnar spacer, formation of a color filter, or the like is performed in advance. Subsequently, as shown in FIG. 40A, the sealant 902 is formed in a position surrounding the pixel portion 901 over the first substrate 900 by a dispenser apparatus or an inkjet apparatus under an inert gas atmosphere or under reduced pressure. For the sealant 902 which is semi-transparent, a material including a filler (6 to 24 µm in diameter) which has a viscosity of 40 to 400 Pa·s is used. It is to be noted that it is preferable to select a sealant which is not dissolved in liquid crystal with which the sealant is in contact later. As the sealant 902, an acrylic-based light curable resin or an acrylic based heat curable resin may be used. Further, since it is a simple seal pattern, the sealant 902 can also be formed by a printing method.

Figure 40B:
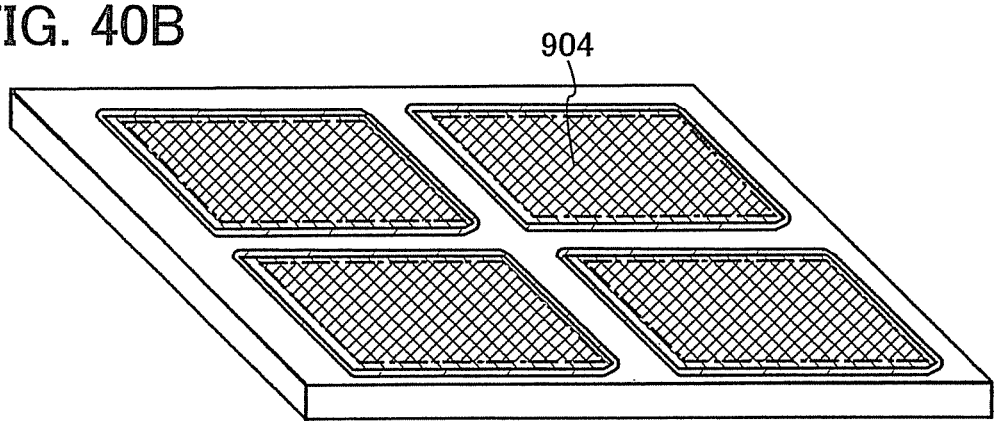

Next, the liquid crystal material 904 is dropped in a region surrounded by the sealant 902 by an inkjet method (see FIG. 40B). As the liquid crystal material 904, a known liquid crystal material having a viscosity by which discharging by an inkjet method is possible may be used. Also, since viscosity of the liquid crystal material 904 can be set by adjusting a temperature, it is suited for the inkjet method. By the inkjet method, a necessary amount of the liquid crystal material 904 can be stored in the region surrounded by the sealant 902 without waste.

Subsequently, the first substrate 900 over which the pixel portion 901 is provided and the second substrate 921 over which the counter electrode and the alignment film are provided are attached together under reduced pressure so that air bubbles do not enter (see FIG. 41A). Here, ultraviolet irradiation or a heat treatment is performed at the same time as attaching the first substrate 900 and the second substrate 921 together, and the sealant 902 is cured. It is to be noted that the heat treatment may be performed in addition to ultraviolet irradiation.

Figure 42A:
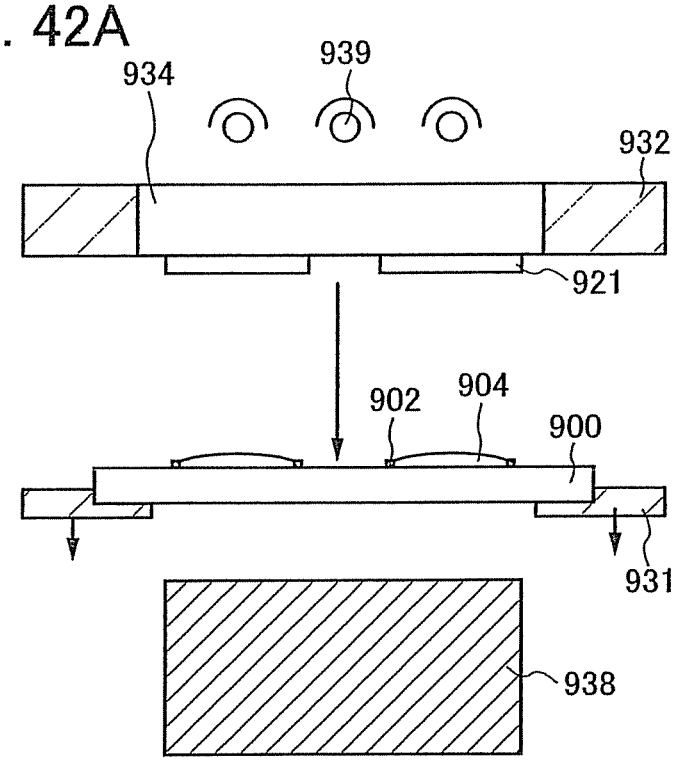
FIGS. 42A and 42B are views each showing a manufacturing process of a liquid crystal display device using a liquid crystal dropping method according to the present invention.
Figure 42B:
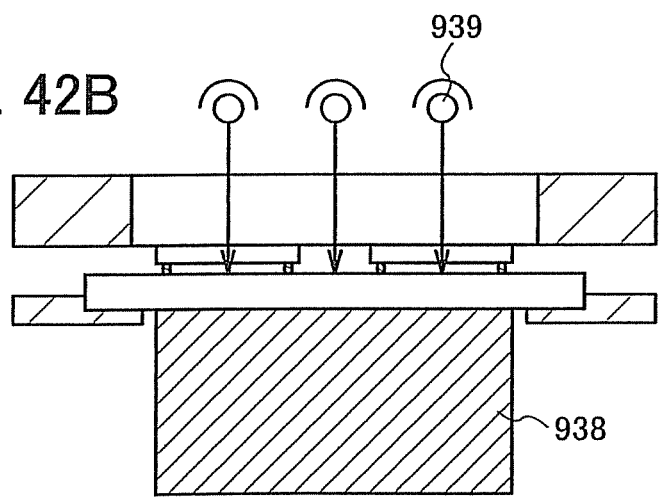

Also, FIGS. 42A and 42B each show an example of an attaching apparatus capable of ultraviolet irradiation or heat treatment during or after attaching of substrates.

In FIGS. 42A and 42B, reference numerals 931, 932, 934, 938, and 939 denote a first substrate supporting base, a second substrate supporting base, a window, a downside measuring plate, and a light source, respectively. It is to be noted that in FIGS. 42A and 42B, the same reference numerals are used for portions corresponding to FIGS. 39A to 39D, FIGS. 40A and 40B, and FIGS. 41A and 40B.

The downside measuring plate 938 includes a heating heater and cures the sealant 902. Also, the second substrate supporting base 932 is provided with the window 934 and allows ultraviolet light and the like from the light source 939 to pass through. Although not shown here, a position aligning of a substrate is performed through the window 934. Further, the second substrate 921 serving as a counter substrate is cut into a desired size in advance, and fixed to the second substrate supporting base 932 by a vacuum chuck or the like. A state before attachment is shown in FIG. 42A.

At the time of attachment, after moving down the first substrate supporting base 931 and the second substrate supporting base 932, the first substrate 900 and the second substrate 921 are attached to each other by pressure, and then cured by performing ultraviolet irradiation as it is. A state after attachment is shown in FIG. 42B.

Subsequently, the first substrate 900 is cut using a cutting apparatus such as a scriber apparatus, a breaker apparatus, or a roll cutter (see FIG. 41B). In this manner, four panels can be manufactured from one substrate. Then, an FPC is attached using a known technique.

Through the above process, a liquid crystal display device using a large-sized substrate is manufactured.

It is to be noted that this embodiment can be combined with all structures of or part of the structure of Embodiment Mode and Embodiments 1 to 9, if necessary.

[Embodiment 1]

As electronic appliances to which the present invention is applied, the following are given: a television set, a video camera, a digital camera, a goggle display, a navigation system, an audio reproducing device (such as a car audio component), a computer, a game machine, a portable information terminal (such as a mobile computer, a cellular phone, a portable game machine, and an electronic book), an image reproducing device provided with a recording medium (specifically, a device which can reproduce a recording medium such as a digital versatile disc (DVD) and includes a display capable of displaying the image), and the like. Specific examples of these electronic appliances are shown in FIG. 43, FIG. 44, FIGS. 45A and 45B, FIGS. 46A and 46B, FIG. 47, FIGS. 48A to FIG. 48E, and FIGS. 49A and 49B.

Figure 43:
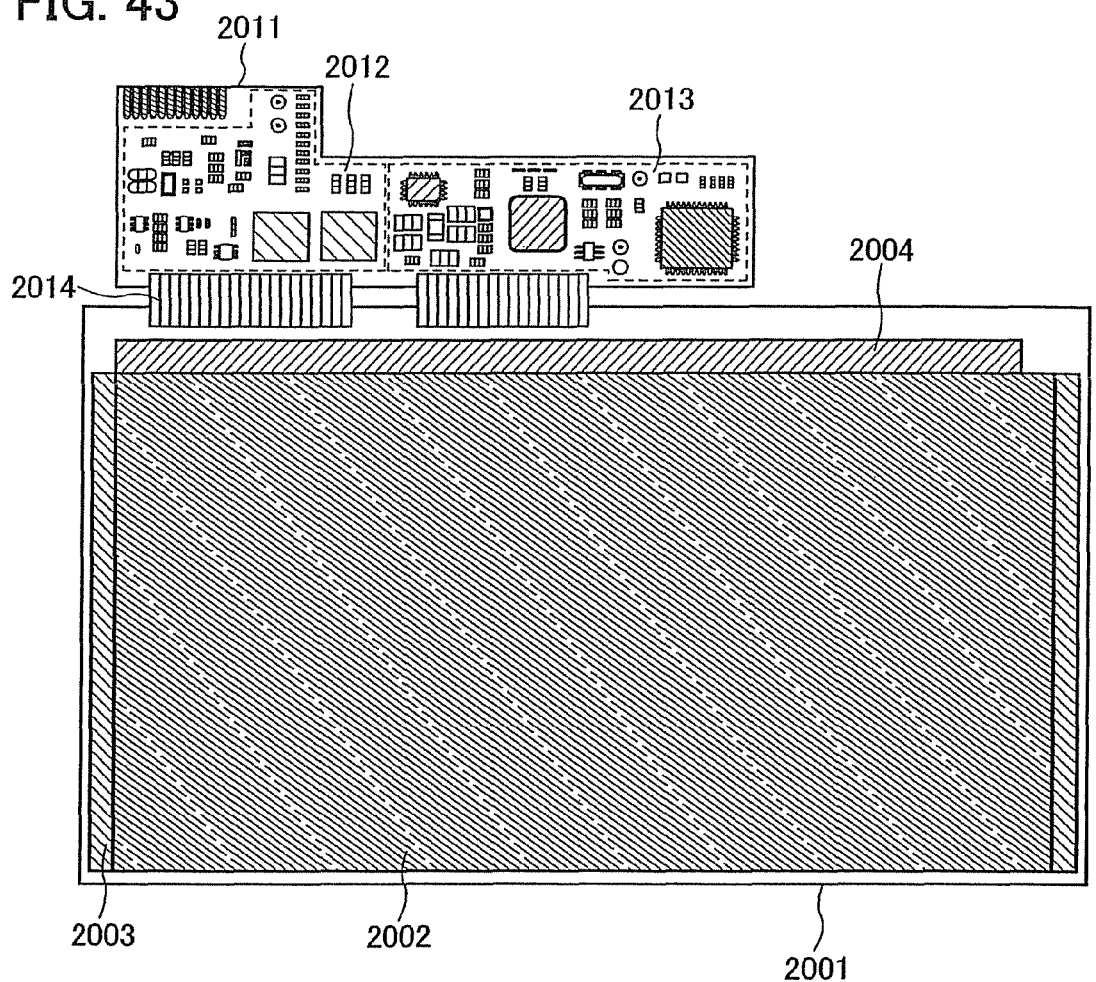
FIG. 43 is a view showing an example of an electronic appliance to which the present invention is applied.

FIG. 43 shows a liquid crystal module in which a liquid crystal display panel 2001 and a circuit substrate 2011 are combined. In the circuit substrate 2011, a control circuit 2012, a signal division circuit 2013, and the like are formed, and the circuit substrate 2011 is electrically connected to the liquid crystal display panel 2001 formed using the present invention by a connection wiring 2014.

This liquid crystal display panel 2001 is provided with a pixel portion 2002 provided with a plurality of pixels, a scanning line driver circuit 2003, a signal line driver circuit 2004 for supplying a video signal to a selected pixel. The liquid crystal display panel 2001 may be formed based on Embodiment Mode and Embodiments 1 to 10.

Figure 44:
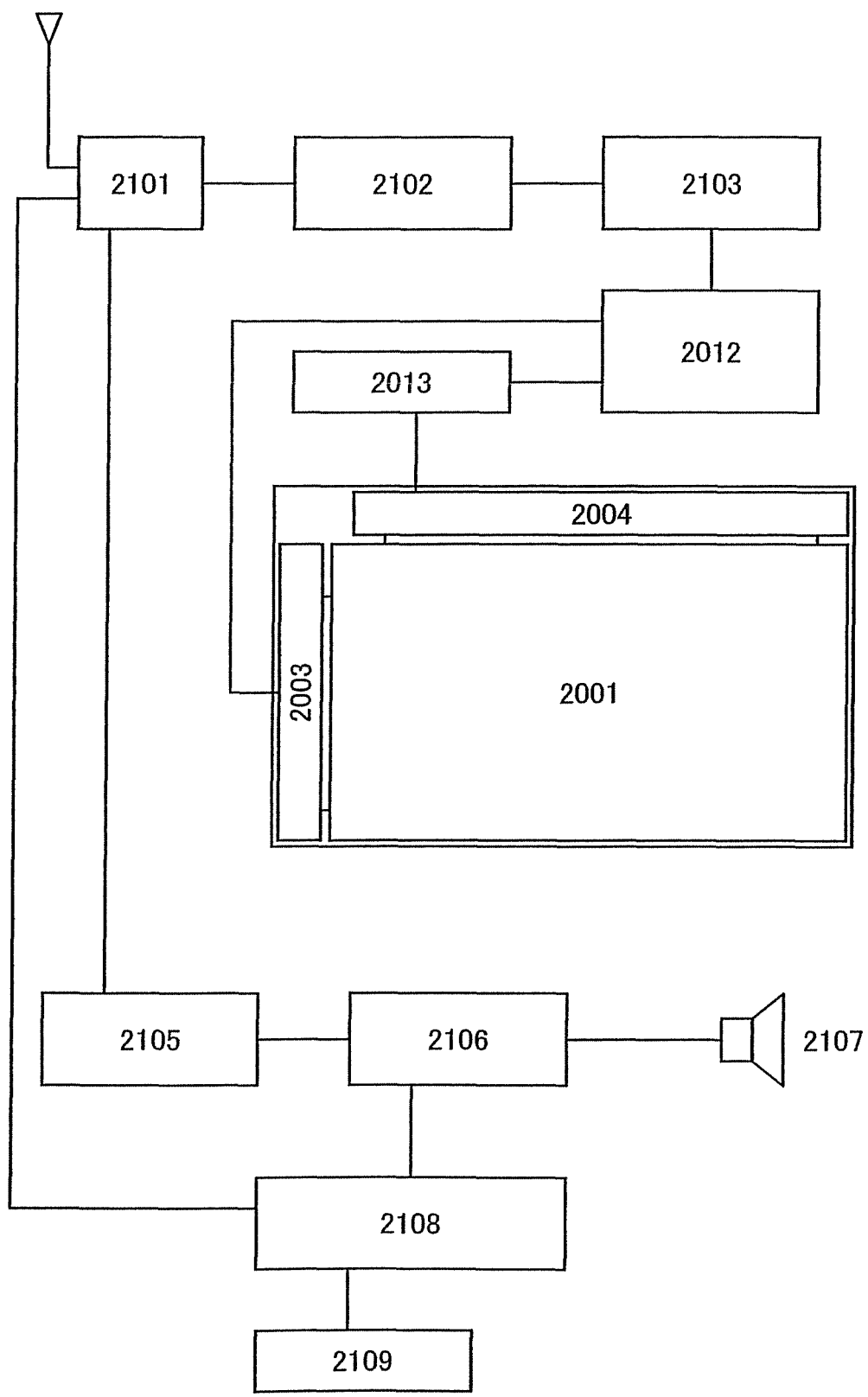
FIG. 44 is a view showing an example of an electronic appliance to which the present invention is applied.

A liquid crystal television receiving set can be completed with the liquid crystal module shown in FIG. 43. FIG. 44 is a block diagram showing a main structure of the liquid crystal television receiving set. A tuner 2101 receives an image signal and an audio signal. The image signal is processed by an image signal amplifier circuit 2102, an image signal processing circuit 2103 which converts a signal outputted from the image signal amplifier circuit 2102 into a color signal corresponding to each color of red, green, and blue, and a control circuit 2012 for converting the image signal into an input specification of a driver IC. Signals are output from the control circuit 2012 to a scanning line side and a signal line side. In a case of employing digital driving, a structure may be employed in which a signal division circuit 2013 is provided on the signal line side and an input digital signal is divided into m pieces to be supplied.

Among the signals received by the tuner 2101, the audio signal is transmitted to an audio signal amplifier circuit 2105. Then, the output of the audio signal is supplied to a speaker 2107 through an audio signal processing circuit 2106. A control circuit 2108 receives control information such as a receiving station (receiving frequency) or sound volume from an input portion 2109 and sends a signal to the tuner 2101 or the audio signal processing circuit 2106.

Figure 45A:
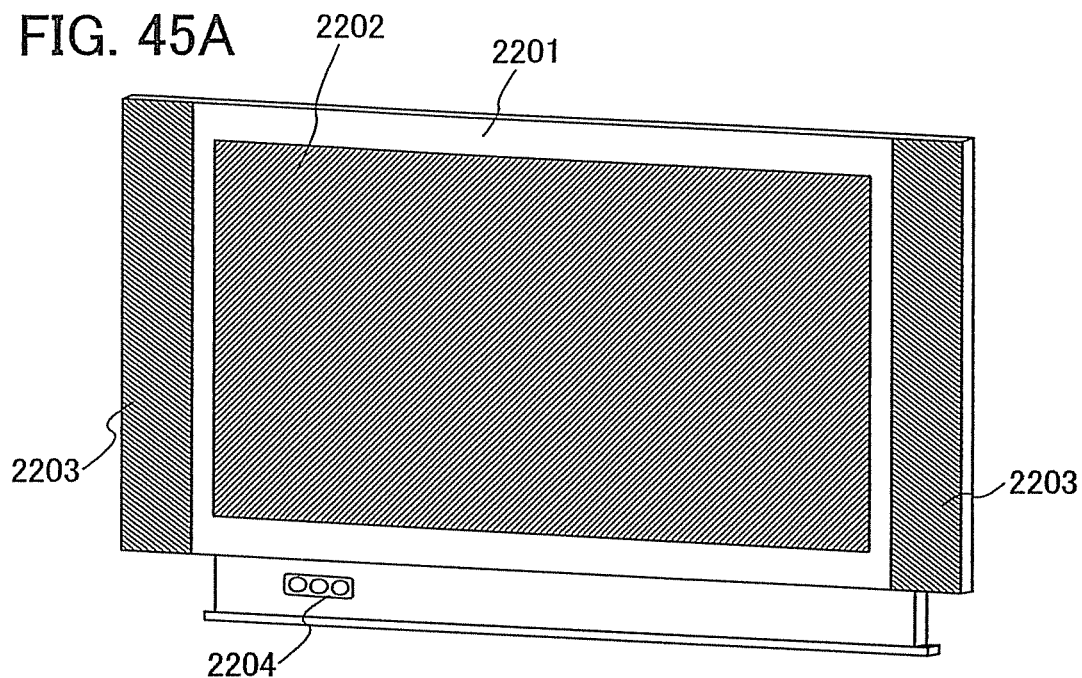
FIGS. 45A and 45B are views each showing an example of an electronic appliance to which the present invention is applied.

As shown in FIG. 45A, a television receiving set can be completed by incorporating a liquid crystal module into a housing 2201. By using the liquid crystal module, a display screen 2202 is formed. Moreover, a speaker 2203, operation switches 2204, and the like are provided appropriately.

Figure 45B:
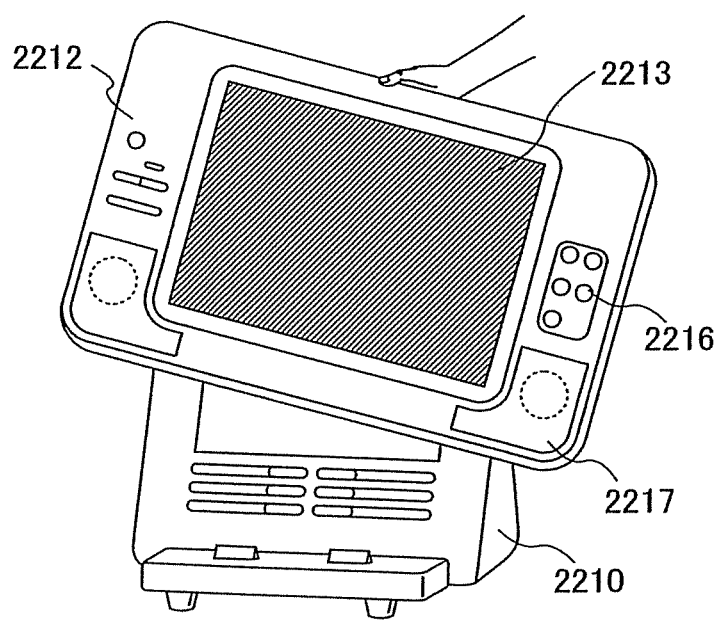

FIG. 45B shows a wireless television receiving set of which just a display can be carried around. A battery and a signal receiver are incorporated in a housing 2212, and a display portion 2213 and a speaker portion 2217 are driven by the battery. The battery can be repeatedly recharged by a recharger 2210. Further, the recharger 2210 can transmit and receive image signals and transmit the image signals to the signal receiver of display. The housing 2212 is controlled by an operation key 2216. Also, the device shown in FIG. 45B can also be called an image sound two-way communication device, because it can transmit signals from the housing 2212 to the recharger 2210 by operating the operation key 2216. In addition, the device shown in FIG. 45B can also be called a general-purpose remote-control device, because communication control of another electronic appliance is possible by operating the operation key 2216 and transmitting signals from the housing 2212 to the recharger 2210 as well as having the other electronic appliance receive signals that can be transmitted from the recharger 2210. The present invention can be applied to the display portion 2213

By applying the present invention to the television receiving set shown in FIG. 43, FIG. 44, and FIGS. 45A and 45B, a television receiving set provided with a high-quality display device can be obtained.

It is needless to say that the present invention is not limited to the television receiving set, and can be applied to various intended purposes such as a monitor for a computer, and particularly can be applied to a large-sized display medium, such as an information display board at a railway station or an airport, or an advertisement display board on the street.

Figure 46A:
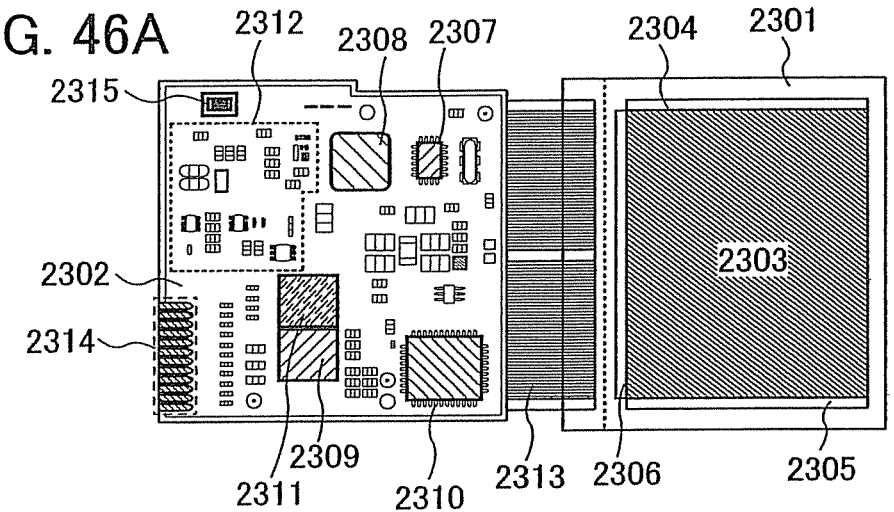
FIGS. 46A and 46B are views each showing an example of an electronic appliance to which the present invention is applied.

FIG. 46A shows a module in which a liquid crystal display panel 2301 and a printed wiring board 2302 that are formed using the present invention are combined. The liquid crystal display panel 2301 is provided with a pixel portion 2303 provided with a plurality of pixels, a first scanning line driver circuit 2304, a second scanning line driver circuit 2305, and a signal line driver circuit 2306 for supplying a video signal to a selected pixel.

The printed wiring board 2302 is provided with a controller 2307, a central processing unit (CPU) 2308, a memory 2309, a power supply circuit 2310, an audio processing circuit 2311, a transmitting/receiving circuit 2312, and the like. The printed wiring board 2302 and the liquid crystal display panel 2301 are connected to each other through a flexible printed circuit (FPC) 2313. The printed wiring board may employ a structure in which a capacitor element, a buffer circuit, and the like are provided and noise is prevented from occuring in power supply voltage or a signal or the rise of a signal from dulling. The controller 2307, the audio processing circuit 2311, the memory 2309, the CPU 2308, the power supply circuit 2310, and the like can be mounted to the liquid crystal display panel 2301 by using a COG (Chip on Glass) method. By means of the COG method, the size of the printed wiring board 2302 can be reduced.

Various control signals are input or output via an interface portion (I/F) 2314 which is provided to the printed wiring board 2302. An antenna port 2315 for transmitting and receiving to/from an antenna is provided to the printed wiring board 2302.

Figure 46B:
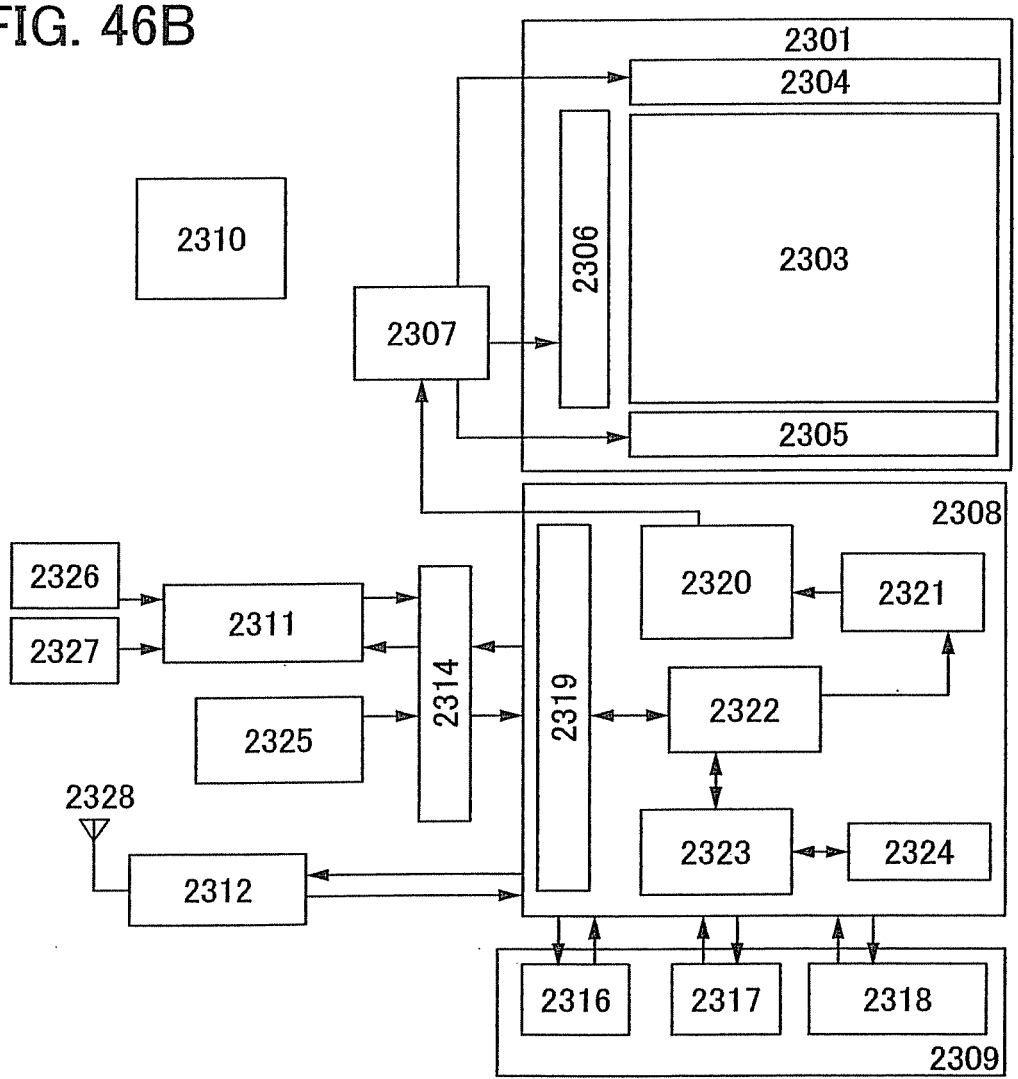

FIG. 46B is a block diagram for showing the module shown in FIG. 46A. The module includes a VRAM 2316, a DRAM 2317, a flash memory 2318, and the like as the memory 2309. The VRAM 2316 stores data on an image displayed on a panel, the DRAM 2317 stores image data or audio data, and the flash memory stores various programs.

The power supply circuit 2310 supplies electric power for operating the liquid crystal display panel 2301, the controller 2307, the CPU 2308, the audio processing circuit 2311, the memory 2309, and the transmitting/receiving circuit 2312. A current source may be provided to the power supply circuit 2310 depending on a panel specification.

The CPU 2308 includes a control signal generating circuit 2320, a decoder 2321, a resistor 2322, an arithmetic circuit 2323, a RAM 2324, an interface 2319 for the CPU 2308, and the like. Various signals input to the CPU 2308 via the interface 2319 are once stored in the resister 2322, and then input to the arithmetic circuit 2323, the decoder 2321, and the like. In the arithmetic circuit 2323, an operation is carried out based on the input signal and the location to which various instructions are transmitted is designated. On the other hand, the signal input to the decoder 2321 is decoded and input to the control signal generating circuit 2320. The control signal generating circuit 2320 produces a signal including various instructions based on the input signal, and transmits the signal to the location designated by arithmetic circuit 2323, specifically, the memory 2309, the transmitting/receiving circuit 2312, the audio processing circuit 2311, and the controller 2307, or the like.

The memory 2309, the transmitting/receiving circuit 2312, the audio processing circuit 2311, and the controller 2307 operate in accordance with the instruction received by each of them. Hereinafter, the operation is briefly explained.

A signal input from an input means 2325 is transmitted to the CPU 2308 mounted to the printed wiring board 2302 via the interface 2314. The control signal generating circuit 2320 converts image data stored in the VRAM 2316 into a predetermined format to transmit the converted data to the controller 2307 depending on the signal transmitted from the input means 2325 such as a pointing device or a keyboard.

The controller 2307 carries out data processing for the signal including the image data transmitted from the CPU 2308 in accordance with the panel specification to supply the signal to the liquid crystal display panel 2301. Further, the controller 2307 produces a Hsync signal, a Vsync signal, a clock signal CLK, an alternating voltage (AC Cont), and a shift signal L/R based on power supply voltage input from the power supply circuit 8210 or various signals input from the CPU 2308 to supply the signals to the liquid crystal display panel 2301.

The transmitting/receiving circuit 2312 processes a signal which is to be transmitted and received by an antenna 2328 as an electric wave, specifically, the transmitting/receiving circuit 2312 includes a high-frequency circuit such as an isolator, a band pass filter, a VCO (Voltage Controlled Oscillator), an LPF (Low Pass Filter), a coupler, or a balun. A signal, among signals transmitted and received in the transmitting/receiving circuit 2312, which includes audio information is transmitted to the audio processing circuit 2311 in accordance with an instruction from the CPU 2308.

The signal including audio information which is transmitted in accordance with the instruction from the CPU 2308 is demodulated in the audio processing circuit 2311 and is transmitted to a speaker 2327. An audio signal transmitted from a microphone 2326 is modulated in the audio processing circuit 2311 and is transmitted to the transmitting/receiving circuit 2312 in accordance with an instruction from the CPU 2308.

The controller 2307, the CPU 2308, the power supply circuit 2310, the audio processing circuit 2311, and the memory 2309 can be mounted as a package of this embodiment. This embodiment can be applied to any circuits other than high-frequency circuits such as an isolator, a band pass filter, a VCO (Voltage Controlled Oscillator), an LPF (Low Pass Filter), a coupler, and a balun.

Figure 47:
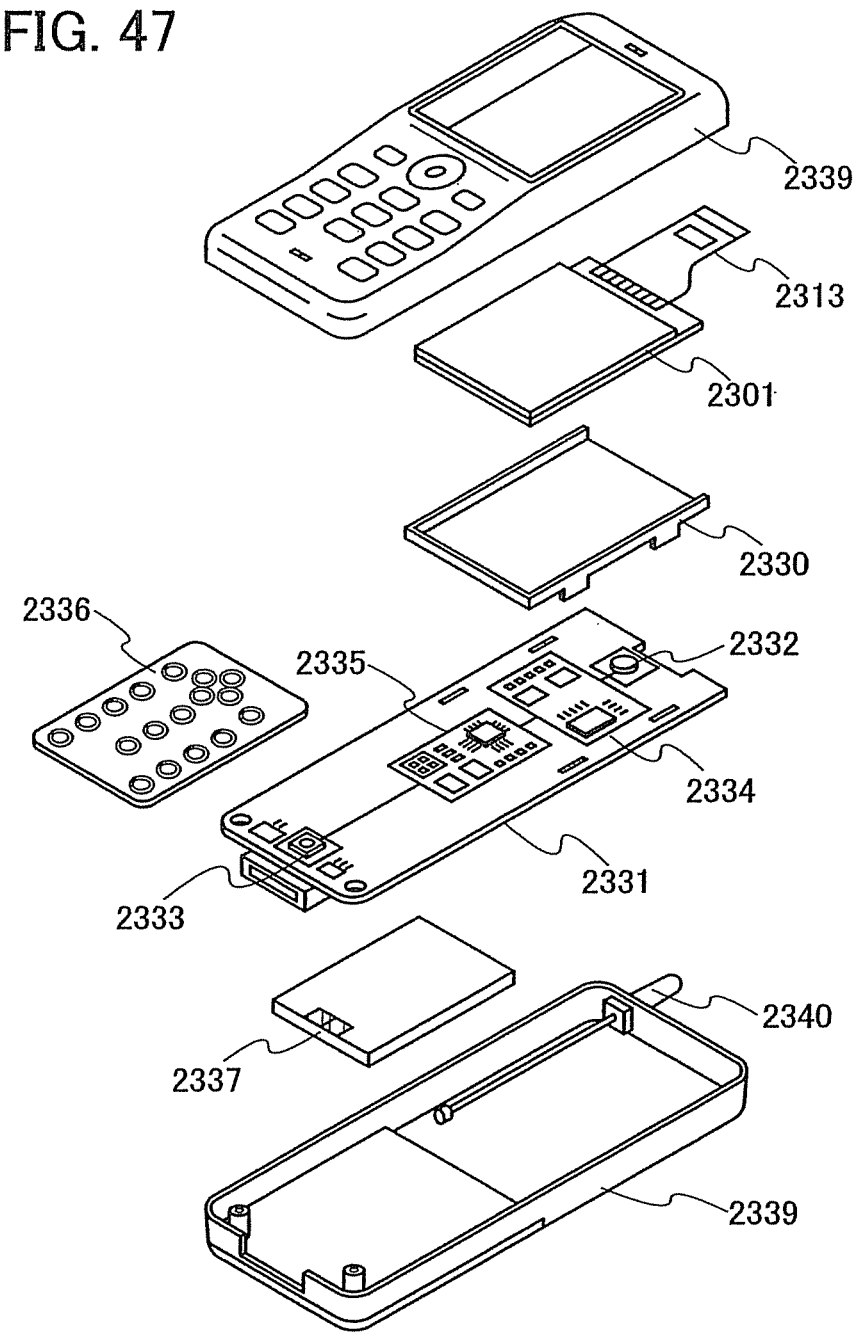
FIG. 47 is a view showing an example of an electronic appliance to which the present invention is applied.

FIG. 47 shows one mode of a cellular phone including the module shown in FIGS. 46A and 46B. A liquid crystal display panel 2301 is incorporated in a housing 2330 so as to be freely attached and detached. The shape and size of the housing 2330 can be appropriately changed in accordance with the size of the liquid crystal display panel 2301. The housing 2330 provided with the liquid crystal display panel 2301 is fitted in a printed board 2331 so as to be assembled as a module.

The liquid crystal display panel 2301 is connected to the printed board 2331 through an FPC 2313. A speaker 2332, a microphone 2333, a transmitting/receiving circuit 2334, and a signal processing circuit 2335 including a CPU, and a controller, and the like are formed over the printed board 2331. Such a module, an inputting means 2336, and a battery 2337 are combined, and they are stored in a housing 2339. A pixel portion of the liquid crystal display panel 2301 is disposed so as to be seen from an opening window formed in the housing 2339.

The cellular phone according to this embodiment mode can be changed into various modes in accordance with the function or the intended purpose. For example, the above effect can be obtained even in a case of employing a structure in which a plurality of display panels is provided and a housing is appropriately divided into multiple pieces to be opened and closed by a hinge.

By using the present invention for the cellular phone shown in FIGS. 46A and 46B and FIG. 47, a cellular phone with a high-quality display device can be obtained.

Figure 48A:
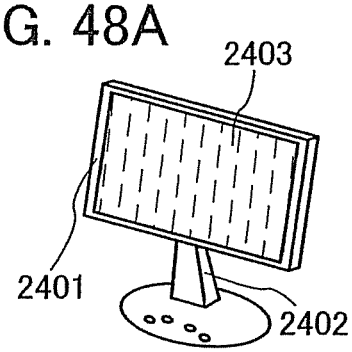
FIGS. 48A to 48E are views each showing an example of an electronic appliance to which the present invention is applied.

FIG. 48A shows a liquid crystal display, which includes a housing 2401, a supporting base 2402, a display portion 2403, and the like. The present invention can be applied to the display portion 2403.

By using the present invention, a liquid crystal display provided with a high-quality display device can be obtained.

Figure 48B:
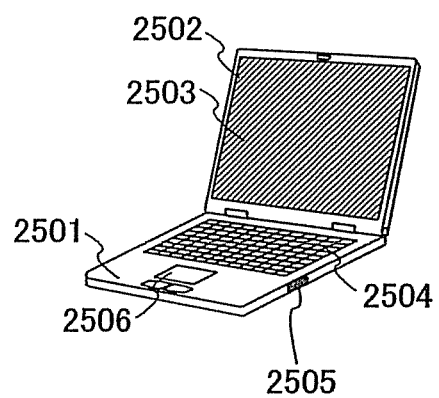

FIG. 48B shows a computer, which includes a main body 2501, a housing 2502, a display portion 2503, a key board 2504, an external connection port 2505, a pointing mouse 2506, and the like. The present invention can be applied to the display portion 2503.

By using the present invention, a computer provided with a high-quality display device can be obtained.

Figure 48C:
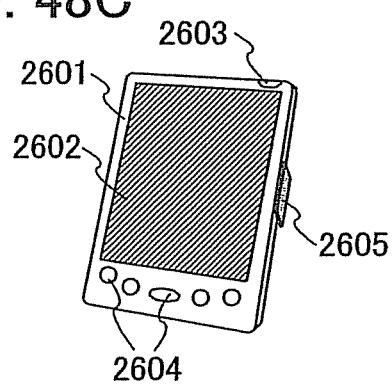

FIG. 48C shows a portable computer, which includes a main body 2601, a display portion 2602, a switch 2603, operation keys 2604, an infrared port 2605, and the like. The present invention can be applied to the display portion 2602.

By using the present invention, a computer provided with a high-quality display device can be obtained.

Figure 48D:
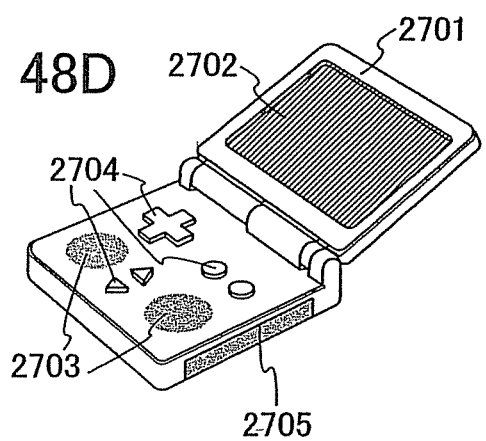

FIG. 48D shows a portable game machine, which includes a housing 2701, a display portion 2702, a speaker portion 2703, operation keys 2704, a recording medium insert portion 2705, and the like. The present invention can be applied to the display portion 2702.

By using the present invention, a game machine provided with a high-quality display device can be obtained.

Figure 48E:
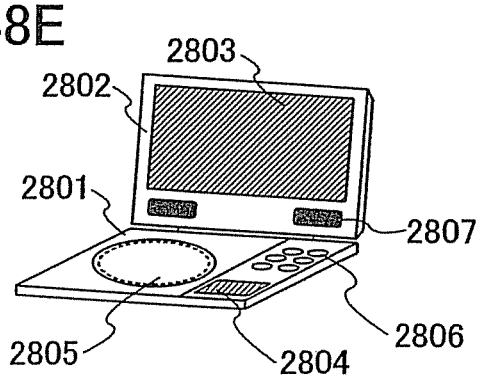

FIG. 48E shows a portable image reproducing device provided with a recording medium (specifically, a DVD reproducing device), which includes a main body 2801, a housing 2802, a display portion A 2803, a display portion B 2804, a recording medium (DVD or the like) reading portion 2805, operation keys 2806, a speaker portion 2807, and the like. The display portion A 2803 mainly displays image data while the display portion B 2804 mainly displays text data. The present invention can be applied to the display portion A 2803, the display portion B 2804, a control circuit portion, or the like. It is to be noted that an image reproducing device provided with a recording medium also includes a home game machine and the like.

By using the present invention, an image reproducing device provided with a high-quality display device can be obtained.

Figure 49A:
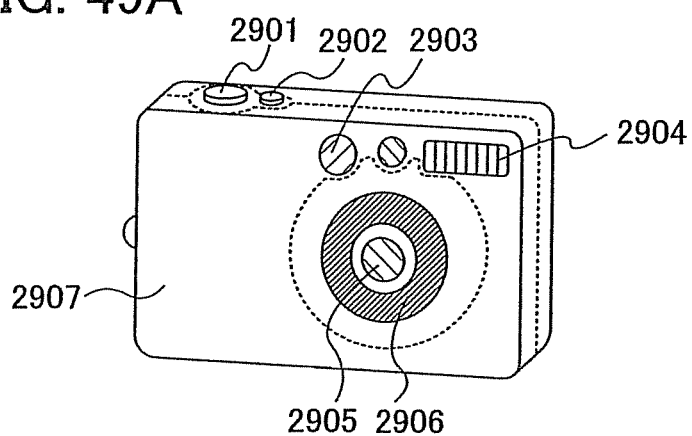
FIGS. 49A and 49B are views each showing an example of an electronic appliance to which the present invention is applied.
Figure 49B:
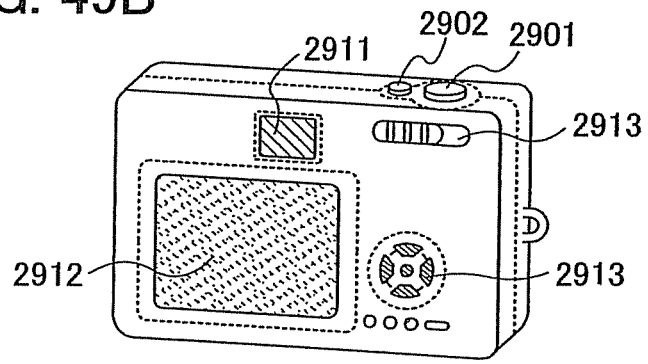
Figure 50:
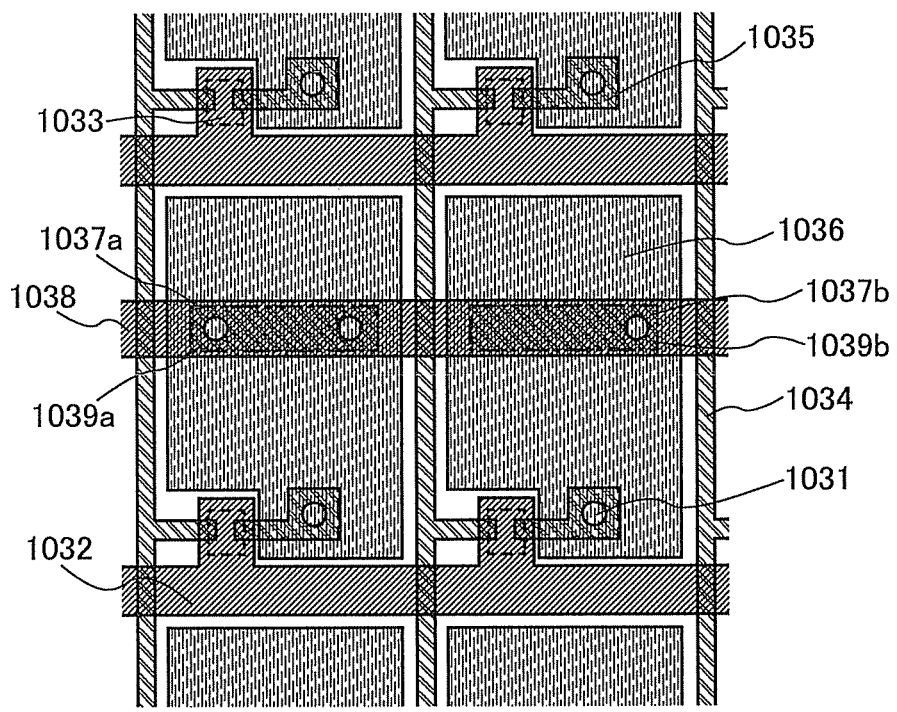
FIG. 50 is a top view of a pixel in a conventional liquid crystal display device.

FIGS. 49A and 49B are views each showing an example in which the liquid crystal display device of the present invention is incorporated in a camera, for example, a digital camera. FIG. 49A is a perspective view seen from front side of a digital camera, and FIG. 49B is a perspective view seen from back side of the digital camera. In FIG. 49A, the digital cameral is provided with a release button 2901, a main switch 2902, a viewfinder 2903, a flash portion 2904, a lens 2905, a barrel 2906, and a housing 2907.

In FIG. 49B, an eyepiece finder 2911, a monitor 2912, and operation buttons 2913 are provided.

When the release button 2901 is pushed down to the half point, a focus adjustment mechanism and an exposure adjustment mechanism are operated, and when the release button is pushed down to the lowest point, a shutter is opened.

By pushing down or rotating the main switch 2902, a power supply of the digital camera is switched on or off.

The viewfinder 2903 is arranged above the lens 2905, which is on the front side of the digital camera, for checking a shooting range and the focus point from the eyepiece finder 2911 shown in FIG. 49B.

The flash portion 2904 is arranged in the upper position on the front side of the digital camera. When the subject brightness is not enough, auxiliary light is emitted from the flash portion 2904, at the same time as the release button 2901 is pushed down and a shutter is opened.

The lens 2905 is arranged at the front side of the digital camera and made of a focusing lens, a zoom lens, and the like. The lens forms a photographic optical system with a shutter and a diaphragm, which are not shown. In addition, behind the lens, an imaging device such as a CCD (Charge Coupled Device) is provided.

The barrel 2906 moves a lens position to adjust the focus of the focusing lens, the zoom lens, and the like. In shooting, the barrel is slid out to move the lens 2905 forward. Further, when carrying the digital camera, the lens 2905 is moved backward to be compact. It is to be noted that a structure is employed in this embodiment, in which the subject can be photographed by zoom by sliding out the barrel; however, the present invention is not limited to this structure, and a structure may also be employed for the digital camera, in which shooting can be performed by zoom without sliding out the barrel with the use of a structure of a photographic optical system inside the housing 2907.

The eyepiece finder 2911 is arranged in the upper position on the back side of the digital camera for looking therethrough in checking a shooting range and the focus point.

The operation buttons 2913 are buttons for various functions provided on the back side of the digital camera, which includes a set up button, a menu button, a display button, a functional button, a selecting button, and the like.

The liquid crystal display device of the present invention can be incorporated in a monitor 2912 of the camera shown in FIGS. 49A and 49B. Accordingly, a digital camera provided with a high-quality display device can be obtained.

It is to be noted that examples shown in this embodiment is only an example, and the present invention is not limited to these applications.

In addition, this embodiment can be combined with all structures of or part of the structure of Embodiment Mode, and Embodiments 1 to 10, if necessary.

This application is based on Japanese Patent Application serial no. 2005-372586 filed in Japan Parent Office on Dec. 26, 2005, the entire contents of which are hereby incorporated by reference.

What is claimed is:

1. A method for manufacturing a display device, comprising the steps of:
    forming a gate electrode over a substrate;
    forming a gate insulating film over the gate electrode;
    forming a first island-shaped semiconductor film and a second island-shaped semiconductor film over the gate insulating film;
    forming a first source wiring and a first drain electrode in electrical contact with the first island-shaped semiconductor film, and a second source wiring and a second drain electrode in electrical contact with the second island-shaped semiconductor film; and
    forming a first insulating film over and in contact with the first source wiring and a second insulating film over and in contact with the second source wiring, wherein the first insulating film is spaced from the second insulating film, and wherein the second insulating film overlaps a portion of the first drain electrode.

2. The method for manufacturing a display device according to claim 1, wherein the first insulating film and the second insulating film are formed from an inorganic insulating material.

3. The method for manufacturing a display device according to claim 1, wherein each of the first drain electrode and the second drain electrode includes a lower-layer drain electrode and an upper-layer drain electrode.

4. A method for manufacturing a display device, comprising the steps of:
   forming a gate electrode over a substrate;
   forming a gate insulating film over the gate electrode;
   forming a first island-shaped semiconductor film and a second island-shaped semiconductor film over the gate insulating film;
   forming a first source wiring and a first drain electrode in electrical contact with the first island-shaped semiconductor film, and a second source wiring and a second drain electrode in electrical contact with the second island-shaped semiconductor film;
   forming a first insulating film over and in contact with the first source wiring and a second insulating film over and in contact with the second source wiring, wherein the first insulating film is spaced from the second insulating film, and wherein the second insulating film overlaps a portion of the first drain electrode; and
   forming a first pixel electrode in electrical contact with the first drain electrode and a second pixel electrode in electrical contact with the second drain electrode.

5. The method for manufacturing a display device according to claim 4, wherein the first insulating film and the second insulating film are formed from an inorganic insulating material.

6. The method for manufacturing a display device according to claim 4, wherein each of the first drain electrode and the second drain electrode includes a lower-layer drain electrode and an upper-layer drain electrode.

7. The method for manufacturing a display device according to claim 6, wherein the first pixel electrode is in direct contact with the lower-layer drain electrode of the first drain electrode, and the second pixel electrode is in direct contact with the lower-layer drain electrode of the second drain electrode.

8. The method for manufacturing a display device according to claim 4, further comprising a step of discharging a liquid crystal material over the first pixel electrode and the second pixel electrode from a droplet discharging apparatus.

* * * * *

UNITED STATES PATENT AND TRADEMARK OFFICE
CERTIFICATE OF CORRECTION

| | |
|---|---|
| PATENT NO. | : 8,976,308 B2 |
| APPLICATION NO. | : 13/539901 |
| DATED | : March 10, 2015 |
| INVENTOR(S) | : Kunio Hosoya |

Page 1 of 1

It is certified that error appears in the above-identified patent and that said Letters Patent is hereby corrected as shown below:

In the Specification:

Column 1, Line 57; Change ““TZO”),” to --“IZO”),--.

Column 2, Line 45; Change "Mimed" to --formed--.

Column 4, Line 35; Change "fat tiled" to --formed--.

Column 8, Line 2; Change "channel for region," to --channel formation region,--.

Column 10, Line 40; Change "oxide-inc oxide" to --oxide-zinc oxide--.

Column 14, Line 17; Change "Coming" to --Corning--.

Column 20, Line 3; Change "T 201," to --TFT 201,--.

Column 20, Line 8; Change "as a substrate" to --as a TFT substrate--.

Column 21, Line 4; Change "the substrate" to --the TFT substrate--.

Column 22, Line 55; Change "aimed" to --formed--.

Column 23, Line 44; Change "thy" to --dry--.

Column 30, Line 6; Change "Mimed" to --formed--.

Column 34, Line 42; Change "and 3413 are" to --and 34B are--.

Column 35, Line 15; Change "fanned" to --formed--.

Column 36, Line 37; Change "and 3713, and" to --and 37B, and--.

Column 39, Line 51; Change "[Embodiment 1]" to --[Embodiment 11]--.

Signed and Sealed this
Fourth Day of August, 2015

Michelle K. Lee
*Director of the United States Patent and Trademark Office*